United States Patent
Lin et al.

(10) Patent No.: US 10,204,879 B2
(45) Date of Patent: Feb. 12, 2019

(54) SEMICONDUCTOR DEVICE AND METHOD OF FORMING WAFER-LEVEL INTERCONNECT STRUCTURES WITH ADVANCED DIELECTRIC CHARACTERISTICS

(71) Applicant: STATS ChipPAC, Ltd., Singapore (SG)

(72) Inventors: Yaojian Lin, Singapore (SG); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 167 days.

(21) Appl. No.: 14/861,040

(22) Filed: Sep. 22, 2015

(65) Prior Publication Data

US 2016/0013148 A1 Jan. 14, 2016

Related U.S. Application Data

(60) Continuation-in-part of application No. 13/728,012, filed on Dec. 27, 2012, now Pat. No. 9,520,365, (Continued)

(51) Int. Cl.
*H01L 27/12* (2006.01)
*H01L 29/786* (2006.01)
(Continued)

(52) U.S. Cl.
CPC ............ *H01L 24/19* (2013.01); *H01L 21/561* (2013.01); *H01L 21/565* (2013.01);
(Continued)

(58) Field of Classification Search
CPC ....... H01L 2924/12041; H01L 2924/00; H01L 2924/1306; H01L 2924/01322;
(Continued)

(56) References Cited

U.S. PATENT DOCUMENTS 6,066,574 A    5/2000   You et al.
6,329,610 B1  12/2001   Takubo et al.
(Continued)

FOREIGN PATENT DOCUMENTS

TW           503496 B    9/2002

OTHER PUBLICATIONS

"Processing Procedures for Dry-Etch CYCLOTENE Advanced Electronic Resins (Dry-Etch BCB)", Published Nov. 1997; Dow Chemical Company.
(Continued)

*Primary Examiner* — Asok K Sarkar
*Assistant Examiner* — Dmitriy Yemelyanov
(74) *Attorney, Agent, or Firm* — Robert D. Atkins; Patent Law Group: Atkins and Associates, P.C.

(57) ABSTRACT

A semiconductor device has a build-up interconnect structure including a first insulating layer with a first material and a second insulating layer with a second material. A first conductive layer is formed over the first insulating layer, and the second insulating layer is formed over the first conductive layer. An optional third insulating layer has the second material and is formed over the second insulating layer. A fourth insulating layer has the first material and is formed over the third insulating layer. The second, third, and fourth insulating layers are cured sequentially or simultaneously. The first material includes a greater tensile strength, elastic modulus, and CTE than the second material. The build-up interconnect structure is formed over a semiconductor wafer or semiconductor die in a reconstituted panel. Alternatively, the build-up interconnect structure is formed over a carrier and a semiconductor die is mounted over the build-up interconnect structure.

24 Claims, 34 Drawing Sheets

Related U.S. Application Data which is a division of application No. 13/164,015, filed on Jun. 20, 2011, now Pat. No. 8,492,203.

(60) Provisional application No. 61/435,215, filed on Jan. 21, 2011.

(51) Int. Cl.

| | | |
|---|---|---|
| *H01L 23/00* | (2006.01) | |
| *H01L 23/31* | (2006.01) | |
| *H01L 23/498* | (2006.01) | |
| *H01L 21/56* | (2006.01) | |
| *H01L 23/538* | (2006.01) | |
| *H01L 23/552* | (2006.01) | |
| *H01L 25/065* | (2006.01) | |
| *H01L 25/16* | (2006.01) | |
| *H01L 25/18* | (2006.01) | |

(52) U.S. Cl.
CPC ...... *H01L 23/3107* (2013.01); *H01L 23/3121* (2013.01); *H01L 23/3128* (2013.01); *H01L 23/3135* (2013.01); *H01L 23/49816* (2013.01); *H01L 23/5389* (2013.01); *H01L 23/552* (2013.01); *H01L 24/11* (2013.01); *H01L 24/96* (2013.01); *H01L 24/97* (2013.01); *H01L 25/0655* (2013.01); *H01L 21/568* (2013.01); *H01L 25/16* (2013.01); *H01L 25/18* (2013.01); *H01L 2224/0401* (2013.01); *H01L 2224/05567* (2013.01); *H01L 2224/12105* (2013.01); *H01L 2224/131* (2013.01); *H01L 2224/13022* (2013.01); *H01L 2224/16227* (2013.01); *H01L 2224/16237* (2013.01); *H01L 2224/81005* (2013.01); *H01L 2224/81191* (2013.01); *H01L 2224/81815* (2013.01); *H01L 2224/94* (2013.01); *H01L 2224/97* (2013.01); *H01L 2924/01029* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/18162* (2013.01); *H01L 2924/19105* (2013.01); *H01L 2924/3511* (2013.01)

(58) Field of Classification Search
CPC ..... H01L 2924/181; H01L 2924/12042; H01L 2224/94; H01L 2224/11; H01L 2224/97; H01L 2224/81
See application file for complete search history.

(56) References Cited

U.S. PATENT DOCUMENTS

| | | | |
|---|---|---|---|
| 6,727,576 B2 | 4/2004 | Hedler et al. | |
| 6,905,914 B1 | 6/2005 | Huemoller et al. | |
| 2002/0000658 A1 | 1/2002 | Kuwabara et al. | |
| 2002/0173133 A1 | 11/2002 | Towle et al. | |
| 2003/0122246 A1 | 7/2003 | Lin et al. | |
| 2006/0183269 A1 | 8/2006 | Fuergut et al. | |
| 2006/0267181 A1* | 11/2006 | Emrick | H01L 23/145 257/702 |
| 2007/0181995 A1 | 8/2007 | Hsu et al. | |
| 2007/0194412 A1 | 8/2007 | Nakagawa et al. | |
| 2008/0237836 A1 | 10/2008 | Chia et al. | |
| 2008/0318413 A1 | 12/2008 | Fillion et al. | |
| 2009/0140442 A1 | 6/2009 | Lin | |
| 2009/0152715 A1 | 6/2009 | Shim et al. | |
| 2009/0170241 A1 | 7/2009 | Shim et al. | |
| 2010/0006331 A1 | 1/2010 | Hsu | |
| 2010/0120204 A1 | 5/2010 | Kunimoto | |
| 2011/0104886 A1 | 5/2011 | Oi et al. | |

OTHER PUBLICATIONS

"Cyclotene 4000 Series Advanced Electronic Resins (Photo BCB)", Published Mar. 2009; Dow Chemical Company.
Taiyo America, Inc. Printed Sep. 22, 2015. "Technical Data Sheet, TAIYO PSR-4000 AUS703, Liquid Photoimageable Solder Mask." http://taiyo-america.com/docs/files/3913/8256/2650/TDS_PSR-4000_AUS703_022005.pdf. 5 pages.

* cited by examiner

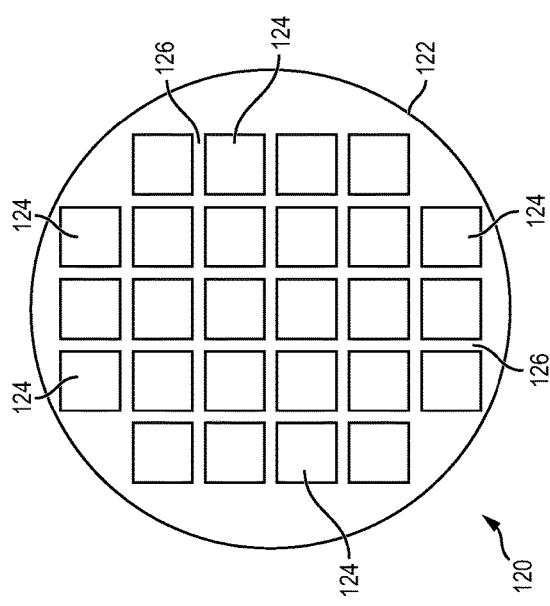
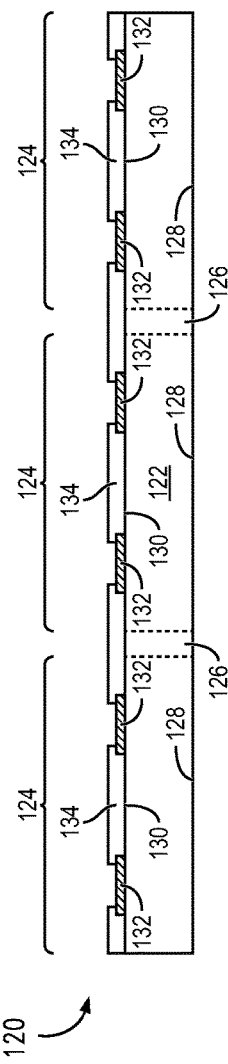
FIG. 2a
FIG. 2b

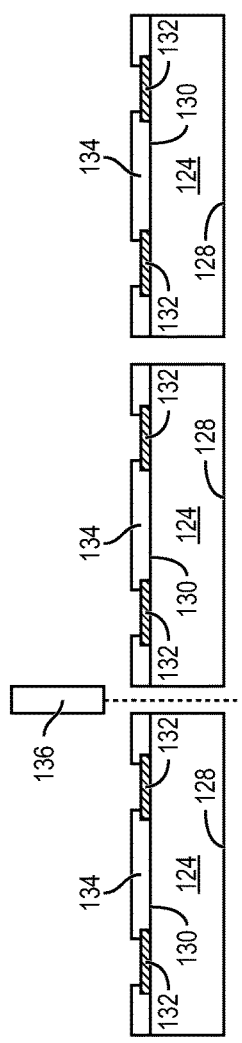
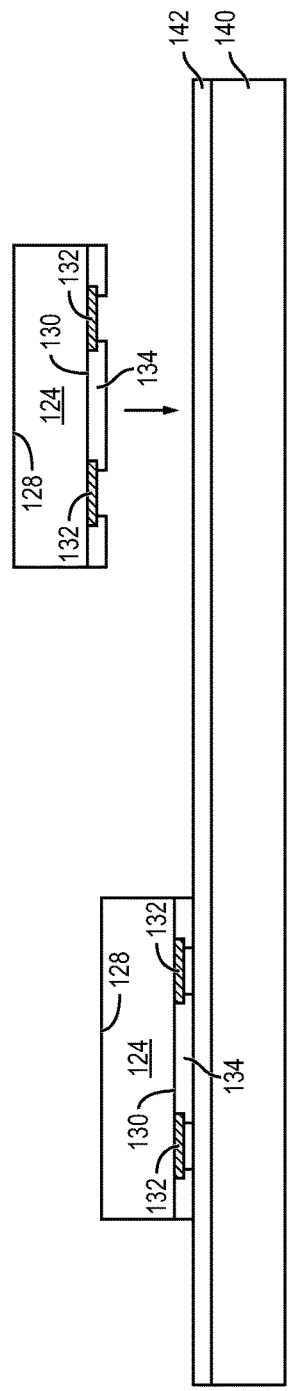
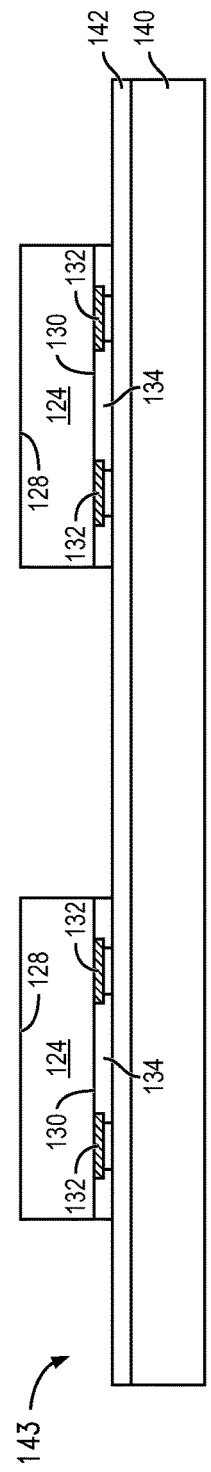

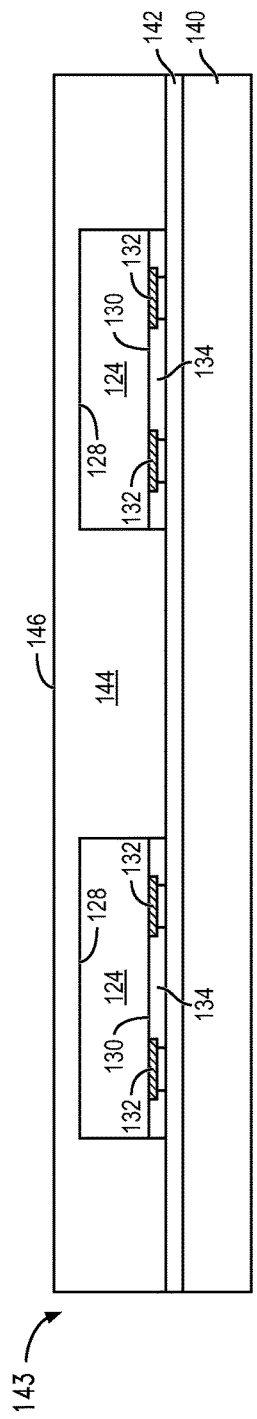
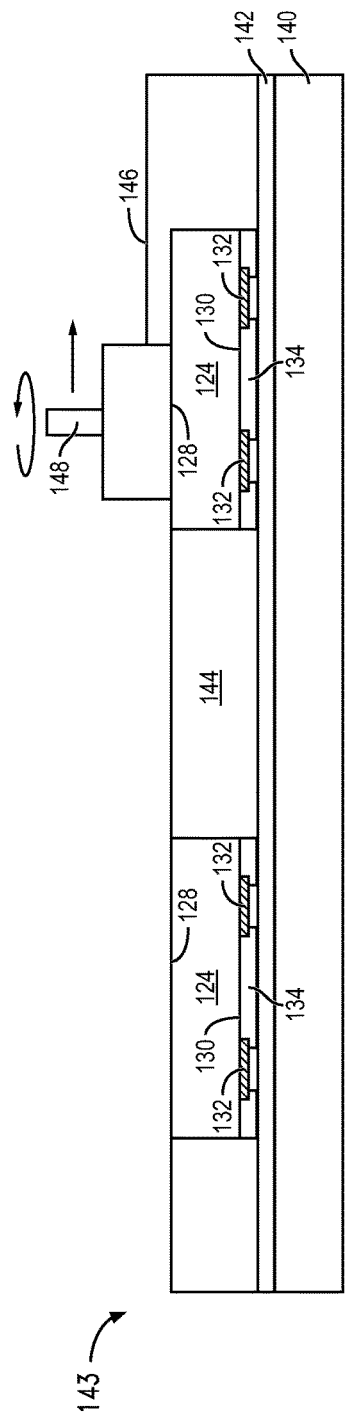
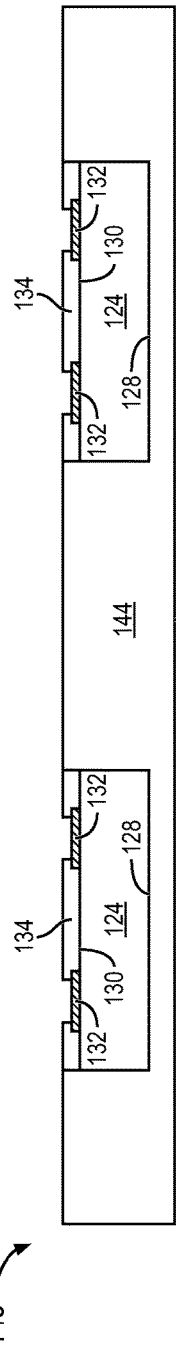
FIG. 3c
FIG. 3d
FIG. 3e

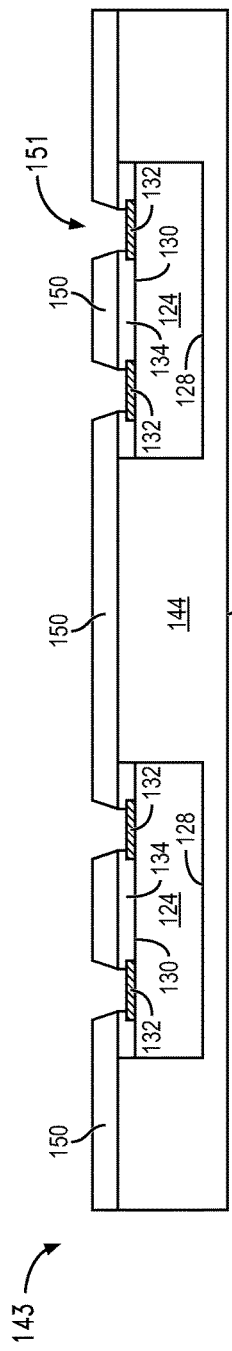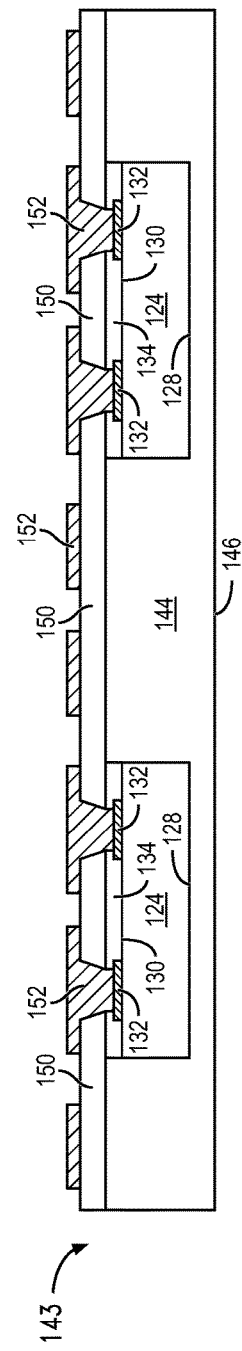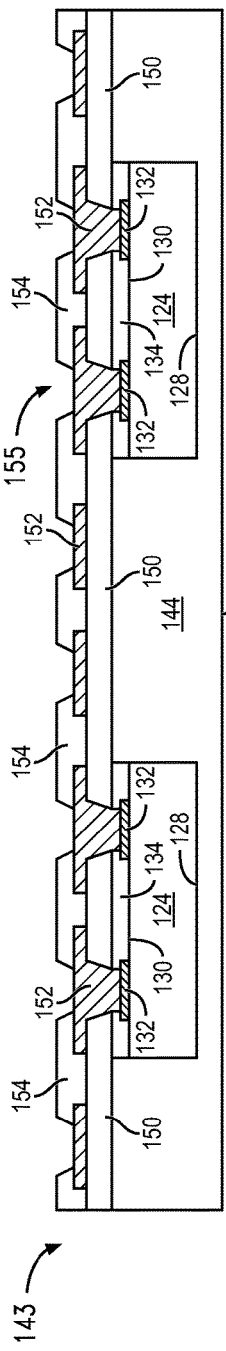

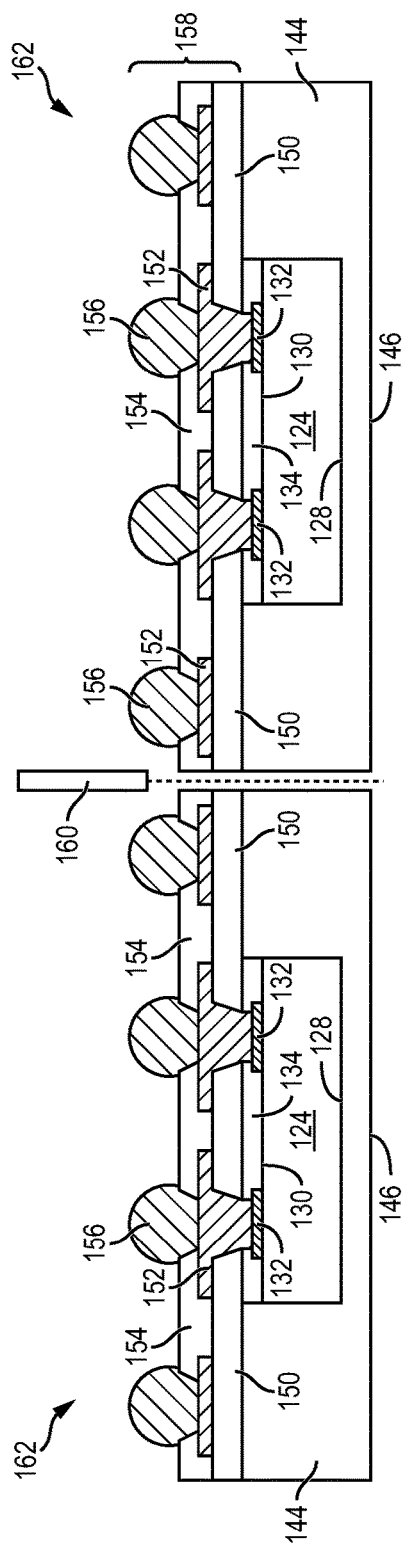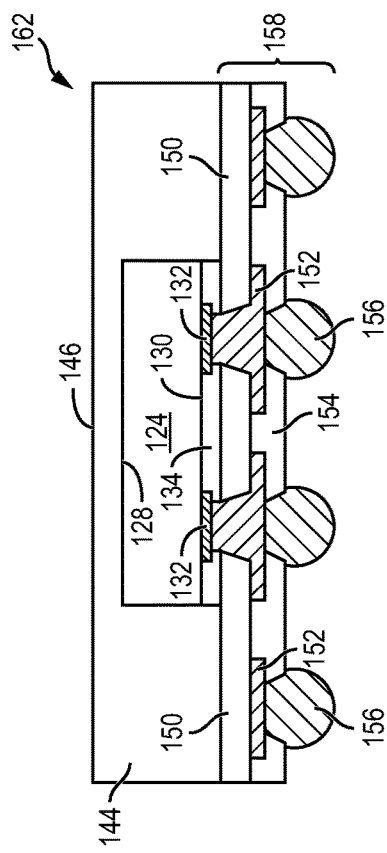

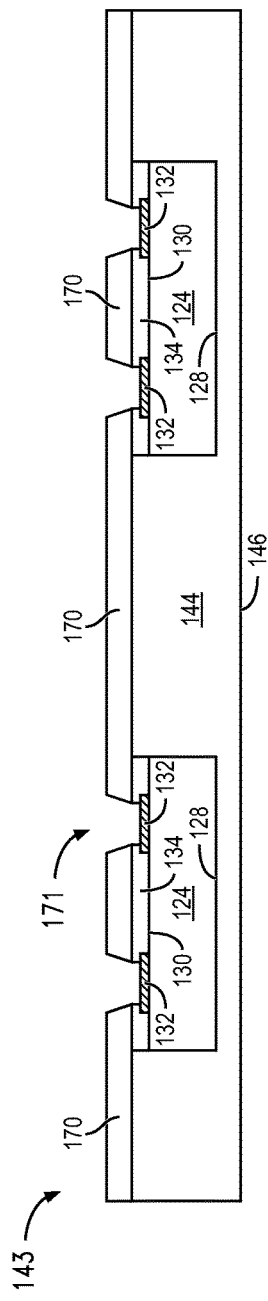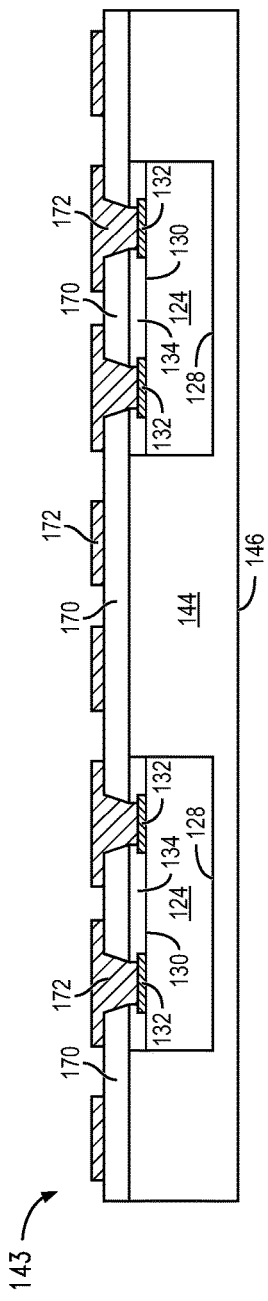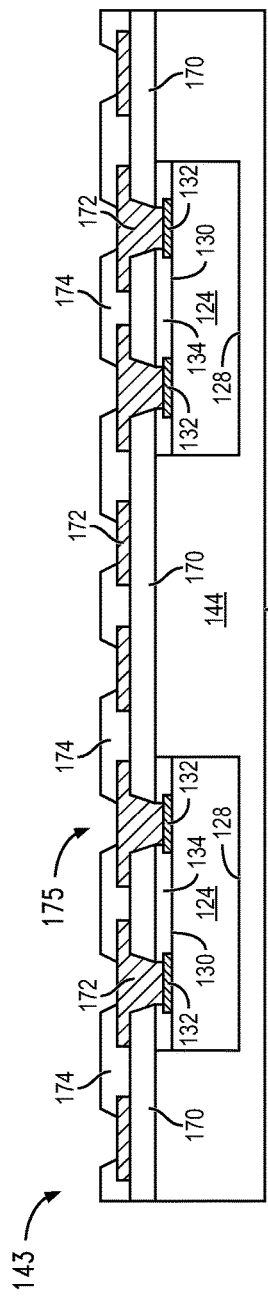

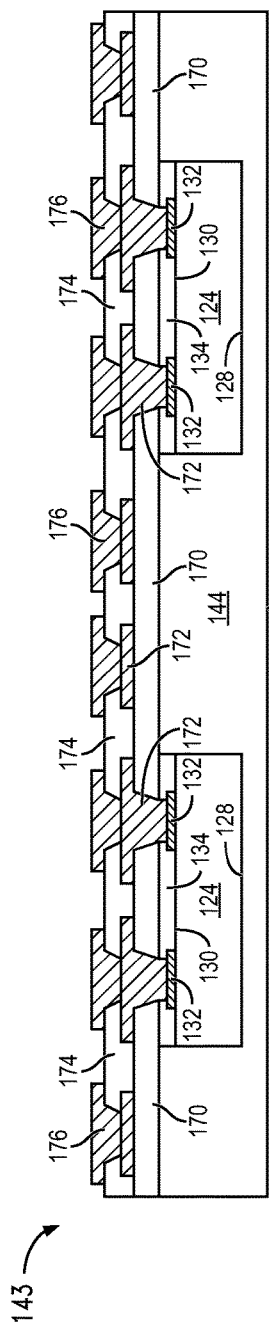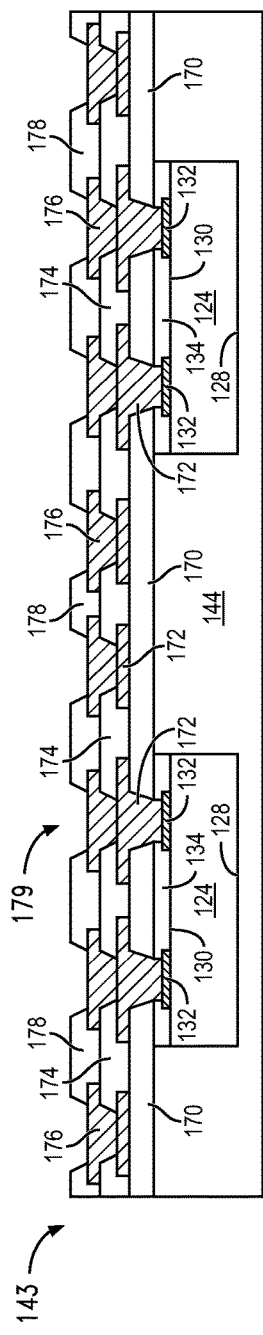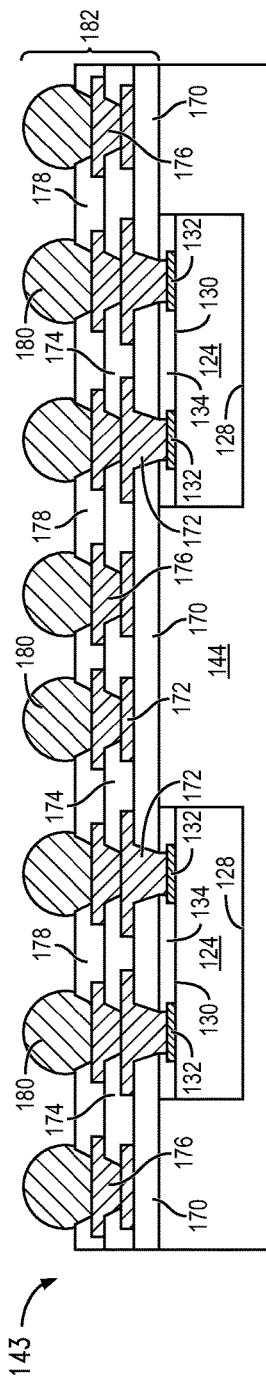

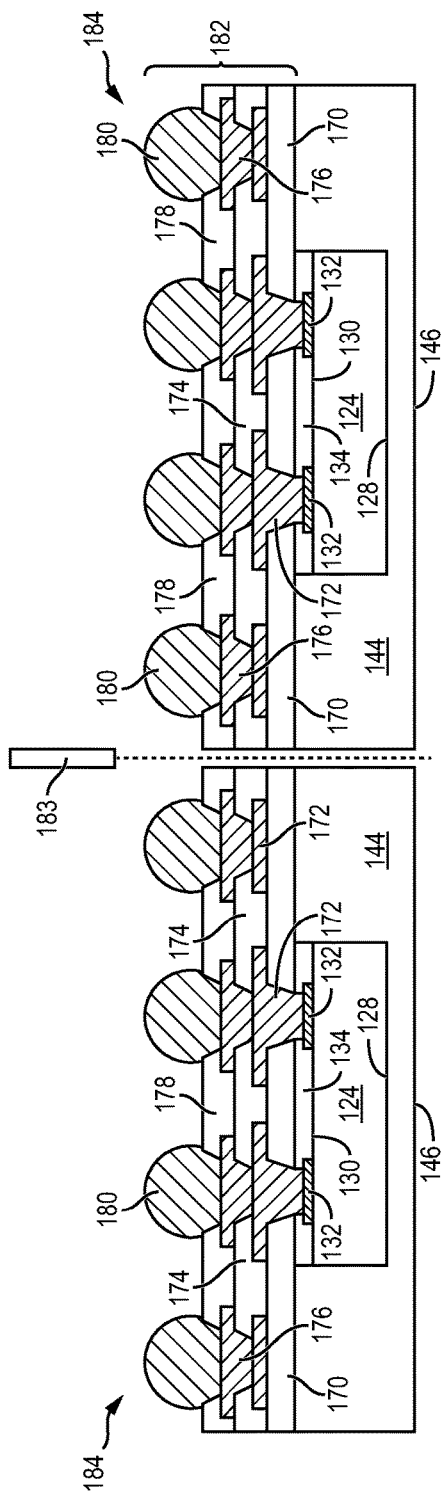
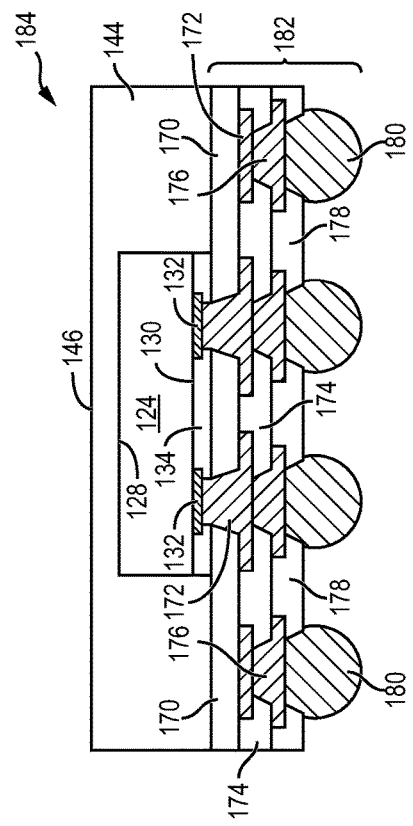

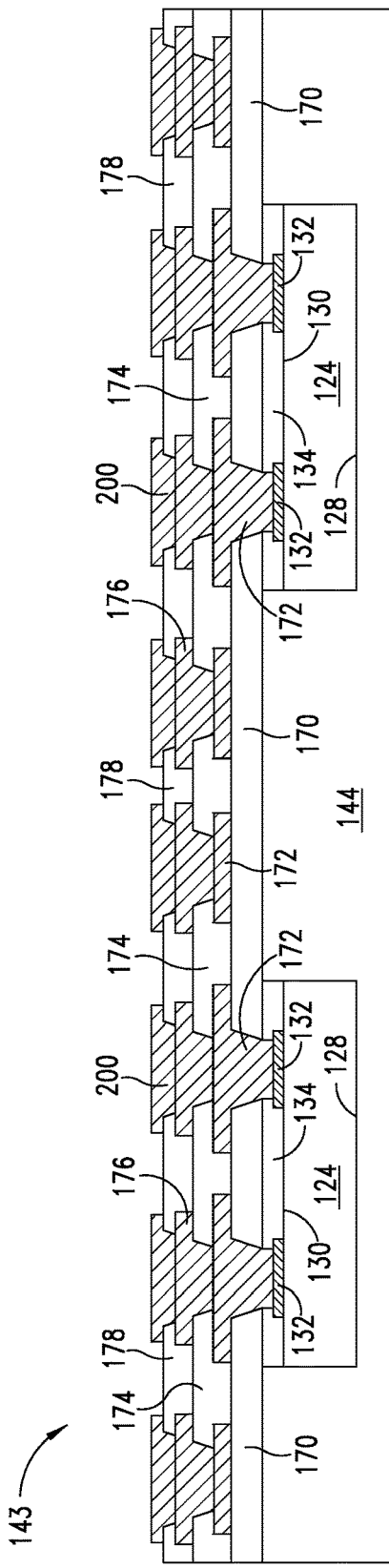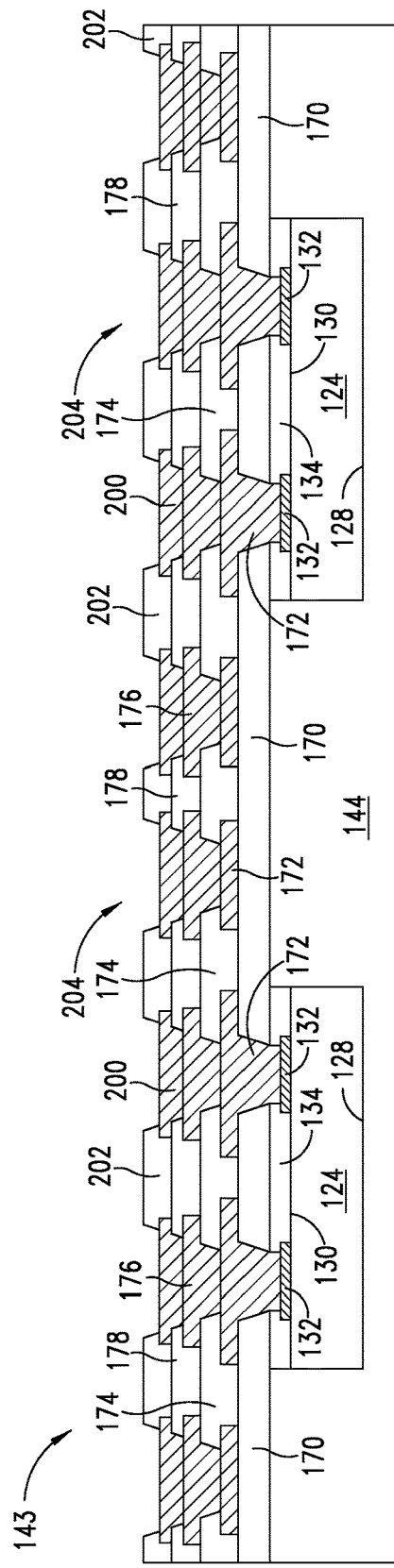

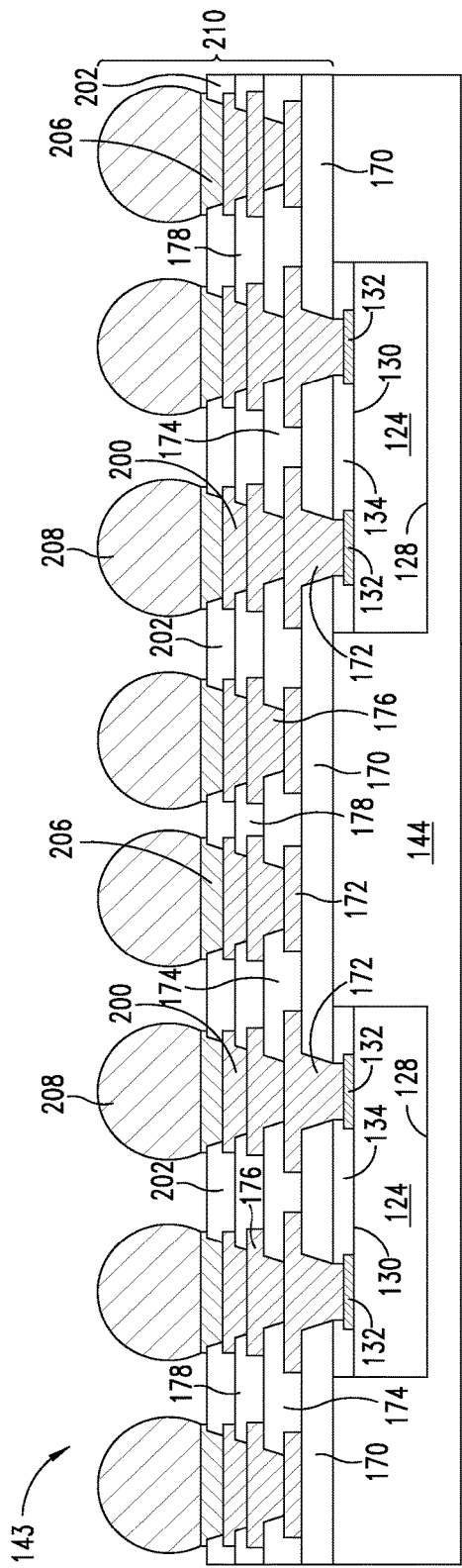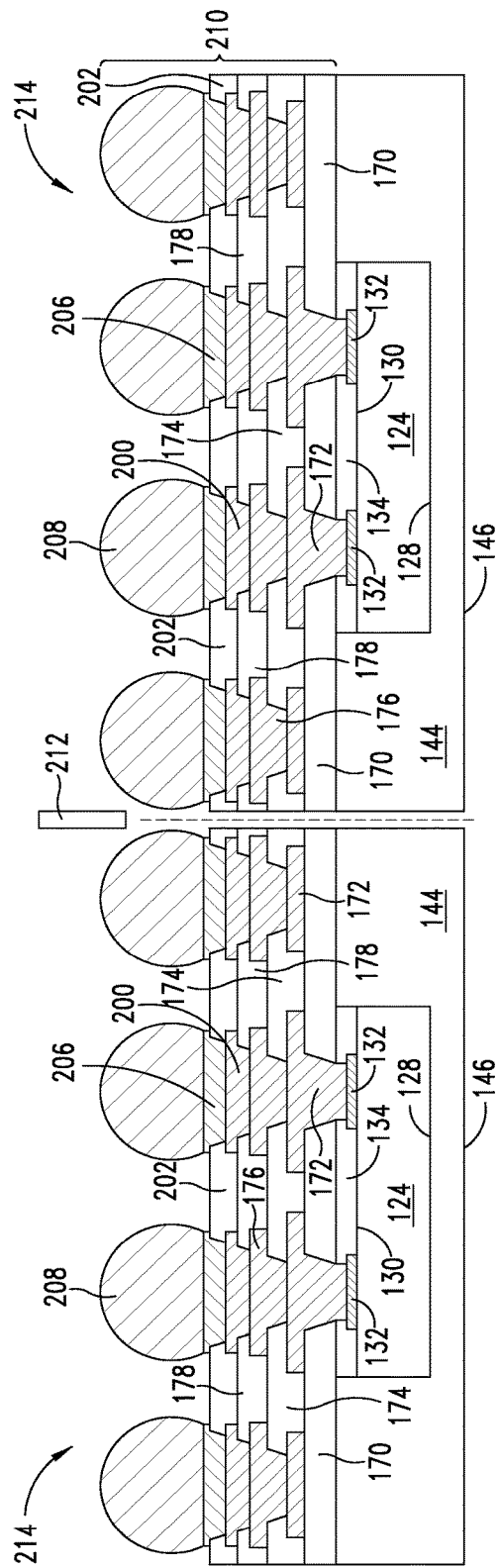

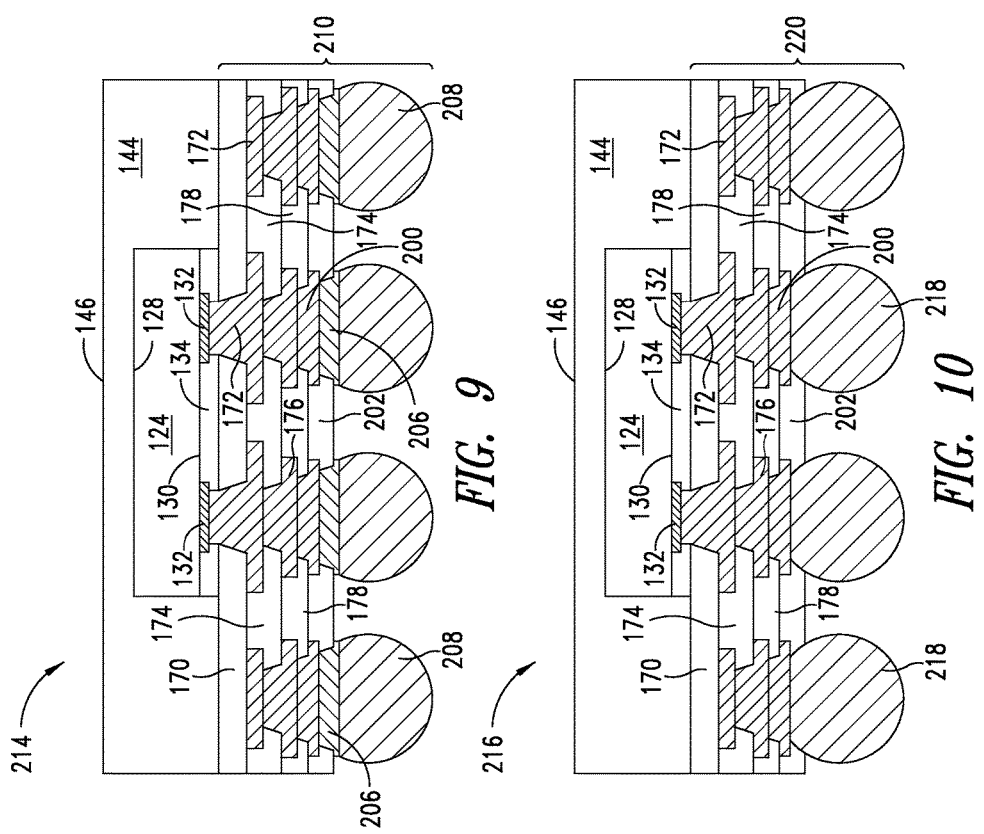

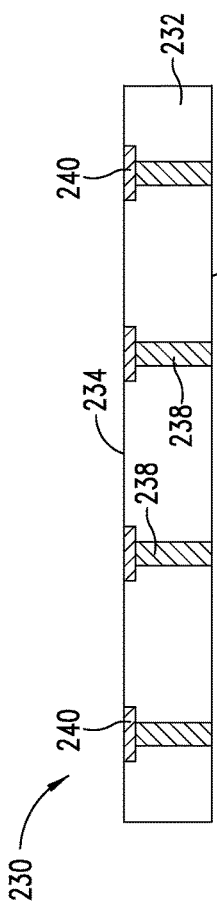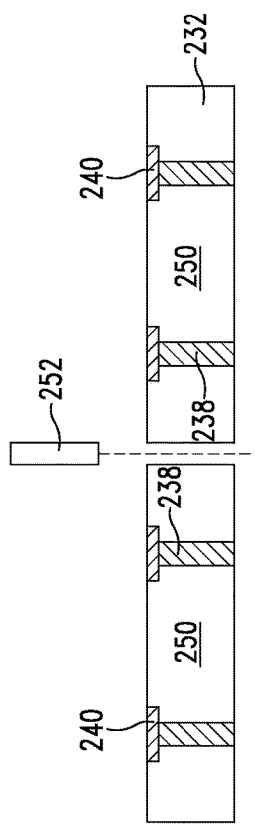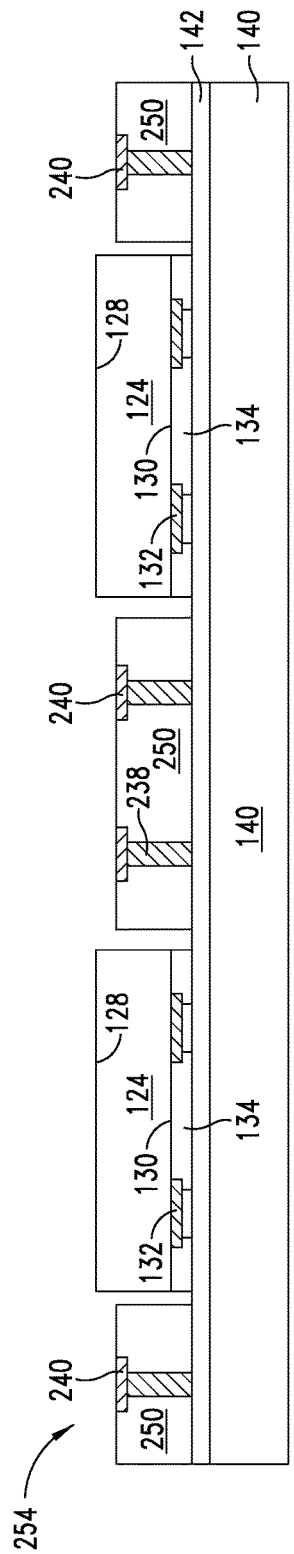

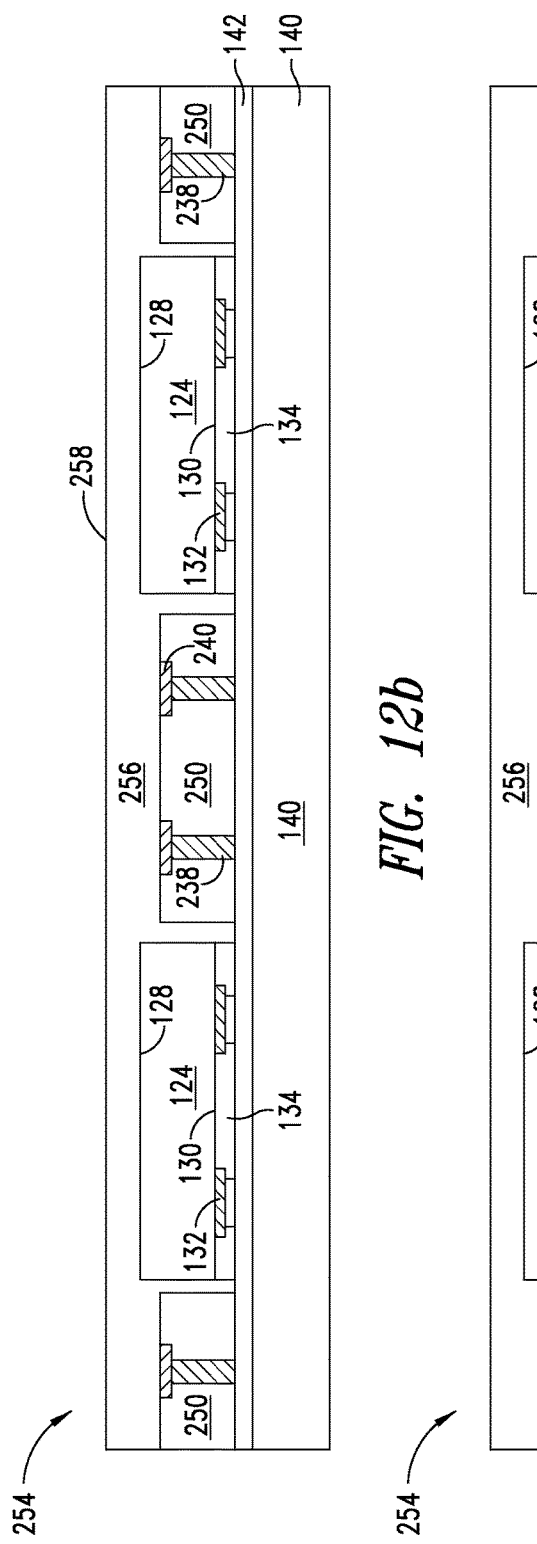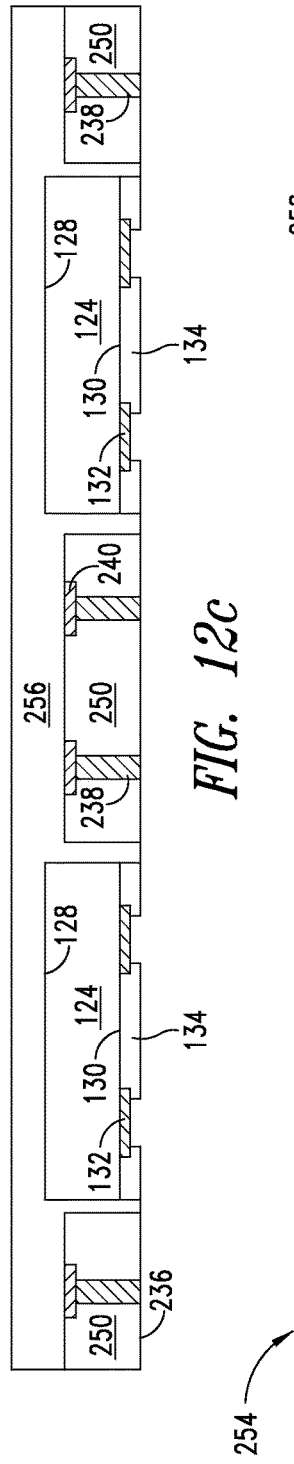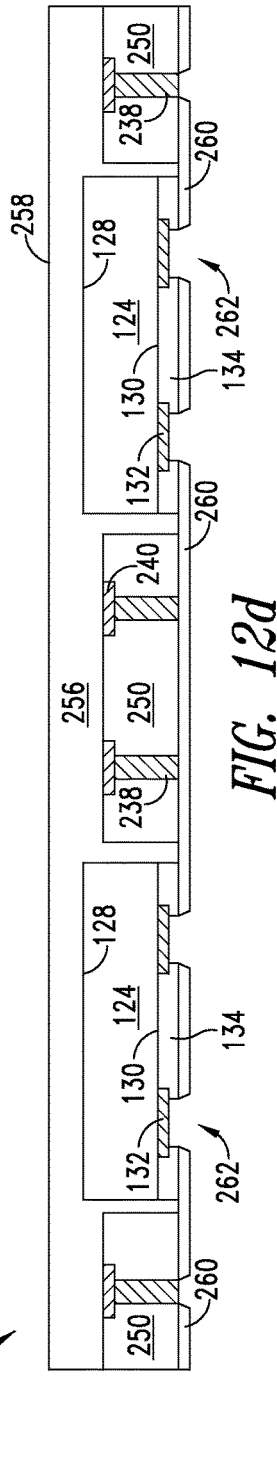

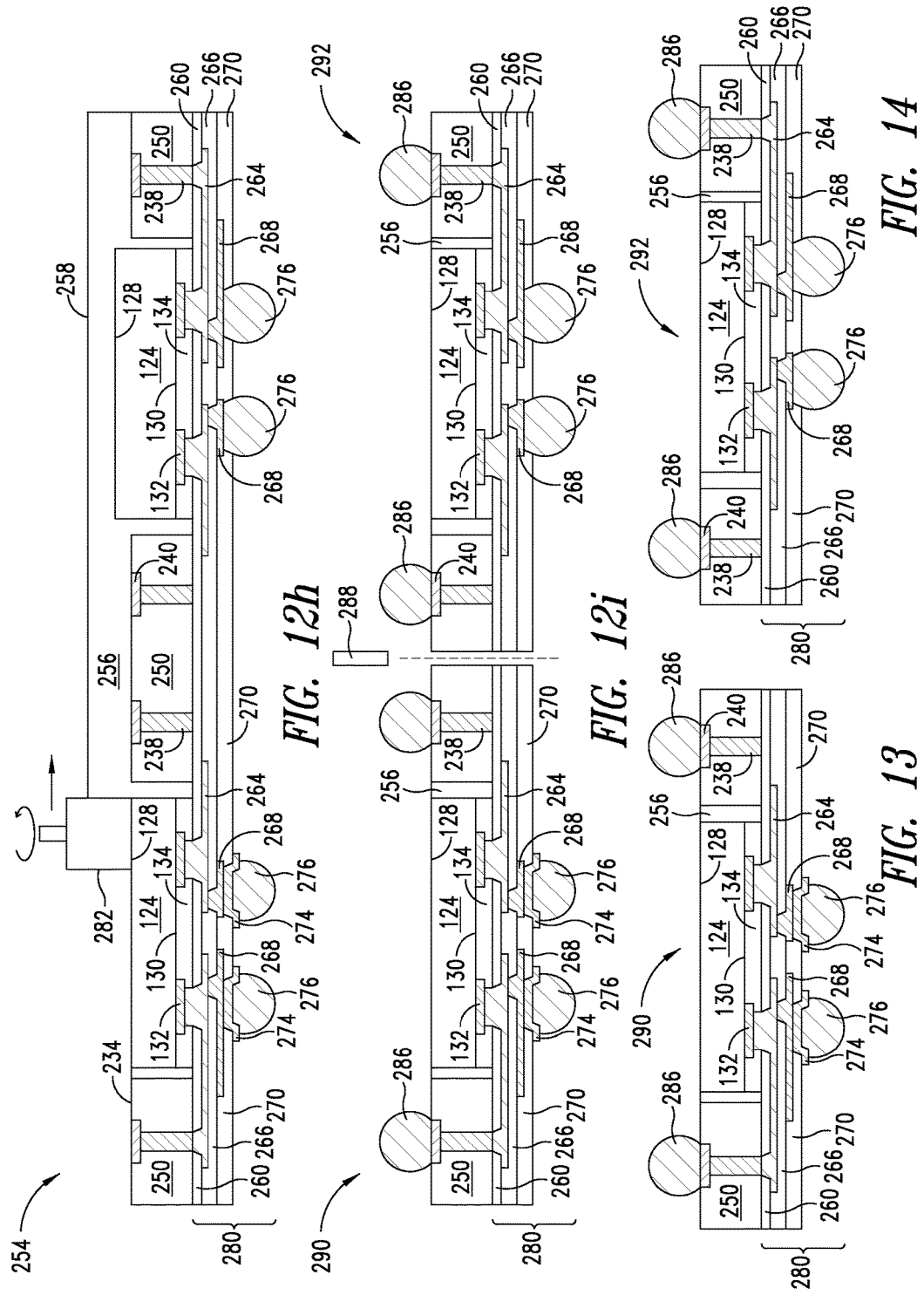

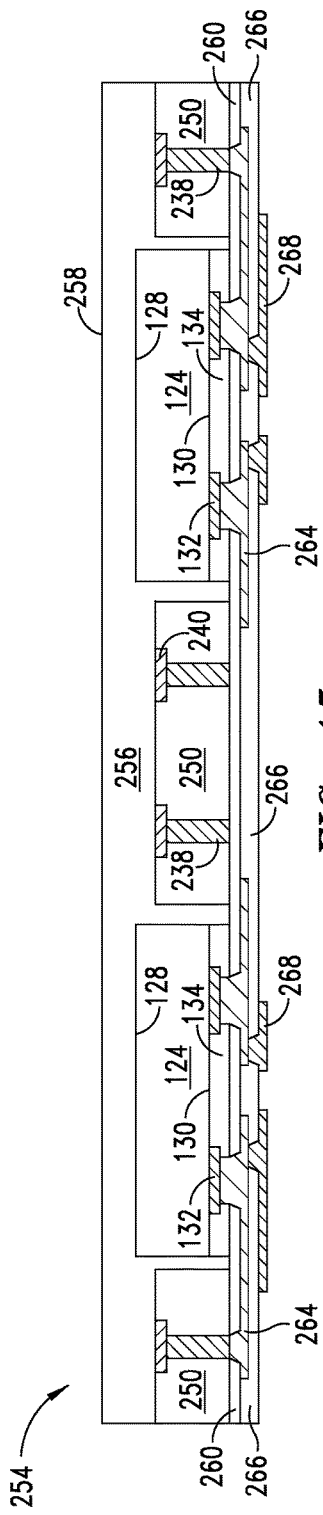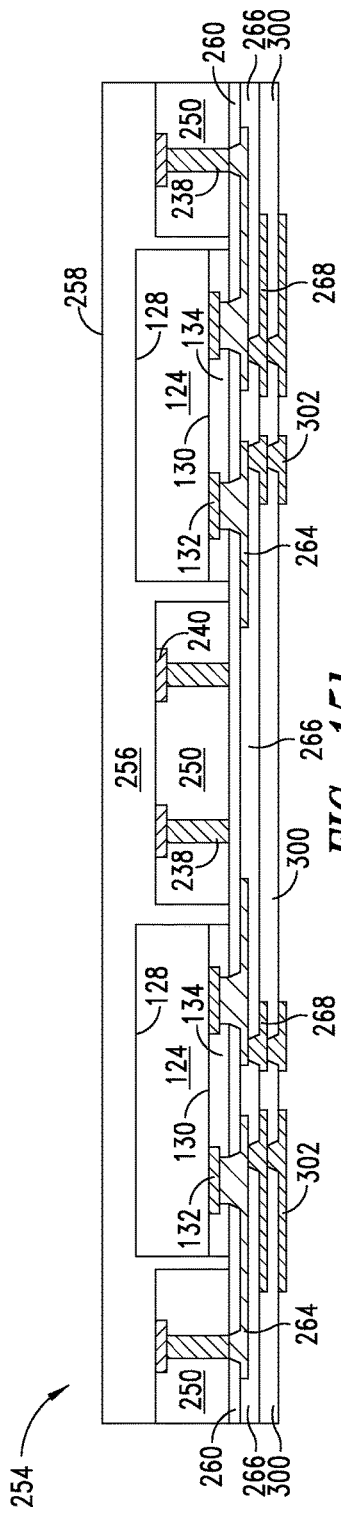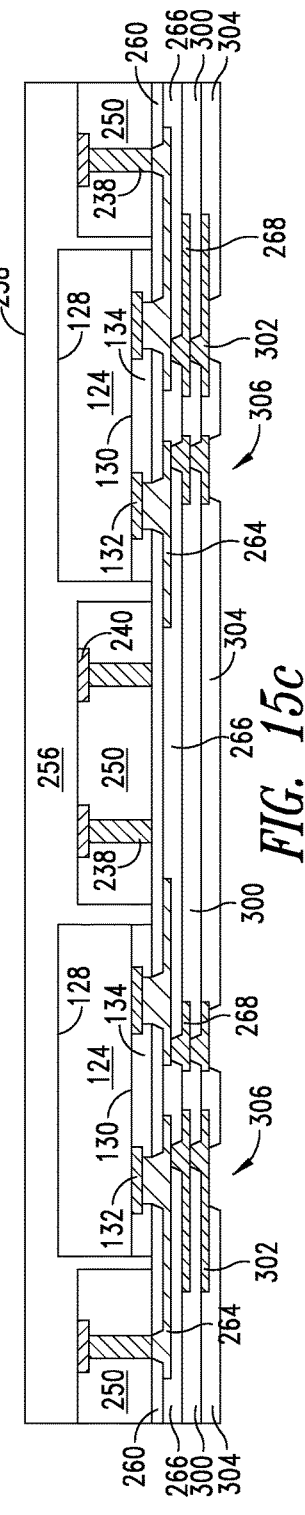

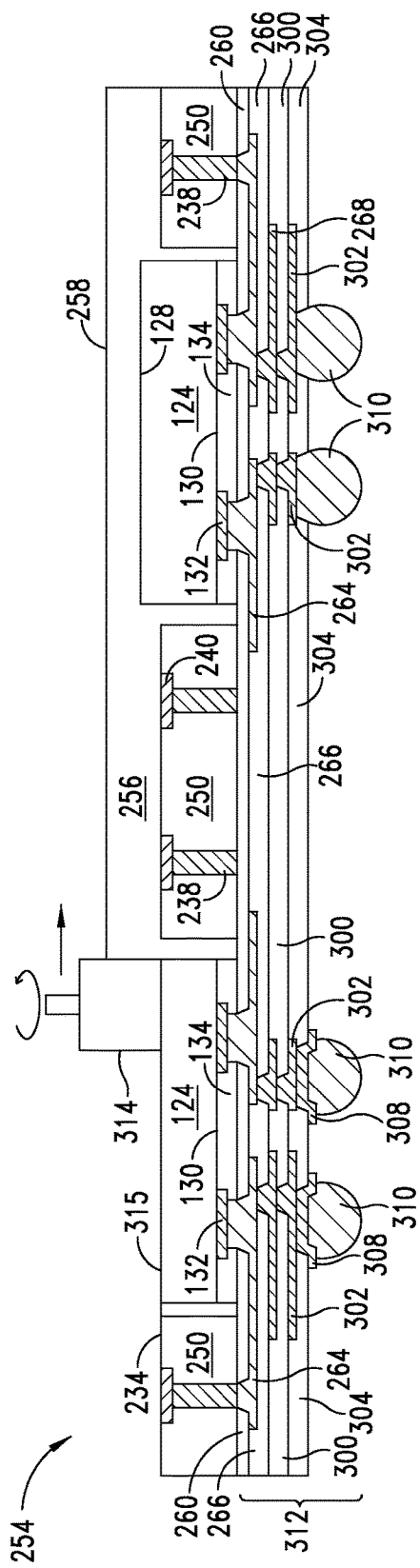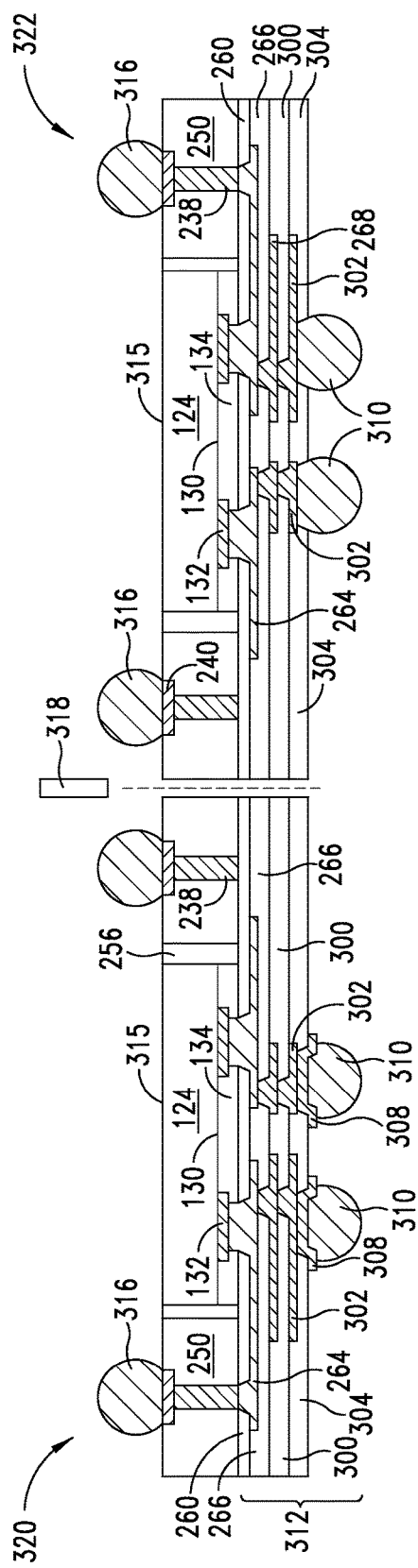

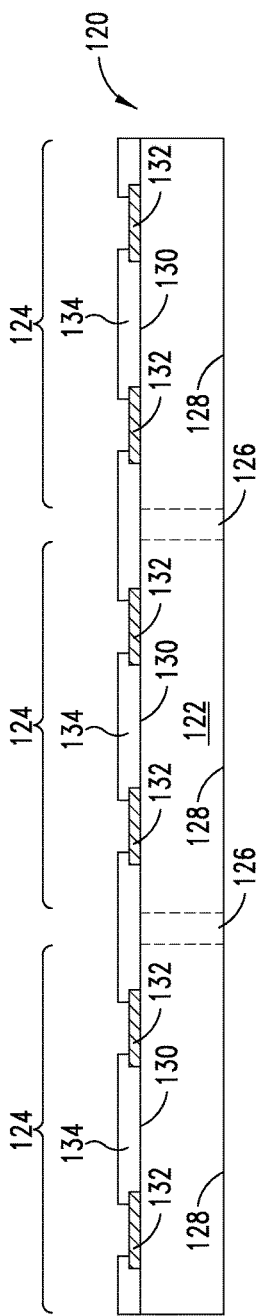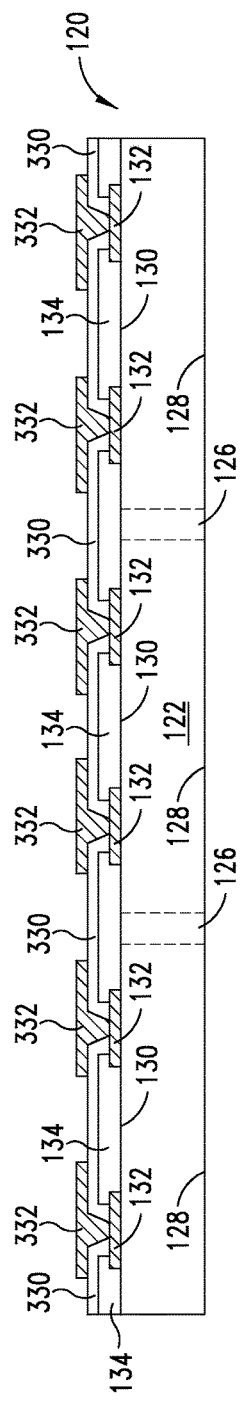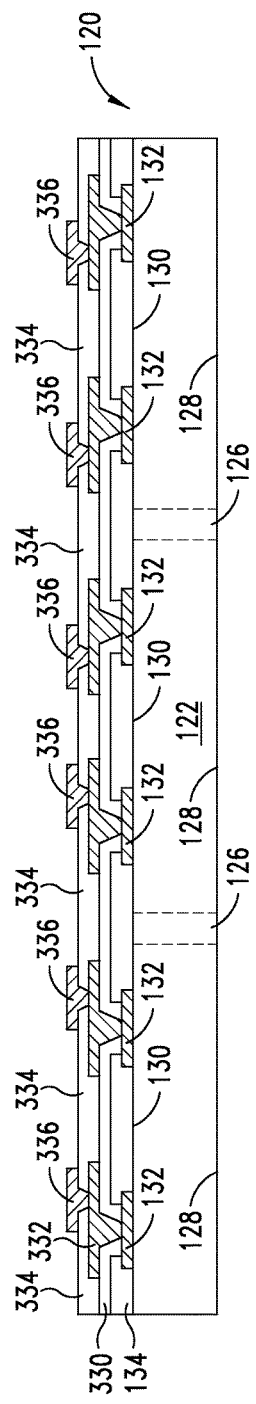

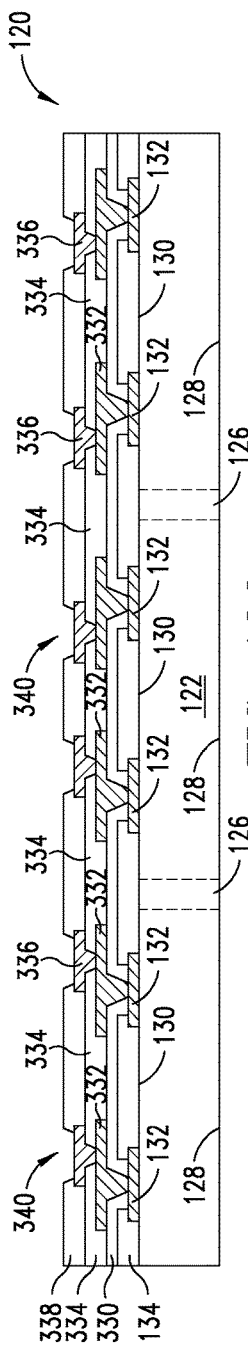
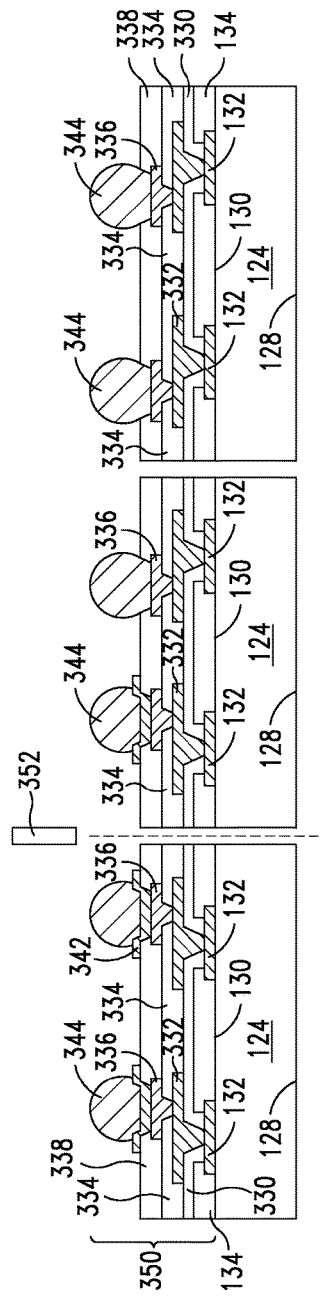
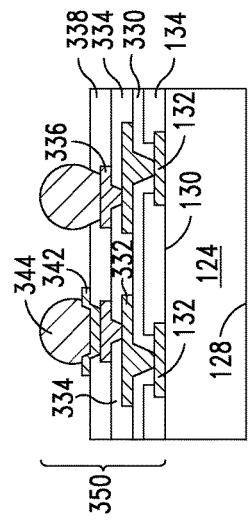
FIG. 18d
FIG. 18e
FIG. 19

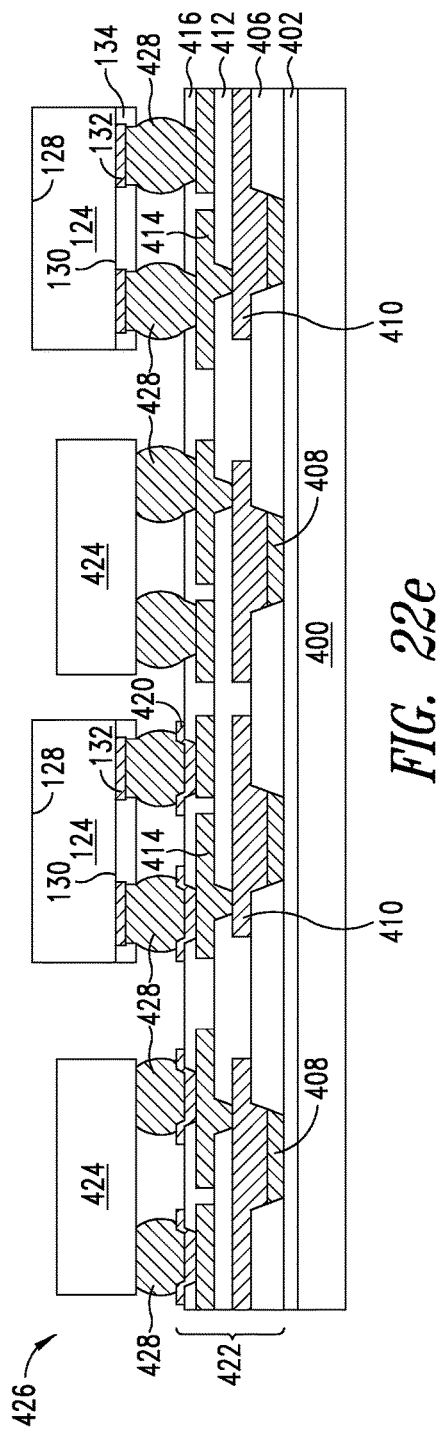
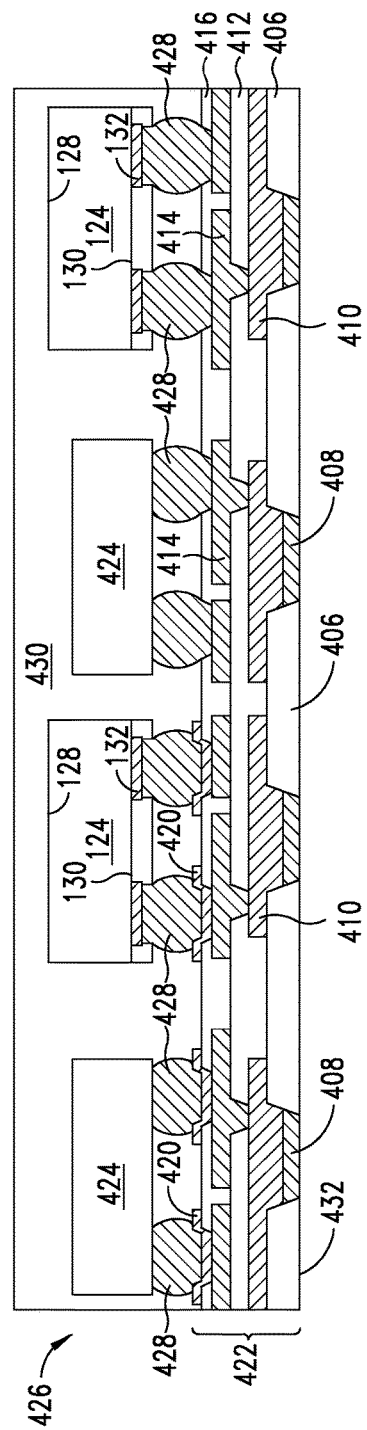
FIG. 22e
FIG. 22f

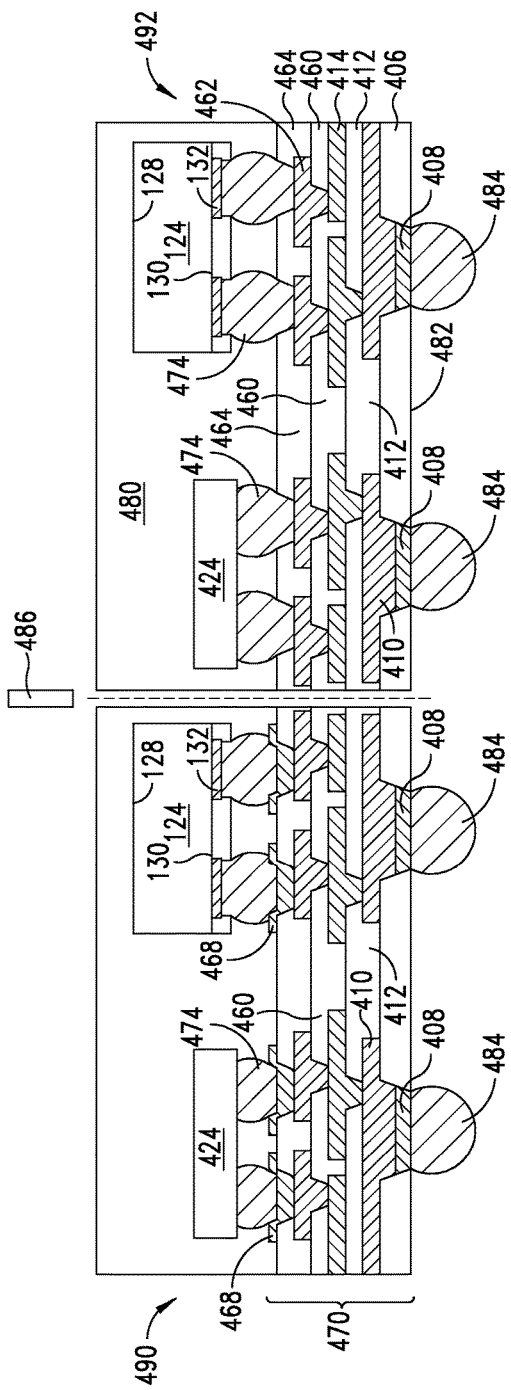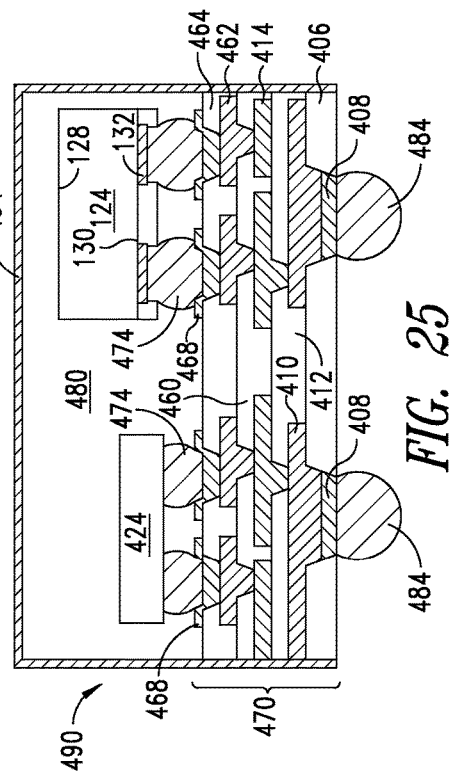

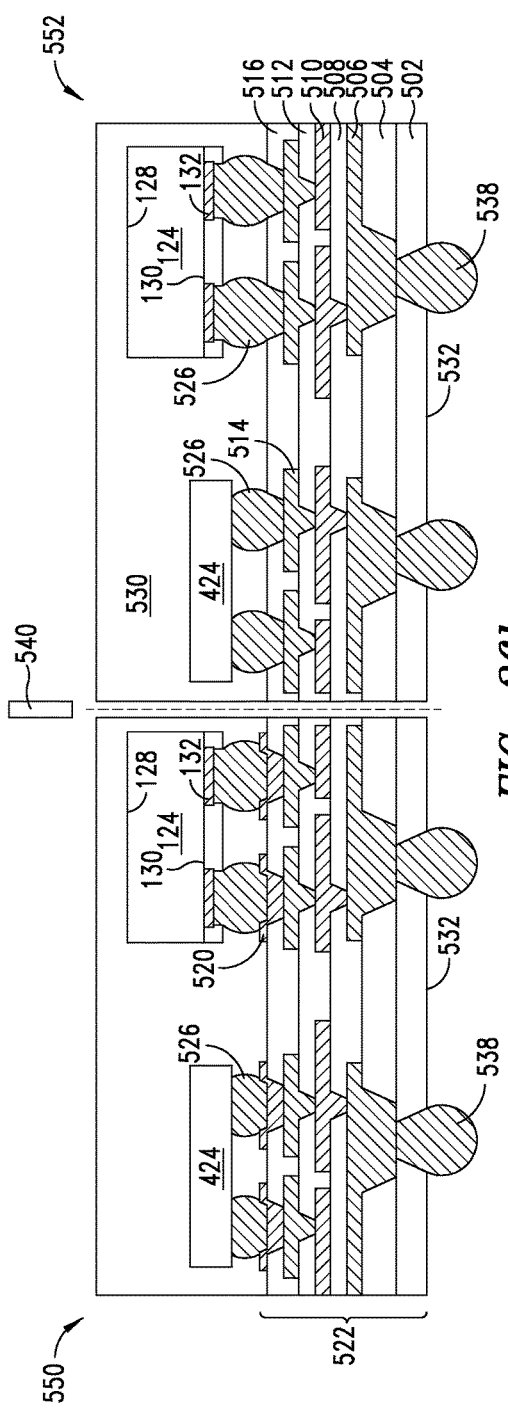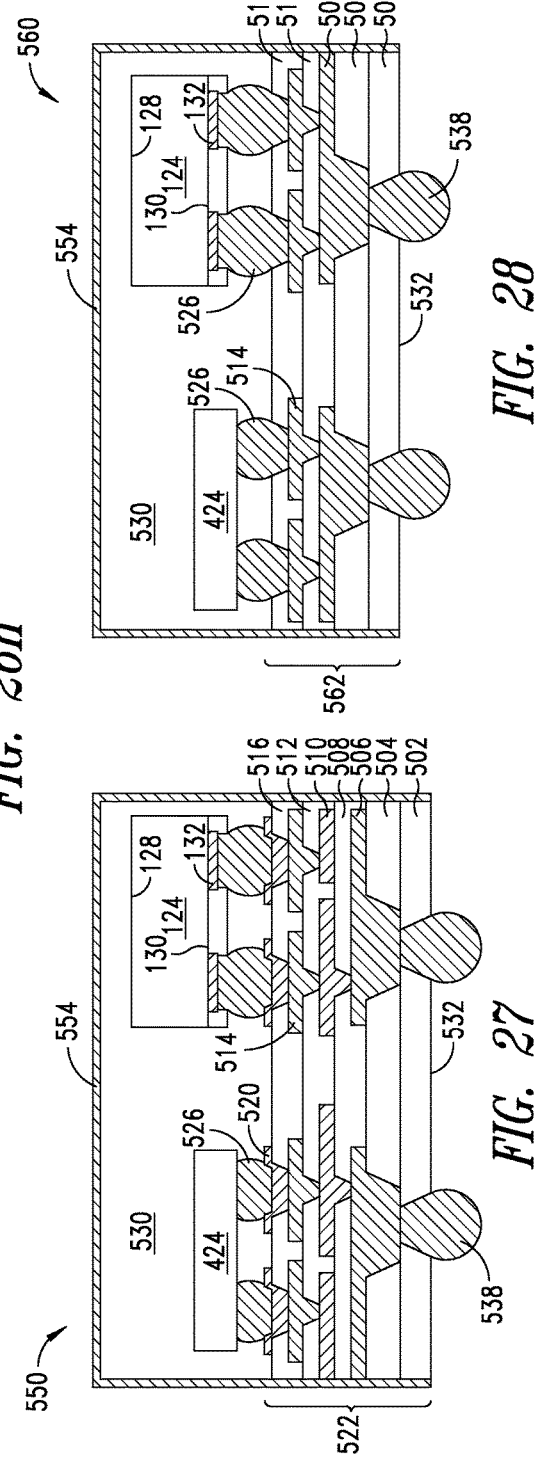
FIG. 26h
FIG. 27
FIG. 28

SEMICONDUCTOR DEVICE AND METHOD OF FORMING WAFER-LEVEL INTERCONNECT STRUCTURES WITH ADVANCED DIELECTRIC CHARACTERISTICS

CLAIM TO DOMESTIC PRIORITY

The present application is a continuation-in-part of U.S. patent application Ser. No. 13/728,012, now U.S. Pat. No. 9,520,365, filed Dec. 27, 2012, which is a division of U.S. patent application Ser. No. 13/164,015, now U.S. Pat. No. 8,492,203, filed Jun. 20, 2011, which claims the benefit of Provisional Application No. 61/435,215, filed Jan. 21, 2011, which applications are incorporated herein by reference.

FIELD OF THE INVENTION

The present invention relates in general to semiconductor devices and, more particularly, to a semiconductor device and method of forming a semiconductor package having a build-up interconnect structure with the insulating layers optimized for reliability within the package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays.

Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A build-up interconnect structure is formed over a semiconductor die for electrical interconnect. The build-up interconnect structure contains one or more insulating layers and one or more conductive layers between the insulating layers. The insulating layers are subject to cracking, particularly during temperature cycling tests, due to coefficient of thermal expansion (CTE) mismatches between adjacent surfaces. The CTE mismatch between the semiconductor base material of the semiconductor die and the insulating layers reduces adhesion of the insulating layers to adjacent features, such as encapsulant, conductive layers, and other insulating layers. The insulating layers often exhibit low tensile strength and elongation with surface wrinkle and weak adhesion to the adjacent layer due to a non-optimal curing profile. The warpage and defects in the insulating layers of the build-up interconnect structure lead to lower manufacturing yield and higher cost.

The semiconductor package is subject to damage during processing due to handling, contamination, or exposure to high temperatures. Fragile thin film layers are particularly susceptible to damage during processing. For example, high temperature processes can cause warpage of the package and delamination of the insulating layers and conductive layers. Warpage of the semiconductor package can cause joint defects or failures and reduce reliability of the electrical connections across the device.

SUMMARY OF THE INVENTION

A need exists for a more reliable semiconductor package with a build-up interconnect structure having increased strength and adhesion as well as reduced warpage. Accordingly, in one embodiment, the present invention is a method of making a semiconductor device comprising the steps of providing a semiconductor die, depositing an encapsulant over the semiconductor die, forming a first insulating layer including a first material over the semiconductor die and encapsulant, forming a first conductive layer over the first insulating layer, forming a second insulating layer including a second material over the first insulating layer and first conductive layer. The second material is different from the first material. The method further includes the step of forming a third insulating layer including the first material over the second insulating layer.

In another embodiment, the present invention is a method of making a semiconductor device comprising the steps of providing a first insulating layer including a first material, forming a second insulating layer including a second material over the first insulating layer. The second material is different from the first material. The method further includes the steps of forming a third insulating layer including the first material over the second insulating layer, and disposing a semiconductor die over the third insulating layer.

In another embodiment, the present invention is a semiconductor device comprising a semiconductor die and a first insulating layer including a first material formed over the semiconductor die. A first conductive layer is formed over the first insulating layer. A second insulating layer including a second material is formed over the first insulating layer and first conductive layer. A third insulating layer including the first material is formed over the second insulating layer.

In another embodiment, the present invention is a semiconductor device comprising a first insulating layer including a first material. A second insulating layer including a second material is formed over the first insulating layer. A third insulating layer including the first material is formed over the second insulating layer. A semiconductor die is disposed over the third insulating layer.

BRIEF DESCRIPTION OF THE DRAWINGS

FIGS. 2a-2c illustrate a semiconductor wafer with a plurality of semiconductor die separated by a saw street;

FIGS. 3a-3i illustrate a process of forming an ECWLP package having an interconnect structure over a semiconductor die with different CTE insulating layers and each insulating layer optimized for adhesion to the adjacent layer;

FIG. 4 illustrates the ECWLP package having an interconnect structure for a semiconductor die with different CTE insulating layers and each insulating layer optimized for adhesion to the adjacent layer;

FIGS. 5a-5g illustrate another process of forming an ECWLP package having an interconnect structure over a die with different CTE insulating layers and each insulating layer optimized for adhesion to the adjacent layer;

FIG. 6 illustrates the ECWLP package having an interconnect structure for a semiconductor die with different CTE insulating layers and each insulating layer optimized for adhesion to the adjacent layer;

FIGS. 8a-8d illustrate a process of forming an ECWLP or eWLB semiconductor package having a build-up interconnect structure with insulating layers configured for advanced mechanical and chemical strength and warpage control;

FIG. 9 illustrates an ECWLP or eWLB semiconductor package including a build-up interconnect structure;

FIG. 10 illustrates an alternative semiconductor package without UBM layer;

FIGS. 11a-11b illustrate a method of prefabricating modular interconnect units from a substrate panel;

FIGS. 12a-12i illustrate a method of forming a semiconductor device including prefabricated modular interconnect units and a build-up interconnect structure;

FIG. 13 illustrates a semiconductor device including prefabricated modular interconnect units and a build-up interconnect structure;

FIG. 14 illustrates a semiconductor device including prefabricated modular interconnect units and a build-up interconnect structure without a UBM;

FIGS. 15a-15e illustrate a method of forming a semiconductor device including prefabricated modular interconnect units and a build-up interconnect structure;

FIGS. 18a-18e illustrate a method of forming a semiconductor wafer with a build-up interconnect structure;

FIG. 19 illustrates a semiconductor device with a wafer-level build-up interconnect structure;

FIGS. 22a-22g illustrate a method of forming a semiconductor device including surface mounting to a build-up interconnect structure;

FIGS. 24a-24f illustrate a method of forming a semiconductor device including surface mounting to a build-up interconnect structure;

FIG. 25 illustrates a semiconductor device with a semiconductor component mounted to a build-up interconnect structure;

FIGS. 26a-26h illustrate another method of forming a semiconductor device including surface mounting to a build-up interconnect structure;

FIG. 27 illustrates a semiconductor device with a semiconductor component mounted to a build-up interconnect structure; and FIG. 28 illustrates another semiconductor device with a semiconductor component mounted to a build-up interconnect structure.

DETAILED DESCRIPTION OF THE DRAWINGS

Figure 1:
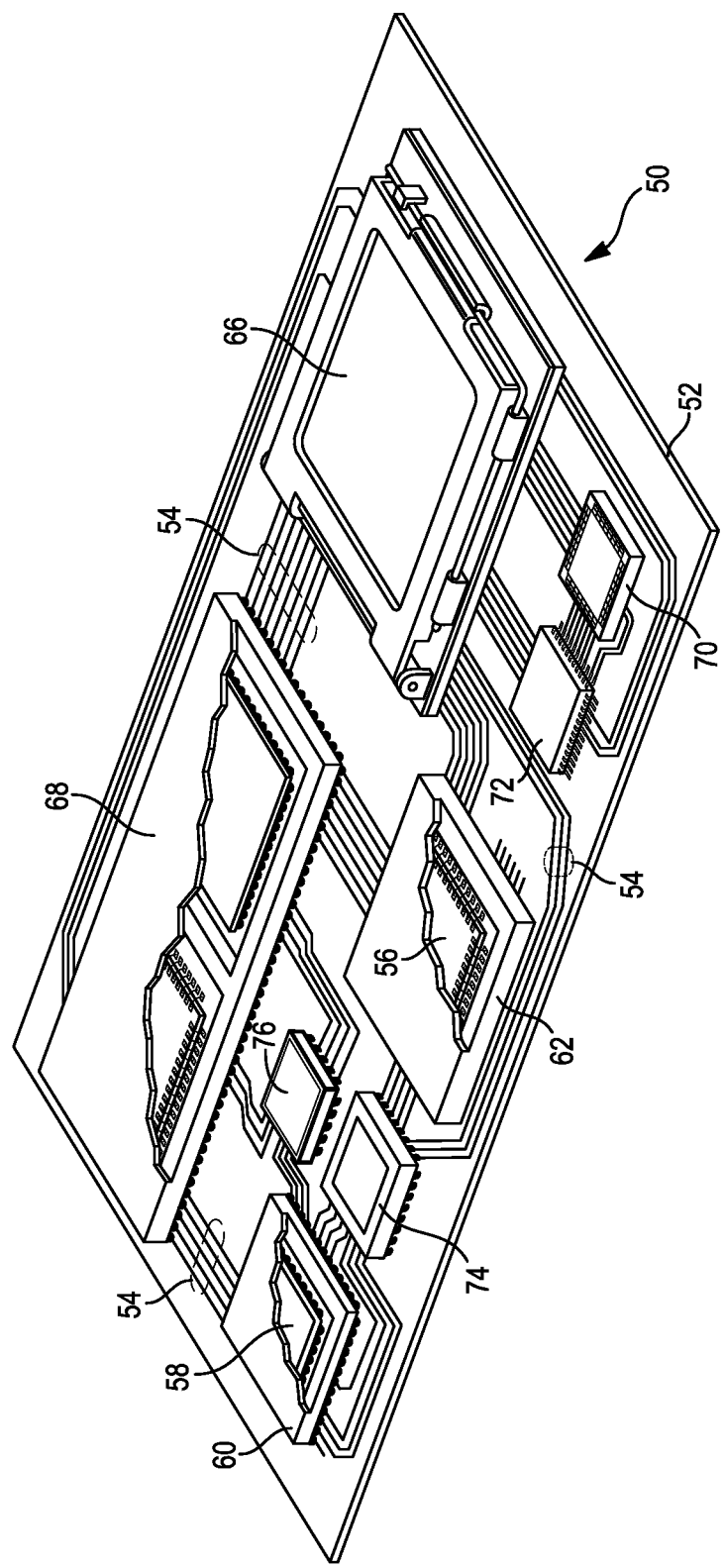
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a FO-WLP, and WLCSP 76 is a fan-in wafer level package (FI-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIG. 2a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 220 has a width or diameter of 100-450 millimeters (mm).

FIG. 2b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active region 130 to implement analog circuits or digital circuits, such as digital signal processor (DSP), ASIC, MEMS, memory, or other signal processing circuit. In one embodiment, semiconductor die 124 contains a MEMS, such as an accelerometer, strain gauge, microphone, or other sensor responsive to various external stimuli.

Semiconductor die 124 may also contain integrated passive devices (IPDs), such as inductors, capacitors, and resistors, for RF signal processing. In one embodiment, semiconductor die 124 is a flipchip type die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads for the circuits on active surface 130. Contact pads 132 can be disposed side-by-side a first distance from the edge of semiconductor die 124. Alternatively, contact pads 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layers 132 for electrical isolation using PVD, CVD, printing, spin coating, spray coating, sintering, or thermal oxidation. Insulating layer 134 contains one or more layers of solder resist, silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 134 is removed by an exposure or development process, laser direct ablation (LDA) using laser, etching, or other suitable method to expose conductive layer 132 with respect to insulating layer 134.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultraviolet (UV) light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters, for example, using a test probe head including a plurality of probes or test leads, or other testing device. Test probes are used to make electrical contact with nodes or conductive layer 132 on each semiconductor die 124 and provide electrical stimuli to contact pads 132. Semiconductor die 124 responds to the electrical stimuli, which is measured by a computer test system and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2c, semiconductor wafer 120 is singulated through saw street 126 using a saw blade or laser cutting tool 136 into individual semiconductor die 124. The individual semiconductor die 124 can be inspected and electrically tested for identification of KGD post singulation.

FIGS. 3a-3i illustrate, in relation to FIGS. 1 and 2a-2c, a process of forming an embedded chip wafer level ball grid array (ECWLP) semiconductor package having a build-up interconnect structure over a semiconductor die with different CTE insulating layers and each insulating layer optimized for adhesion to the adjacent layer. FIG. 3a shows a substrate or carrier 140 containing temporary or sacrificial base material such as silicon, polymer, beryllium oxide, or other suitable low-cost, rigid material for structural support. An interface layer or double-sided tape 142 is formed over carrier 140 as a temporary adhesive bonding film, etch-stop layer, or thermal release layer.

Carrier 140 can be a round or rectangular panel (greater than 300 mm) with capacity for multiple semiconductor die 124. Carrier 140 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 140 is selected independent of the size of semiconductor die 124 or size of semiconductor wafer 120. That is, carrier 140 has a fixed or standardized size, which can accommodate various size semiconductor die 124 singulated from one or more semiconductor wafers 120. In one embodiment, carrier 140 is circular with a diameter of 330 mm. In another embodiment, carrier 140 is rectangular with a width of 560 mm and length of 600 mm. Semiconductor die 124 may have dimensions of 10 mm by 10 mm, which are placed on the standardized carrier 140. Alternatively, semiconductor die 124 may have dimensions of 20 mm by 20 mm, which are placed on the same standardized carrier 140. Accordingly, standardized carrier 140 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 140 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

In FIG. 3a, semiconductor die 124 from FIGS. 2a-2c is aligned with and mounted to carrier 140 with insulating layer 134 oriented toward the carrier. FIG. 3b shows semiconductor die 124 mounted to interface layer 142 of carrier 140 with insulating layer 134 temporarily bonded to interface layer 142. Semiconductor die 124 are disposed over carrier 140 as reconstituted or reconfigured panel or wafer 143.

Reconstituted panel 143 can be processed into many types of semiconductor packages, including eWLB, fan-in WLCSP, reconstituted or embedded wafer level chip scale packages (eWLCSP), fan-out WLCSP, flipchip packages, three dimensional (3D) packages, package-on-package (PoP), or other semiconductor packages. Reconstituted panel 143 is configured according to the specifications of the resulting semiconductor package. In one embodiment, semiconductor die 124 are placed on carrier 140 in a high-density arrangement, i.e., 300 µm apart or less, for processing fan-in devices. In another embodiment, semiconductor die 124 are separated by a distance of 50 µm on carrier 140. The distance between semiconductor die 124 on carrier 140 is optimized for manufacturing the semiconductor packages at the lowest unit cost. The larger surface area of carrier 140 accommodates more semiconductor die 124 and lowers manufacturing cost as more semiconductor die 124 are processed per reconstituted panel 143. The number of semiconductor die 124 mounted to carrier 140 can be greater than the number of semiconductor die 124 singulated from semiconductor wafer 120. Carrier 140 and reconstituted panel 143 provide the flexibility to manufacture many different types of semiconductor packages using different size semiconductor die 124 from different sized semiconductor wafers 120.

In FIG. 3c, an encapsulant or molding compound 144 is deposited over and around semiconductor die 124 using a paste printing, compressive molding, transfer molding, liquid encapsulant molding, vacuum lamination, spin coating, or other suitable applicator. Encapsulant 144 can be polymer composite material, such as epoxy resin with filler, epoxy acrylate with filler, or polymer with proper filler. Encapsulant 144 is non-conductive and environmentally protects the semiconductor device from external elements and contaminants.

In FIG. 3d, a portion of back surface 146 of encapsulant 144 is removed by grinder 148 in an optional backgrinding operation to planarize the encapsulant and expose back surface 128 of semiconductor die 124. The optional backgrinding operation reduces the package profile. A chemical etch or chemical mechanical planarization (CMP) process can also be used to planarize encapsulant 144 and to remove mechanical damage resulting from the grinding operation. In one embodiment, the removal of a portion of encapsulant 144 leaves a back surface of encapsulant 144 coplanar with back surface 128 of semiconductor die 124.

Continuing from FIG. 3c, carrier 140 and interface layer 142 are removed by chemical etching, mechanical peeling, CMP, mechanical grinding, thermal bake, UV light, laser scanning, or wet stripping to expose contact pads 132, insulating layer 134, and encapsulant 144, as shown in FIG. 3e.

In FIG. 3f, an insulating or dielectric layer 150 is formed over insulating layer 134, encapsulant 144, and the exposed conductive layer 132 using PVD, CVD, lamination, screen printing, slit coating, spin coating, or spray coating. Insulating layer 150 contains one or more layers of low temperature (less than 250° C.) curing polymer dielectric materials, such as low temperature cure negative tone polyimide (PI), negative tone polyisoprene, positive tone polybenzoxazoles (PBO), non-photosensitive polymer dielectric with or without filler, or other suitable dielectric material. A portion of insulating layer 150 is removed by an etching process, an exposure or development process, for example UV exposure followed by wet chemical developing, or by LDA, or laser (UV or excimer laser) via drilling to form openings 151 over conductive layer 132 and to expose conductive layer 132 with respect to insulating layer 150. In particular, insulating layer 150 is patterned and cured for optimal adhesion to conductive layer 132, insulating layer 134, and encapsulant 144 of semiconductor die 124. In one embodiment, a curing process for insulating layer 150 involves a multi-step dwell profile, e.g., with at least three different dwell steps, to enhance mechanical and adhesion properties to conductive layer 132, insulating layer 134, and encapsulant 144 under pressure cooker test (PCT), e.g., >400 kg/cm2 for 0 to 200 hours unbiased humidity accelerated stress testing (uHAST), without introducing surface wrinkle after curing. The multi-step dwell profile includes a first dwell step with a temperature of 100° C. or less, e.g., 70-90° C., for 30-90 minutes to remove solvent and moisture, second dwell step with a temperature between 120-150° C. for 30-60 minutes, and third dwell step with a temperature between 180-240° C. for 60-180 minutes.

Insulating layer 150 has a tensile strength of greater than or equal to (≥) 100 megapascals (MPa), high elongation, e.g. an elongation of 20% or greater, and a Young's modulus or elastic modulus less than or equal to (≤) 3.0 gigapascals (GPa) at a test temperature under 25° C. In one embodiment, a CTE for insulating layer 150 is selected in the range of 30-90 parts per million per degree Celsius (ppm/° C.). In another embodiment, insulating layer 150 is selected having an approximate tensile strength of 130 MPa, maximum elongation of 50% at 25° C. and 40% at −55° C., and elastic modulus of 3.3 GPa. A CTE for insulating layer 150 is approximately 65 ppm/° C. at α1 (below glass transition temperature Tg of 205° C.) and is approximately 0.80% or 8,000 ppm/° C. at α2 (above glass transition temperature Tg of 205° C.)

In FIG. 3g, an electrically conductive layer or redistribution layer (RDL) 152 is formed over insulating layer 150 and conductive layer 132 using a patterning and metal deposition process such as sputtering, electrolytic plating, and electroless plating. Conductive layer 152 can be one or more layers of Al, Cu, Sn, Ni, Au, Ag, titanium (Ti), tungsten (W), titanium tungsten (TiW), TiW/Cu, Ti/Cu, or other suitable electrically conductive material. One portion of conductive layer 152 is electrically connected to conductive layer 132 of semiconductor die 124. Other portions of conductive layer 152 can be electrically common or electrically isolated depending on the design and function of semiconductor die 124.

In FIG. 3h, an insulating or dielectric layer 154 is formed over insulating layer 150 and conductive layer 152 using PVD, CVD, lamination, screen printing, slit coating, spin coating, or spray coating. Insulating layer 154 contains one or more layers of low temperature (less than 250° C.) curing polymer dielectric materials, such as low temperature cure negative tone PI, negative tone polyisoprene, positive tone PBO, non-photosensitive polymer dielectric with or without filler, or other suitable dielectric material. A portion of insulating layer 154 is removed by an etching process, an exposure or development process, for example UV exposure followed by wet chemical developing, or by LDA, or laser (UV or excimer laser) via drilling to form openings 155 over conductive layer 152 and to expose conductive layer 152 with respect to insulating layer 154. In particular, insulating layer 154 is patterned and cured for optimal adhesion to insulating layer 150 and conductive layer 152. The curing process for insulating layer 154 involves a multi-step dwell profile, e.g., with at least three different dwell steps, to enhance mechanical and adhesion properties to insulating layer 150 and conductive layer 152 under PCT, e.g., >400 kg/cm2 for 0 to 500 hours uHAST, without introducing surface wrinkle after curing. The multi-step dwell profile includes a first dwell step with a temperature of 100° C. or less, e.g., 70-90° C., for 30-90 minutes to remove solvent and moisture, second dwell step with a temperature between 120-150° C. for 30-60 minutes, and third dwell step with a temperature between 180-240° C. for 60-180 minutes.

Insulating layer 154 has a tensile strength ≥100 MPa, high elongation ≥20%, and modulus ≤3.0 GPa under 25° C. In particular, a CTE for insulating layer 154 is selected to be different from the CTE of insulating layer 150. For example, the CTE of insulating layer 154 is selected in the range of 90-150 ppm/° C. Alternatively, the CTE of insulating layer 150 is selected to be 90-150 ppm/° C. and the CTE of insulating layer 154 is selected to be 30-90 ppm/° C. In one embodiment, the CTE of insulating layer 150 is selected to be 73 ppm/° C., and the CTE of insulating layer 154 is selected to be 126 ppm/° C. In another embodiment, insulating layer 154 is selected having an approximate tensile strength of 100 MPa, maximum elongation of 50% at 25° C. and 18% at −40° C., and elastic modulus of 2.0-2.2 GPa. A CTE for insulating layer 154 is approximately 58 ppm/° C. at α1 (below glass transition temperature Tg of 207° C.) and is approximately 620 ppm/° C. at α2 (above glass transition temperature Tg of 207° C.)

The different CTEs of insulating layers 150 and 154 create a dielectric gradient across interconnect structure 158. The dielectric gradient reduces stress induced by insulating layers 150 and 154 during temperature cycling, e.g., during reliability testing, especially due to the free boundary surface of insulating layer 154 and CTE mismatch between insulating layer 150 and encapsulant 144 and semiconductor die 124.

In another embodiment, insulating layers 150 and 154 have similar CTE, e.g., within +/−30 ppm/° C. Insulating layer 150 has good adhesion to conductive layer 132, insulating layer 134, and encapsulant 144 during the build-up process and after curing, as well as good mechanical properties of tensile strength ≥100 MPa and high elongation ≥20%. Insulating layer 154 has good adhesion to insulating layer 150 and conductive layer 152, as well as good mechanical properties of tensile strength ≥100 MPa and high elongation (≥20%). In addition, insulating layer 154 has a dense material structure to block or delay the moisture penetration into the film, and therefore into insulating layer 150, 150/144 interface, and 150/134 interface. The dense state of insulating layer 154 also improves reliability in uHAST and PCT and prevents interface delamination at the 150/144 interface and 150/134 interface.

In another embodiment, insulating layers 150 and 154 have good adhesion to conductive layer 132, insulating layer 134, and encapsulant 144, as well as good mechanical properties of tensile strength ≥100 MPa and high elongation ≥20%. Insulating layer 150 is cured at higher temperature for example, 240° C.+/−10° C., while insulating layer 154 is cured at lower temperature, e.g., 215° C.+/−10° C. The different curing temperatures lower contact resistance between conductive layers 132 and 152, and package temperature cycling test reliability performance due to different residue stress, warpage behavior, out-gassing control in the seed layer PVD for conductive layer 152, and enhance interface between 150 and 154 under different temperatures.

In yet another embodiment, insulating layer 154 is selected to have a lower CTE and less shrinkage during curing than insulating layer 150, while insulating layer 150 has greater adhesion force, higher tensile strength, greater elongation in a temperature range of −65° C. to 150° C., and a higher chemical resistance than insulating layer 154. For example, insulating layer 154 exhibits approximately 12% shrinkage during curing, and insulating layer 150 exhibits approximately 31% shrinkage during curing. The force of adhesion between insulating layers 150 and 134 is greater than 400 Newtons (N). The materials and structure of insulating layers 150 and 154 maximize the mechanical strength and chemical strength during handling and minimize warpage of the semiconductor package during subsequent packaging and assembly processes, particularly during high temperature processes.

In FIG. 3i, an electrically conductive bump material is deposited over conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form balls or bumps 156. In some applications, bumps 156 are reflowed a second time to improve electrical contact to conductive layer 152. Bumps 156 can also be compression bonded to conductive layer 152. Bumps 156 represent one type of interconnect structure that can be formed over conductive layer 152. The interconnect structure can also use stud bump, micro bump, pillar, or other electrical interconnect.

The insulating layers 150 and 154, conductive layer 152, and bumps 156 constitute a build-up interconnect structure 158 formed over active surface 130 of semiconductor die 124, over conductive layer 132 and insulating layer 134, and over encapsulant 144. Semiconductor die 124 and build-up interconnect structure 158 represent an ECWLP in a reconstituted wafer form. Build-up interconnect structure 158 with insulating layers 150 and 154 exhibits advanced dielectric characteristics that improve manufacturing yield and package reliability. For example, insulating layers 150 and 154 are configured for maximum mechanical strength and chemical strength during and after the formation of build-up interconnect structure 158 for improved handling of reconstituted panel 143. Reconstituted panel 143 is singulated through build-up interconnect structure 158 and encapsulant 144 using a saw blade or laser cutting tool 160 into individual ECWLP packages 162 containing semiconductor die 124.

FIG. 4 shows ECWLP package 162 with semiconductor die 124 electrically connected to conductive layer 152 and bumps 156 for external interconnect to other semiconductor devices. ECWLP package 162 can be further assembled or packaged. For example, ECWLP package 162 is mounted to a substrate, interposer, PCB, wafer, or other semiconductor device. The advanced dielectric characteristics of ECWLP package 162 improve the thermal performance of ECWLP package 162 during subsequent packaging and assembly processes. For example, insulating layers 150 and 154 are configured to minimize warpage of ECWLP package 162, particularly during high temperature processes, thereby improving the reliability of the package and final semiconductor device. In one embodiment, the CTE of insulating layer 150 is selected in the range of 30-90 ppm/° C., and the CTE of insulating layer 154 is selected in the range of 90-150 ppm/° C. The CTE of insulating layer 154 is greater than the CTE of insulating layer 150, and the different CTEs create a CTE gradient or dielectric gradient increasing in a direction from insulating layer 150 to insulating layer 154. In another embodiment, the CTE of insulating layer 150 is selected to be 90-150 ppm/° C. and the CTE of insulating layer 154 is selected to be 30-90 ppm/° C. The CTE of insulating layer 154 is less than the CTE of insulating layer 150, and the different CTEs create a CTE gradient or dielectric gradient decreasing in a direction from insulating layer 150 to insulating layer 154. The different CTEs of insulating layers 150 and 154 create a dielectric gradient across interconnect structure 158. The dielectric gradient reduces stress induced by insulating layers 150 and 154 during temperature cycling, e.g., during reliability testing, especially due to the free boundary surface of insulating layer 154 and CTE mismatch between insulating layer 150 and encapsulant 144 and semiconductor die 124.

Insulating layer 150 is patterned and cured for optimal adhesion to conductive layer 132, insulating layer 134, and encapsulant 144 of semiconductor die 124. The curing process for insulating layer 150 involves a multi-step dwell profile to enhance mechanical and adhesion properties to conductive layer 132, insulating layer 134, and encapsulant 144, without introducing surface wrinkle. Insulating layer 154 is patterned and cured for optimal adhesion to insulating layer 150 and conductive layer 152. The curing process for insulating layer 154 involves a multi-step dwell profile to enhance mechanical and adhesion properties to insulating layer 150 and conductive layer 152, without introducing surface wrinkle. In one embodiment, insulating layers 150 and 154 are cured sequentially. Insulating layer 150 is deposited and cured prior to forming insulating layer 154. In another embodiment, insulating layers 150 and 154 are cured simultaneously. Insulating layers 150 and 154 are deposited and patterned, and are cured during the same curing process, such as with a multi-step dwelling process.

FIGS. 5a-5g illustrate, in relation to FIGS. 1 and 2a-2c, another process of forming an ECWLP semiconductor package having a build-up interconnect structure over a semiconductor die with different CTE insulating layers and each insulating layer optimized for adhesion to the adjacent layer. In FIG. 5a, continuing from FIG. 3e, an insulating or dielectric layer 170 is formed over insulating layer 134, encapsulant 144, and the exposed conductive layer 132 using PVD, CVD, lamination, screen printing, slit coating, spin coating, or spray coating. Insulating layer 170 contains one or more layers of low temperature (less than 250° C.) curing polymer dielectric materials, such as low temperature cure negative tone PI, negative tone polyisoprene, positive tone PBO, non-photosensitive polymer dielectric with or without filler, or other suitable dielectric material or material having similar insulating and structural properties. A portion of insulating layer 170 is removed by an etching process, an exposure or development process, for example UV exposure followed by wet chemical developing, or by LDA, or laser (UV or excimer laser) via drilling to form openings 171 over conductive layer 132 and to expose conductive layer 132 with respect to insulating layer 170. In particular, insulating layer 170 is patterned and cured for optimal adhesion to conductive layer 132, insulating layer 134, and encapsulant 144 of semiconductor die 124. The curing process for insulating layer 170 involves a multi-step dwell profile, e.g., with at least three different dwell steps, to enhance mechanical and adhesion properties to conductive layer 132, insulating layer 134 and encapsulant 144 under PCT, e.g., >400 kg/cm2 for 0 to 200 hours uHAST, without introducing surface wrinkle after curing. The multi-step dwell profile includes a first dwell step with a temperature of 100° C. or less, e.g., 70-90° C., for 30-90 minutes to remove solvent and moisture, second dwell step with a temperature between 120-150° C. for 30-60 minutes, and third dwell step with a temperature between 180-240° C. for 60-180 minutes.

In one embodiment, insulating layer 170 has a tensile strength ≥100 MPa, elongation ≥20%, and modulus ≤3.0 GPa under 25° C. In particular, a CTE for insulating layer 170 is selected in the range of 30-90 ppm/° C. In another embodiment, insulating layer 170 is selected having an approximate tensile strength of 130 MPa, maximum elongation of 50% at 25° C. and 40% at −55° C., and elastic modulus of 3.3 GPa. A CTE for insulating layer 170 is approximately 65 ppm/° C. at α1 and 0.80% or 8,000 ppm/° C. at α2 (Tg=205° C.)

In FIG. 5b, an electrically conductive layer or RDL 172 is formed over insulating layer 170 and conductive layer 132 using a patterning and metal deposition process such as sputtering, electrolytic plating, and electroless plating. Conductive layer 172 can be one or more layers of Al, Cu, Sn, Ni, Au, Ag, Ti, W, TiW, TiW/Cu, Ti/Cu, or other suitable electrically conductive material. One portion of conductive layer 172 is electrically connected to conductive layer 132 of semiconductor die 124. Other portions of conductive layer 172 can be electrically common or electrically isolated depending on the design and function of semiconductor die 124.

In FIG. 5c, an insulating or dielectric layer 174 is formed over insulating layer 170 and conductive layer 172 using PVD, CVD, lamination, screen printing, slit coating, spin coating, or spray coating. Insulating layer 174 contains one or more layers of low temperature (less than 250° C.) curing polymer dielectric materials, such as low temperature cure negative tone PI, negative tone polyisoprene, positive tone PBO, non-photosensitive polymer dielectric with or without filler, or other suitable dielectric material or material having similar insulating and structural properties. A portion of insulating layer 174 is removed by an etching process, an exposure or development process, for example UV exposure followed by wet chemical developing, or by LDA, or laser (UV or excimer laser) via drilling to form openings 175 over conductive layer 172 and to expose conductive layer 172 with respect to insulating layer 174.

Insulating layer 174 is patterned and cured for optimal adhesion to insulating layer 170 and conductive layer 172. The curing process for insulating layer 174 involves a multi-step dwell profile, e.g., with at least three different dwell steps, to enhance mechanical and adhesion properties to insulating layer 170 and conductive layer 172 under PCT, e.g., >400 kg/cm2 for 0 to 500 hours uHAST, without introducing surface wrinkle after curing. The multi-step dwell profile includes a first dwell step with a temperature of 100° C. or less, e.g., 70-90° C., for 30-90 minutes to remove solvent and moisture, second dwell step with a temperature between 120-150° C. for 30-60 minutes, and third dwell step with a temperature between 180-240° C. for 60-180 minutes. In one embodiment, insulating layers 170 and 174 are cured sequentially. Insulating layer 170 is deposited and cured prior to forming insulating layer 174. In another embodiment, insulating layers 170 and 174 are cured simultaneously. Insulating layers 170 and 174 are deposited and patterned, and are cured during the same curing process, such as with a multi-step dwelling process.

Alternatively, insulating layer 174 has a dense structure after the multi-step dwell curing profile to block or delay the moisture penetration into the film, and therefore into insulating layer 170, 170/144 interface, and 170/134 interface.

In one embodiment, insulating layer 174 has a tensile strength ≥100 MPa, elongation ≥20%, and modulus ≤3.0 GPa under 25° C. In particular, a CTE for insulating layer 174 is selected to be different from the CTE of insulating layer 170. For example, the CTE of insulating layer 174 is selected in the range of 90-110 ppm/° C. Alternatively, the CTE of insulating layer 170 is selected to be 90-110 ppm/°

C. and the CTE of insulating layer 174 is selected to be 30-90 ppm/° C. In one embodiment, the CTE of insulating layer 170 is selected to be 73 ppm/° C., and the CTE of insulating layer 174 is selected to be 106 ppm/° C. In another embodiment, insulating layer 174 is selected having an approximate tensile strength of 100 MPa, maximum elongation of 50% at 25° C. and 18% at −40° C., and elastic modulus of 2.0-2.2 GPa. A CTE for insulating layer 174 is approximately 58 ppm/° C. at α1 and 620 ppm/° C. at α2 (Tg=207° C.) Insulating layer 174 is selected to have a lower CTE and less shrinkage during curing than insulating layer 170, while insulating layer 170 has greater adhesion force, tensile strength, elongation, elastic modulus, and chemical resistance than insulating layer 174.

In FIG. 5d, an electrically conductive layer or RDL 176 is formed over insulating layer 174 and conductive layer 172 using a patterning and metal deposition process such as sputtering, electrolytic plating, and electroless plating. Conductive layer 176 can be one or more layers of Al, Cu, Sn, Ni, Au, Ag, Ti, W, TiW, TiW/Cu, Ti/Cu, or other suitable electrically conductive material. One portion of conductive layer 176 is electrically connected to conductive layer 172 and to conductive layer 132 of semiconductor die 124. Other portions of conductive layer 176 can be electrically common or electrically isolated depending on the design and function of semiconductor die 124.

In FIG. 5e, an insulating or dielectric layer 178 is formed over insulating layer 174 and conductive layer 176 using PVD, CVD, lamination, screen printing, slit coating, spin coating, or spray coating. Insulating layer 178 contains one or more layers of low temperature (less than 250° C.) curing polymer dielectric materials, such as low temperature cure negative tone PI, negative tone polyisoprene, positive tone PBO, non-photosensitive polymer dielectric with or without filler, or other suitable dielectric material or material having similar insulating and structural properties. A portion of insulating layer 178 is removed by an etching process, an exposure or development process, for example UV exposure followed by wet chemical developing, or by LDA, or laser (UV or excimer laser) via drilling to form openings 179 over conductive layer 176 and to expose conductive layer 176 with respect to insulating layer 178.

Insulating layer 178 is patterned and cured for optimal adhesion to insulating layer 174 and conductive layer 176. The curing process for insulating layer 178 involves a multi-step dwell profile, e.g., with at least three different dwell steps, to enhance mechanical and adhesion properties to insulating layer 174 and conductive layer 176 under PCT, e.g., >400 kg/cm2 for 0 to 500 hours uHAST, without introducing surface wrinkle after curing. The multi-step dwell profile includes a first dwell step with a temperature of 100° C. or less, e.g., 70-90° C., for 30-90 minutes to remove solvent and moisture, second dwell step with a temperature between 120-150° C. for 30-60 minutes, and third dwell step with a temperature between 180-240° C. for 60-180 minutes. In one embodiment, insulating layers 174 and 178 are cured sequentially. Insulating layer 174 is deposited and cured prior to forming insulating layer 178. In another embodiment, insulating layers 174 and 178 are cured simultaneously. Insulating layers 174 and 178 are deposited and patterned, and are cured during the same curing process, such as with a multi-step dwelling process. In one embodiment, insulating layer 178 has a dense structure after the multi-step dwell curing profile to block or delay the moisture penetration into the film, and therefore into insulating layer 178 and 178/174 interface.

In one embodiment, insulating layer 178 has a tensile strength ≥100 MPa, elongation ≥20%, and modulus ≤3.0 GPa under 25° C. In particular, a CTE for insulating layer 178 is selected to be different from the CTE of insulating layers 170 and 174. For example, the CTE of insulating layer 178 is selected in the range of 110-150 ppm/° C. Alternatively, the CTE of insulating layer 170 is selected to be 110-150 ppm/° C., the CTE of insulating layer 174 is selected to be 90-110 ppm/° C., and the CTE of insulating layer 178 is selected to be 30-90 ppm/° C. In one embodiment, the CTE of insulating layer 170 is selected to be 73 ppm/° C., the CTE of insulating layer 174 is selected to be 106 ppm/° C., and the CTE of insulating layer 178 is selected to be 126 ppm/° C.

The different CTEs of insulating layers 170, 174, and 178 create a dielectric gradient across interconnect structure 182. In one embodiment, the CTE of insulating layer 178 is greater than the CTE of insulating layer 174, and the CTE of insulating layer 174 is greater than the CTE of insulating layer 170, thereby forming a CTE gradient or dielectric gradient increasing in a direction from insulating layer 170 to insulating layer 178. Alternatively, the CTE of insulating layer 178 is greater than the CTE of insulating layer 170, and the CTE of insulating layer 174 is similar to either insulating layer 170 or 178, thereby still forming a CTE gradient or dielectric gradient increasing in a direction from insulating layer 170 to insulating layer 178. In another embodiment, the CTE of insulating layer 178 is less than the CTE of insulating layer 174, and the CTE of insulating layer 174 is less than the CTE of insulating layer 170, thereby forming a CTE gradient or dielectric gradient decreasing in a direction from insulating layer 170 to insulating layer 178. Alternatively, the CTE of insulating layer 178 is less than the CTE of insulating layer 170, and the CTE of insulating layer 174 is similar to either insulating layer 170 or 178, thereby still forming a CTE gradient or dielectric gradient decreasing in a direction from insulating layer 170 to insulating layer 178. The dielectric gradients reduce stress induced by insulating layers 170, 174, and 178 during temperature cycling.

In yet another embodiment, insulating layer 178 is the same material as insulating layer 170 or has similar material characteristics as insulating layer 170, while insulating layer 174 is different from insulating layers 170 and 178. Insulating layer 178 is selected having an approximate tensile strength of 130 MPa, maximum elongation of 50% at 25° C. and 40% at −55° C., and elastic modulus of 3.3 GPa. A CTE for insulating layer 178 is approximately 65 ppm/° C. at α1 and 0.80% or 8,000 ppm/° C. at α2 (Tg=205° C.). Insulating layers 170 and 178 are selected to have greater adhesion force, higher tensile strength and elastic modulus, greater elongation in a temperature range of −65° C. to 150° C., and a higher chemical resistance than insulating layer 174, while insulating layer 174 has a lower CTE and less shrinkage during curing than insulating layers 170 and 178. For example, insulating layer 174 exhibits approximately 12% shrinkage during curing, and insulating layers 170 and 178 exhibit approximately 31% shrinkage during curing. The force of adhesion between insulating layers 170 and 134 is greater than 400 N. The materials and structure of insulating layers 170, 174, and 178 maximize the mechanical strength and chemical strength during handling and minimize warpage of the semiconductor package during subsequent packaging and assembly processes, particularly during high temperature processes.

In FIG. 5f, an electrically conductive bump material is deposited over conductive layer 176 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above its melting point to form balls or bumps 180. In some applications, bumps 180 are reflowed a second time to improve electrical contact to conductive layer 176. Bumps 180 can also be compression bonded to conductive layer 176. Bumps 180 represent one type of interconnect structure that can be formed over conductive layer 176. The interconnect structure can also use stud bump, micro bump, pillar, or other electrical interconnect.

The insulating layers 170, 174, and 178, conductive layers 172 and 176, and bumps 180 constitute a build-up interconnect structure 182 formed over active surface 130 of semiconductor die 124, over conductive layer 132 and insulating layer 134, and over encapsulant 144. Build-up interconnect structure 182 is formed over reconstituted panel 143. In other words, semiconductor die 124 and build-up interconnect structure 182 represent an ECWLP in a reconstituted wafer or panel form. Build-up interconnect structure 182 exhibits advanced dielectric characteristics that improve manufacturing yield and package reliability. Insulating layers 170, 174, and 178 are configured for improved mechanical strength and chemical strength during and after the formation of build-up interconnect structure 182 for improved handling of reconstituted panel 143. Insulating layers 170, 174, and 178 form an insulating layer stack that exhibits high adhesion and strength as well as low CTE and shrinkage. For example, insulating layers 170 and 178 operate as outer layers of the insulating layer stack and have characteristics of higher strength, adhesion, and elongation relative to insulating layer 174. Insulating layer 174 operates as the inner layer of the insulating layer stack in build-up interconnect structure 182 and has characteristics of lower CTE and shrinkage relative to insulating layers 170 and 178. Thus, build-up interconnect structure 182 exhibits less warpage and also exhibits less damage under warpage conditions, thereby improving reliability of electrical interconnections.

In FIG. 5g, reconstituted panel 143 is singulated through build-up interconnect structure 182 and encapsulant 144 using a saw blade or laser cutting tool 183 into individual ECWLP packages 184 containing semiconductor die 124.

FIG. 6 shows ECWLP package 184 with semiconductor die 124 electrically connected to conductive layers 172 and 176 and bumps 180 for external interconnect to other semiconductor devices. Build-up interconnect structure 182 extends electrical interconnection outside a footprint of semiconductor die 124 and over encapsulant 144. In one embodiment, the different CTEs of insulating layers 170, 174, and 178 create a dielectric gradient across interconnect structure 182. The dielectric gradient reduces stress induced by insulating layers 170, 174, and 178 during temperature cycling.

Insulating layer 170 is patterned and cured for optimal adhesion to conductive layer 132 and insulating layer 134 of semiconductor die 124 and to encapsulant 144. The curing process for insulating layer 170 involves a multi-step dwell profile to enhance mechanical and adhesion properties to conductive layer 132, insulating layer 134, and encapsulant 144, without introducing surface wrinkle. Insulating layer 174 is patterned and cured for optimal adhesion to insulating layer 170 and conductive layer 172. Insulating layer 178 has a tensile strength ≥100 MPa, elongation ≥20%, and modulus ≤3.0 GPa under 25° C. Alternatively, insulating layer 170 has a tensile strength ≥100 MPa, elongation ≥20%, and modulus ≤3.0 GPa under 25° C. Insulating layer 178 has a dense structure after the multi-step dwell curing profile to block moisture in the PCT. Insulating layer 174 can have properties of either insulating layer 170 or insulating layer 178.

In another embodiment, insulating layer 178 has similar properties to insulating layer 170, and insulating layer 174 has properties different from insulating layers 170 and 178. For example, the CTE of insulating layer 170 is similar to the CTE of insulating layer 178, and the CTE of insulating layer 174 is different from the CTEs of insulating layers 170 and 178. The tensile strength, elongation, and elastic modulus are similar for insulating layers 170 and 178 and are different from the material properties of insulating layer 174. ECWLP package 184 can be further assembled or packaged under high temperatures processes such as bump reflow. For example, ECWLP package 184 is mounted to a substrate, interposer, PCB, wafer, or other semiconductor device. The advanced dielectric characteristics of ECWLP package 184 improve the thermal performance of ECWLP package 184 during subsequent packaging and assembly processes. For example, insulating layers 170, 174, and 178 are configured to reduce warpage of ECWLP package 184, particularly during high temperature processes. Insulating layers 170, 174, and 178 are further configured to improve the strength and adhesion of adjacent layers within build-up interconnect structure 182, thereby reducing delamination and joint failure. Therefore, build-up interconnect structure 182 improves the reliability of electrical connections within ECWLP package 184 as well as the reliability of electrical connections to other semiconductor devices.

Figure 7:
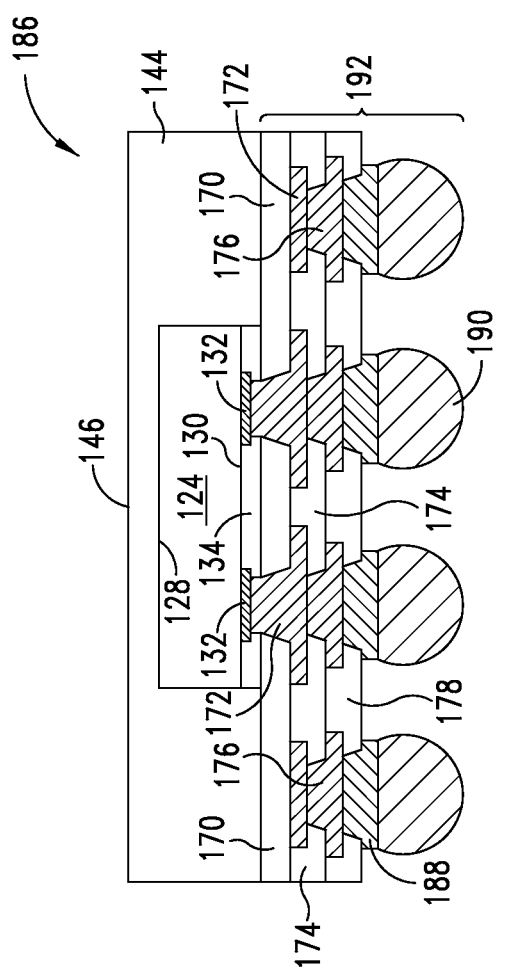
FIG. 7 illustrates shows an alternative ECWLP package including an under bump metallization (UBM) and insulating layers having advanced dielectric characteristics.

FIG. 7 shows an alternative semiconductor package 186, similar to ECWLP package 184, with an under bump metallization (UBM) layer. Semiconductor package 186 is formed by a process similar to the process of forming ECWLP package 184. Semiconductor die 124 is encapsulated with encapsulant 144, and insulating layer 170 is formed over active surface 130 of semiconductor die 124, over conductive layer 132 and insulating layer 134, and over encapsulant 144. Conductive layer 172 is formed over insulating layer 170 and electrically connected to conductive layer 132 of semiconductor die 124. Insulating layer 174 is formed over conductive layer 172 and insulating layer 170. Conductive layer 176 is formed over insulating layer 174 and conductive layer 172. Insulating layer 178 is formed over conductive layer 176 and insulating layer 174 with openings formed in insulating layer 174 over conductive layer 176 to expose a portion of conductive layer 176.

An electrically conductive layer 188 is formed over the exposed portion of conductive layer 176 and over insulating layer 178 after final repassivation using PVD, CVD, evaporation, electrolytic plating, electroless plating, or other suitable metal deposition process. Conductive layer 188 can be Al, Ti, TiW, Cu, Sn, Ni, Au, Ag, W, or other suitable electrically conductive material. Conductive layer 188 operates as a UBM layer electrically connected to conductive layer 176. UBM layer 188 can be a multi-metal stack with adhesion layer, barrier layer, and seed or wetting layer. The adhesion layer is formed over conductive layer 176 and can be titanium nitride (TiN), Ti, TiW, Al, or chromium (Cr). The barrier layer is formed over the adhesion layer and can be tantalum nitride (TaN), nickel vanadium (NiV), platinum (Pt), palladium (Pd), Ni, TiW, Ti, or chromium copper (CrCu). The barrier layer inhibits the diffusion of Cu into the active area of semiconductor die 124. The seed layer is formed over the barrier layer and can be Cu, Ni, NiV, Au, or Al. UBM layer 188 provides a low resistive interconnect to conductive layer 176, as well as a barrier to solder diffusion and seed layer for solder wettability.

An electrically conductive bump material is deposited over conductive layer 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 188 using a suitable attachment or bonding process. In one embodiment, the bump material is reflowed by heating the material above its melting point to form balls or bumps 190. In some applications, bumps 190 are reflowed a second time to improve electrical contact to conductive layer 188. Bumps 190 can also be compression bonded to conductive layer 188. Bumps 190 represent one type of interconnect structure that can be formed over conductive layer 188. The interconnect structure can also use stud bump, micro bump, pillar, or other electrical interconnect.

The insulating layers 170, 174, and 178, conductive layers 172 and 176, UBM layer 188, and bumps 190 constitute a build-up interconnect structure 192 formed over active surface 130 of semiconductor die 124, over conductive layer 132 and insulating layer 134, and over encapsulant 144. Build-up interconnect structure 192 with insulating layers 170, 174, and 178 exhibits advanced dielectric characteristics that improve manufacturing yield and package reliability. Insulating layers 170, 174, and 178 form an insulating layer stack that exhibits high adhesion and strength as well as low CTE and shrinkage. For example, insulating layers 170 and 178 operate as outer layers of the insulating layer stack and have characteristics of higher strength, adhesion, and elongation relative to insulating layer 174. Insulating layer 174 operates as the inner layer of the insulating layer stack in build-up interconnect structure 192 and has characteristics of lower CTE and shrinkage relative to insulating layers 170 and 178. Thus, build-up interconnect structure 192 exhibits less warpage and also exhibits less damage under warpage conditions, thereby improving reliability of electrical interconnections.

Semiconductor package 186 can be further assembled or packaged under high temperatures processes such as bump reflow. For example, semiconductor package 186 is mounted to a substrate, interposer, PCB, wafer, or other semiconductor device. The advanced dielectric characteristics of semiconductor package 186 improve the thermal performance of semiconductor package 186 during subsequent packaging and assembly processes. For example, insulating layers 170, 174, and 178 are configured to reduce warpage of semiconductor package 186, particularly during high temperature processes. Insulating layers 170, 174, and 178 are further configured to improve the strength and adhesion of adjacent layers within build-up interconnect structure 192, thereby reducing delamination and joint failure. Therefore, build-up interconnect structure 192 improves the reliability of electrical connections within semiconductor package 186 as well as the reliability of electrical connections to other semiconductor devices.

FIGS. 8a-8d illustrate, in relation to FIGS. 1, 2a-2c and 5a-5e, another process of forming an ECWLP or eWLB semiconductor package having a build-up interconnect structure with insulating layer configured for advanced mechanical and chemical strength and warpage control of the package.

Continuing from FIG. 5e, FIG. 8a shows an electrically conductive layer or RDL 200 formed over insulating layer 178 and conductive layer 176 using a patterning and metal deposition process such as sputtering, electrolytic plating, and electroless plating. Conductive layer 200 can be one or more layers of Al, Cu, Sn, Ni, Au, Ag, Ti, W, TiW, TiW/Cu, Ti/Cu, or other suitable electrically conductive material. One portion of conductive layer 200 is electrically connected to conductive layer 176 and to conductive layer 132 of semiconductor die 124. Other portions of conductive layer 200 can be electrically common or electrically isolated depending on the design and function of semiconductor die 124.

In FIG. 8b, an insulating or dielectric layer 202 is formed over insulating layer 178 and conductive layer 200 using PVD, CVD, lamination, screen printing, slit coating, spin coating, or spray coating. Insulating layer 202 contains one or more layers of low temperature (less than 250° C.) curing polymer dielectric materials, such as low temperature cure negative tone PI, negative tone polyisoprene, positive tone PBO, non-photosensitive polymer dielectric with or without filler, or other suitable dielectric material or material having similar insulating and structural properties. A portion of insulating layer 202 is removed by an etching process, an exposure or development process, for example UV exposure followed by wet chemical developing, or by LDA or laser via drilling to form openings 204 over conductive layer 200 and to expose conductive layer 200 with respect to insulating layer 202.

Insulating layer 202 is patterned and cured for optimal adhesion to insulating layer 178 and conductive layer 200. In one embodiment, the curing process for insulating layer 202 involves a multi-step dwell profile. Insulating layers 174, 178, and 200 may be cured sequentially or simultaneously. In one embodiment, insulating layer 174 is deposited and cured prior to forming insulating layer 178, and insulating layer 178 is deposited and cured prior to forming insulating layer 202.

In one embodiment, insulating layer 202 is the same material as insulating layer 170 or has similar material characteristics as insulating layer 170, while insulating layers 174 and 178 are different from insulating layers 170 and 202. For example, insulating layers 170 and 202 are selected having an approximate tensile strength of 130 MPa, maximum elongation of 50% at 25° C. and 40% at −55° C., and elastic modulus of 3.3 GPa. The CTEs for insulating layers 170 and 202 are approximately 65 ppm/° C. at α1 and 0.80% or 8,000 ppm/° C. at α2 (Tg=205° C.). In one embodiment, insulating layers 170 and 202 are selected to have different material properties from insulating layers 174 and 178. Insulating layer 178 is the same material as insulating layer 174 or has similar material characteristics as insulating layer 174. For example, insulating layers 174 and 178 are selected having an approximate tensile strength of 100 MPa, maximum elongation of 50% at 25° C. and 18% at −40° C., and elastic modulus of 2.0-2.2 GPa. The CTEs for insulating layers 174 and 178 are approximately 58 ppm/° C. at α1 and 620 ppm/° C. at α2 (Tg=207° C.). Insulating layers 170 and 202 are selected to have greater adhesion force, higher tensile strength and elastic modulus, greater elongation in a temperature range of −65° C. to 150° C., and a higher chemical resistance than insulating layers 174 and 178, while insulating layers 174 and 178 have a lower CTE and less shrinkage during curing than insulating layers 170 and 202. For example, insulating layers 174 and 178 exhibit approximately 12% shrinkage during curing, and insulating layers 170 and 202 exhibit approximately 31% shrinkage during curing. The force of adhesion between insulating layers 170 and 134 is greater than 400 N. The materials and structure of insulating layers 170, 174, 178, and 202 maximize the mechanical strength and chemical strength during handling and minimize warpage of the semiconductor package during subsequent packaging and assembly processes, particularly during high temperature processes.

In FIG. 8c, an electrically conductive layer 206 is optionally formed over the exposed portion of conductive layer 200 and over insulating layer 202 after final repassivation using PVD, CVD, evaporation, electrolytic plating, electroless plating, or other suitable metal deposition process. Conductive layer 206 can be Al, Ti, TiW, Cu, Sn, Ni, Au, Ag, W, or other suitable electrically conductive material. Conductive layer 206 operates as a UBM layer electrically connected to conductive layer 200. UBM layer 206 can be a multi-metal stack with adhesion layer, barrier layer, and seed or wetting layer. The adhesion layer is formed over conductive layer 200 and can be TiN, Ti, TiW, Al, or Cr. The barrier layer is formed over the adhesion layer and can be TaN, NiV, Pt, Pd, Ni, TiW, Ti, or CrCu. The barrier layer inhibits the diffusion of Cu into the active area of semiconductor die 124. The seed layer is formed over the barrier layer and can be Cu, Ni, NiV, Au, or Al. UBM layer 206 provides a low resistive interconnect to conductive layer 200, as well as a barrier to solder diffusion and seed layer for solder wettability.

An electrically conductive bump material is deposited over conductive layer 206 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 206 using a suitable attachment or bonding process. In one embodiment, the bump material is reflowed by heating the material above its melting point to form balls or bumps 208. In some applications, bumps 208 are reflowed a second time to improve electrical contact to conductive layer 206. Bumps 208 can also be compression bonded to conductive layer 206. Bumps 208 represent one type of interconnect structure that can be formed over conductive layer 206. The interconnect structure can also use stud bump, micro bump, pillar, or other electrical interconnect.

The insulating layers 170, 174, 178, and 202, conductive layers 172, 176, and 200, optional UBM layer 206, and bumps 208 constitute a build-up interconnect structure 210 formed over active surface 130 of semiconductor die 124, over conductive layer 132 and insulating layer 134, and over encapsulant 144. Build-up interconnect structure 210 is formed over reconstituted panel 143. Build-up interconnect structure 210 exhibits advanced dielectric characteristics that improve manufacturing yield and package reliability. For example, insulating layers 170, 174, 178, and 202 are configured for improved mechanical strength and chemical strength during and after the formation of build-up interconnect structure 210 for improved handling of reconstituted panel 143. Insulating layers 170, 174, 178, and 202 form an insulating layer stack that exhibits high adhesion and strength as well as low CTE and shrinkage. For example, insulating layers 170 and 202 operate as outer layers of the insulating layer stack and have characteristics of higher strength, adhesion, and elongation relative to insulating layers 174 and 178. Insulating layers 174 and 178 operate as inner layers of the insulating layer stack in build-up interconnect structure 210 and have characteristics of lower CTE and shrinkage relative to insulating layers 170 and 202. Thus, build-up interconnect structure 210 exhibits less warpage and also exhibits less damage under warpage conditions, thereby improving reliability of electrical interconnections.

In FIG. 8d, reconstituted panel 143 is singulated through build-up interconnect structure 210 and encapsulant 144 using a saw blade or laser cutting tool 212 into individual semiconductor packages 214 containing semiconductor die 124.

FIG. 9 shows a semiconductor package 214 with semiconductor die 124 electrically connected to conductive layers 172, 176, and 200, UBM layer 206, and bumps 208 for external interconnect to other semiconductor devices.

Semiconductor package 214 can be further assembled or packaged under high temperatures processes such as bump reflow. For example, semiconductor package 214 is mounted to a substrate, interposer, PCB, wafer, or other semiconductor device. The advanced dielectric characteristics of semiconductor package 214 improve the thermal performance of semiconductor package 214 during subsequent packaging and assembly processes. For example, insulating layers 170, 174, 178, and 202 are configured to reduce warpage of semiconductor package 214, particularly during high temperature processes. Insulating layers 170, 174, 178, and 202 are further configured to improve the strength and adhesion of adjacent layers within build-up interconnect structure 210, thereby reducing delamination and joint failure. Therefore, build-up interconnect structure 210 improves the reliability of electrical connections within semiconductor package 214 as well as the reliability of electrical connections to other semiconductor devices.

FIG. 10 shows an alternative semiconductor package 216, similar to semiconductor package 214, without a UBM layer. Semiconductor package 216 is formed by a process similar to the process of forming semiconductor package 214.

An electrically conductive bump material is deposited over conductive layer 200 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 200 using a suitable attachment or bonding process. In one embodiment, the bump material is reflowed by heating the material above its melting point to form balls or bumps 218. In some applications, bumps 218 are reflowed a second time to improve electrical contact to conductive layer 200. Bumps 218 can also be compression bonded to conductive layer 200. Bumps 218 represent one type of interconnect structure that can be formed over conductive layer 200. The interconnect structure can also use stud bump, micro bump, pillar, or other electrical interconnect.

The insulating layers 170, 174, 178, and 202, conductive layers 172, 176, and 200, and bumps 218 constitute a build-up interconnect structure 220 formed over active surface 130 of semiconductor die 124, over conductive layer 132 and insulating layer 134, and over encapsulant 144. Build-up interconnect structure 220 with insulating layers 170, 174, 178, and 202 exhibits advanced dielectric characteristics that improve manufacturing yield and package reliability. For example, insulating layers 170, 174, 178, and 202 are configured for maximum mechanical strength and chemical strength during and after the formation of build-up interconnect structure 220 for improved handling of reconstituted panel 143. Semiconductor package 216 can be further assembled or packaged, for example, semiconductor package 216 is mounted to a substrate, interposer, PCB, wafer, or other semiconductor device. The advanced dielectric characteristics of semiconductor package 216 improve the thermal performance of semiconductor package 216 during subsequent packaging and assembly processes. For example, insulating layers 170, 174, 178, and 202 are configured to reduce warpage and improve thermal performance of semiconductor package 216, particularly during high temperature processes, thereby improving the reliability of the package and final semiconductor device.

FIGS. 11a-11b illustrate, in relation to FIG. 1, a method of prefabricating modular interconnect units from a substrate panel. FIG. 11a shows a cross-sectional view of a portion of a substrate panel 230. Substrate panel 230 includes core substrate 232 having opposing surfaces 234 and 236. Core substrate 232 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, core substrate 232 may include one or more insulating or passivation layers.

A plurality of through vias is formed through core substrate 232 using laser drilling, mechanical drilling, deep reactive ion etching (DRIE), or other suitable process. The through vias extend completely through core substrate 232 from surface 234 to surface 236. The through vias are filled with Al, Cu, Sn, Ni, Au, Ag, Ti, W, or other suitable electrically conductive material or combination thereof using PVD, CVD, electrolytic plating, electroless plating process, or other suitable metal deposition process to form z-direction vertical interconnect structures or conductive vias 238. Alternatively, a conductive layer is formed over the sidewalls of the through vias using PVD, CVD, electrolytic plating, electroless plating process, or other suitable metal deposition process, and a center portion of the through vias is filled with a conductive filler material, e.g., Cu paste, or an insulating filler material, e.g., a polymer plug.

A conductive layer 240 is formed over surface 234 of core substrate 232 and over conductive vias 238 using PVD, CVD, electrolytic plating, electroless plating process, or other suitable metal deposition process. Conductive layer 240 includes one or more layers of Al, Cu, Sn, Ni, Au, Ag, or other suitable electrically conductive material or combination thereof. Portions of conductive layer 240 operate as contact pads and are electrically connected to conductive vias 238. Conductive layer 240 also includes portions that are electrically common or electrically isolated depending on the routing design and function of the semiconductor package. In another embodiment, conductive layer 240 operates as an RDL to extend electrical connection from conductive vias 238 to areas adjacent to conductive vias 238 to laterally redistribute electrical signals across substrate panel 230. Conductive layer 240 may be formed with traces or pads offset from conductive vias 238. In another embodiment, conductive layer 240 operates as a wire bondable pad or layer for subsequent electrical interconnection to conductive vias 238. A conductive layer similar to conductive layer 240 may be formed over surface 236 of core substrate 232 and over conductive vias 238. Alternatively, conductive vias 238 are formed through core substrate 232 after forming conductive layer 240. Substrate panel 230 may include additional conductive layers or insulating layers formed over surfaces 234 and 236 to provide additional electrical interconnect across the unit according to the design and functionality of the device.

In FIG. 11b, substrate panel 230 is singulated into individual modular interconnect structures or units 250 using saw blade or laser cutting tool 252. Modular interconnect units 250 are prefabricated from substrate panel 230 and are configured for integration into stacked semiconductor devices. Prefabricated modular interconnect units 250 provide a cost effective option for vertical interconnection in semiconductor packages.

Figure 12E:
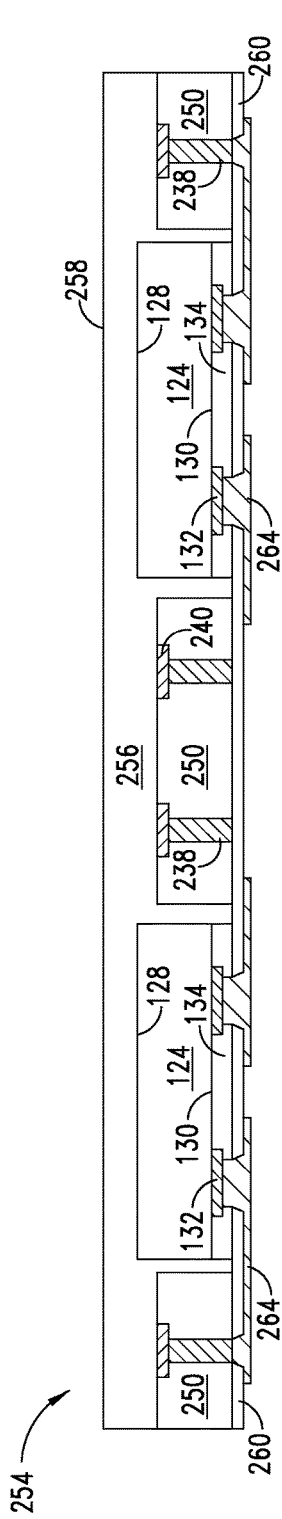

FIGS. 12a-12i illustrate, in relation to FIGS. 1, 2a-2c, 3a-3b, and 11a-11b, a method of forming a semiconductor device with an advanced build-up interconnect structure. Continuing from FIG. 3b, FIG. 12a shows semiconductor die 124 mounted to interface layer 142 and over carrier 140 as a reconstituted panel or reconfigured wafer 254.

Reconstituted panel 254 can be processed into many types of semiconductor packages, including eWLB, fan-in WLCSP, eWLCSP, fan-out WLCSP, flipchip packages, 3D packages, PoP, or other semiconductor packages. Reconstituted panel 254 is configured according to the specifications of the resulting semiconductor package. The distance between semiconductor die 124 and modular interconnect units 250 on carrier 140 is optimized for manufacturing the semiconductor packages at the lowest unit cost. The larger surface area of carrier 140 accommodates more semiconductor die 124 and lowers manufacturing cost as more semiconductor die 124 are processed per reconstituted panel 254. The number of semiconductor die 124 mounted to carrier 140 can be greater than the number of semiconductor die 124 singulated from semiconductor wafer 120. Carrier 140 and reconstituted panel 254 provide the flexibility to manufacture many different types of semiconductor packages using different size semiconductor die 124 from different sized semiconductor wafers 120.

Modular interconnect units 250 from FIG. 11b are mounted over carrier 140 adjacent to semiconductor die 124 using, for example, a pick and place operation with an optional adhesive. FIG. 12a shows modular interconnect units 250 disposed on interface layer 142 in a peripheral region of semiconductor die 124. Modular interconnect units 250 are disposed adjacent to one or more sides of semiconductor die 124. In one embodiment, modular interconnect units 250 are disposed along two, three, or four sides of each semiconductor die 124 on reconstituted panel 254. Modular interconnect units 250 contain multiple rows of conductive vias 238. Conductive layer 240 operates as contact pads or RDLs over conductive vias 238. Modular interconnect units 250 include square, rectangular, cross-shaped, angled or "L-shaped," or any geometrically-shaped footprint. Any number or configuration of modular interconnect units 250 are disposed adjacent to semiconductor die 124 depending on the routing design and function of the device.

In FIG. 12b, an encapsulant or molding compound 256 is deposited over semiconductor die 124, modular interconnect units 250, and carrier 140 using a paste printing, compressive molding, transfer molding, liquid encapsulant molding, vacuum lamination, spin coating, or other suitable applicator. Encapsulant 256 includes polymer composite material, such as epoxy resin with filler, epoxy acrylate with filler, or polymer with proper filler. Encapsulant 256 is non-conductive and environmentally protects the semiconductor device from external elements and contaminants. Encapsulant 256 includes a back surface 258 over back surface 128 of semiconductor die 124, and encapsulant 256 covers semiconductor die 124 and modular interconnect units 250.

In FIG. 12c, temporary carrier 140 and optional interface layer 142 are removed by chemical etching, mechanical peel-off, CMP, mechanical grinding, thermal bake, laser scanning, or wet stripping. The removal of temporary carrier 140 and interface layer 142 exposes surface 236 of modular interconnect units 250, exposes insulating layer 134 and conductive layer 132 over active surface 130 of semiconductor die 124, and exposes a portion of encapsulant 256.

In FIG. 12d, an insulating or dielectric layer 260 is formed over modular interconnect units 250, encapsulant 256, and active surface 130 of semiconductor die 124 using PVD, CVD, lamination, screen printing, slit coating, spin coating, or spray coating. Insulating layer 260 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 260 is removed by an etching process, an exposure or development process, for example UV exposure followed by wet chemical developing, or by LDA or laser via drilling to form openings 262 over conductive layer 132 and conductive vias 238 and to expose conductive layer 132 and conductive vias 238 with respect to insulating layer 260. In one embodiment, openings 262 are formed such that a portion of insulating layer 260 remains over and contacts conductive layer 132 and conductive vias 238.

Insulating layer 260 is patterned and cured for optimal adhesion to insulating layer 134 and conductive layer 132 on semiconductor die 124, and to encapsulant 256 and modular interconnect units 250. In one embodiment, the curing process for insulating layer 260 involves a multi-step dwell profile. In one embodiment, insulating layer 260 is selected having an approximate tensile strength of 130 MPa, maximum elongation of 50% at 25° C. and 40% at −55° C., and elastic modulus of 3.3 GPa. A CTE for insulating layer 260 is approximately 65 ppm/° C. at α1 and 0.80% or 8,000 ppm/° C. at α2 (Tg=205° C.).

In FIG. 12e, an electrically conductive layer or RDL 264 is formed over insulating layer 260 and within openings 262 over conductive layer 132 and conductive vias 238 using a patterning and metal deposition process such as sputtering, electrolytic plating, and electroless plating. Conductive layer 264 can be one or more layers of Al, Cu, Sn, Ni, Au, Ag, Ti, W, TiW, TiW/Cu, Ti/Cu, or other suitable electrically conductive material. One portion of conductive layer 264 is electrically connected to conductive layer 132 and conductive vias 238. Other portions of conductive layer 264 can be electrically common or electrically isolated depending on the design and function of semiconductor die 124.

Figure 12F:
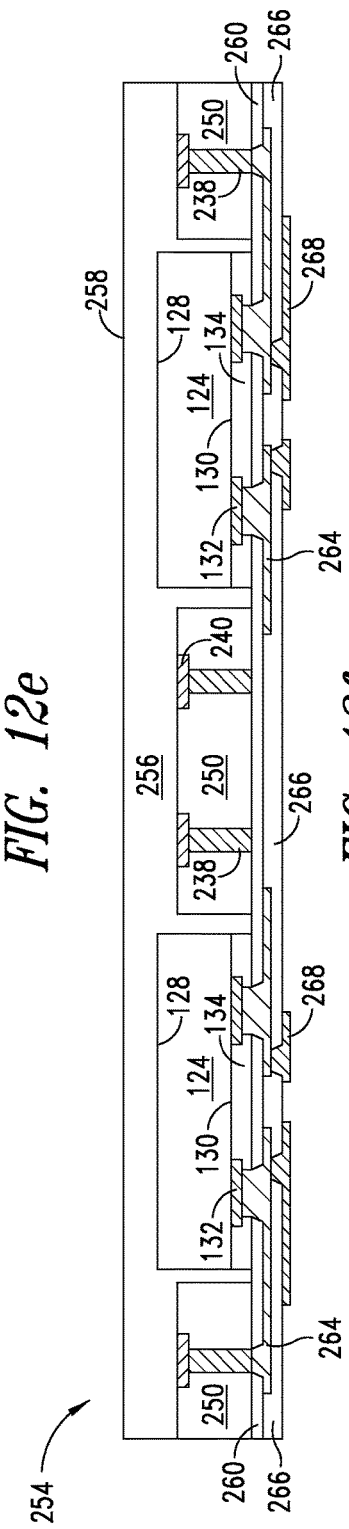

In FIG. 12f, an insulating or dielectric layer 266 is formed over insulating layer 260 and conductive layer 264 using PVD, CVD, lamination, screen printing, slit coating, spin coating, or spray coating. Insulating layer 266 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 266 is removed by an etching process, an exposure or development process, for example UV exposure followed by wet chemical developing, or by LDA or laser via drilling to form openings over conductive layer 264 and to expose conductive layer 264 with respect to insulating layer 266.

Insulating layer 266 is patterned and cured for optimal adhesion to insulating layer 260 and conductive layer 264. In one embodiment, the curing process for insulating layer 266 involves a multi-step dwell profile. Insulating layers 260 and 266 may be cured sequentially or simultaneously. In one embodiment, insulating layer 260 is deposited and cured prior to forming insulating layer 266. In one embodiment, insulating layer 266 has different material properties from insulating layer 260. For example, insulating layer 266 is selected having an approximate tensile strength of 100 MPa, maximum elongation of 50% at 25° C. and 18% at −40° C., and elastic modulus of 2.0-2.2 GPa. A CTE for insulating layer 266 is approximately 58 ppm/° C. at α1 and 620 ppm/° C. at α2 (Tg=207° C.). Insulating layer 266 is selected to have a lower CTE and less shrinkage during curing than insulating layer 260, while insulating layer 260 has greater adhesion force, tensile strength, density, elongation, elastic modulus, and chemical resistance than insulating layer 266.

An electrically conductive layer or RDL 268 is formed over insulating layer 266 and conductive layer 264 using a patterning and metal deposition process such as sputtering, electrolytic plating, and electroless plating. Conductive layer 268 can be one or more layers of Al, Cu, Sn, Ni, Au, Ag, Ti, W, TiW, TiW/Cu, Ti/Cu, or other suitable electrically conductive material. One portion of conductive layer 268 is electrically connected to conductive layer 264 and conductive vias 238 and to conductive layer 132 of semiconductor die 124. Other portions of conductive layer 268 can be electrically common or electrically isolated depending on the design and function of semiconductor die 124.

Figure 12G:
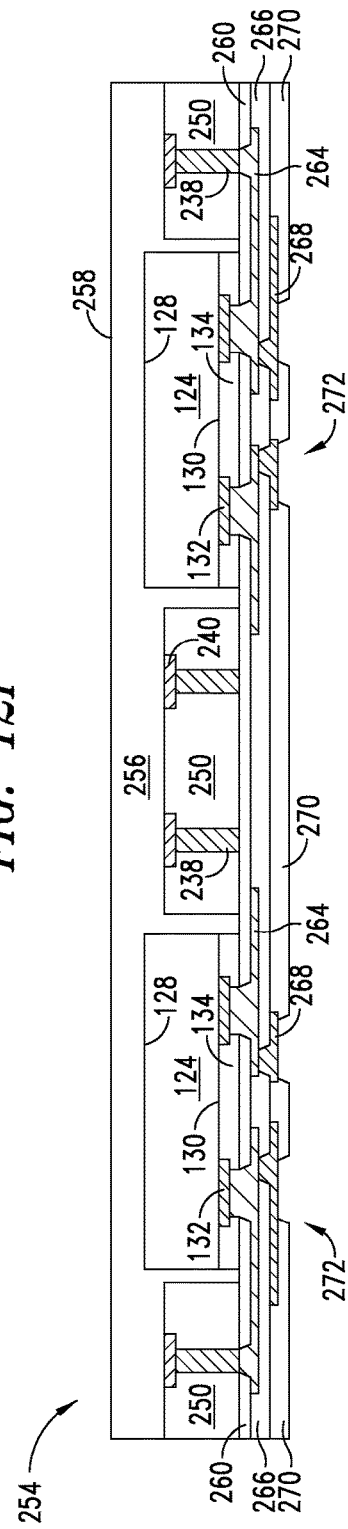

In FIG. 12g, an insulating or dielectric layer 270 is formed over insulating layer 266 and conductive layer 268 using PVD, CVD, lamination, screen printing, slit coating, spin coating, or spray coating. Insulating layer 270 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 270 is removed by an etching process, an exposure or development process, for example UV exposure followed by wet chemical developing, or by LDA or laser via drilling to form openings 272 over conductive layer 268 and to expose conductive layer 268 with respect to insulating layer 270.

Insulating layer 270 is patterned and cured for optimal adhesion to insulating layer 266 and conductive layer 268. In one embodiment, the curing process for insulating layer 270 involves a multi-step dwell profile. Insulating layers 266 and 270 may be cured sequentially or simultaneously. In one embodiment, insulating layer 266 is deposited and cured prior to forming insulating layer 270.

In one embodiment, insulating layer 270 is the same material as insulating layer 260 or has similar material characteristics as insulating layer 260 and has different material characteristics from insulating layer 266. Insulating layer 270 is selected having an approximate tensile strength of 130 MPa, maximum elongation of 50% at 25° C. and 40% at −55° C., and elastic modulus of 3.3 GPa. A CTE for insulating layer 270 is approximately 65 ppm/° C. at α1 and 0.80% or 8,000 ppm/° C. at α2 (Tg=205° C.). Insulating layers 260 and 270 are selected to have greater adhesion force, higher tensile strength and elastic modulus, greater elongation in a temperature range of −65° C. to 150° C., and a higher chemical resistance than insulating layer 266, while insulating layer 266 has a lower CTE and less shrinkage during curing than insulating layers 260 and 270. For example, insulating layer 266 exhibits approximately 12% shrinkage during curing, and insulating layers 260 and 270 exhibit approximately 31% shrinkage during curing. The force of adhesion between insulating layers 260 and 134 is greater than 400 N. The materials and structure of insulating layers 260, 266, and 270 maximize the mechanical strength and chemical strength during handling and minimize warpage of the semiconductor package during subsequent packaging and assembly processes, particularly during high temperature processes.

In FIG. 12h, an electrically conductive layer 274 is optionally formed over the exposed portion of conductive layer 268 and over insulating layer 270 after final repassivation using PVD, CVD, evaporation, electrolytic plating, electroless plating, or other suitable metal deposition process. Conductive layer 274 can be Al, Ti, TiW, Cu, Sn, Ni, Au, Ag, W, or other suitable electrically conductive material. Conductive layer 274 operates as a UBM layer electrically connected to conductive layer 268. UBM layer 274 can be a multi-metal stack with adhesion layer, barrier layer, and seed or wetting layer. The adhesion layer is formed over conductive layer 268 and can be TiN, Ti, TiW, Al, or Cr. The barrier layer is formed over the adhesion layer and can be TaN, NiV, Pt, Pd, Ni, TiW, Ti, or CrCu. The barrier layer inhibits the diffusion of Cu into the active area of semiconductor die 124. The seed layer is formed over the barrier layer and can be Cu, Ni, NiV, Au, or Al. UBM layer 274 provides a low resistive interconnect to conductive layer 268, as well as a barrier to solder diffusion and seed layer for solder wettability.

An electrically conductive bump material is deposited over optional UBM layer 274 or directly over conductive layer 268 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM layer 274 or conductive layer 268 using a suitable attachment or bonding process. In one embodiment, the bump material is reflowed by heating the material above its melting point to form balls or bumps 276. In some applications, bumps 276 are reflowed a second time to improve electrical contact to UBM layer 274 or conductive layer 268. Bumps 276 can also be compression bonded to UBM layer 274 or conductive layer 268. Bumps 276 represent one type of interconnect structure that can be formed over UBM layer 274 or conductive layer 268. The interconnect structure can also use stud bump, micro bump, pillar, or other electrical interconnect.

The insulating layers 260, 266, and 270, conductive layers 264 and 268, optional UBM layer 274, and bumps 276 constitute a build-up interconnect structure 280 formed over active surface 130 of semiconductor die 124, over encapsulant 256, and over modular interconnect units 250. Build-up interconnect structure 280 is formed over reconstituted panel 254. Build-up interconnect structure 280 exhibits advanced dielectric characteristics that improve manufacturing yield and package reliability. Insulating layers 260, 266, and 270 are configured for improved mechanical strength and chemical strength during and after the formation of build-up interconnect structure 280 for improved handling of reconstituted panel 254. Insulating layers 260, 266, and 270 form an insulating layer stack that exhibits high adhesion and strength as well as low CTE and shrinkage. For example, insulating layers 260 and 270 operate as outer layers of the insulating layer stack and have characteristics of higher strength, adhesion, and elongation relative to insulating layer 266. Insulating layer 266 operates as the inner layer of the insulating layer stack in build-up interconnect structure 280 and has characteristics of lower CTE and shrinkage relative to insulating layers 260 and 270. Thus, build-up interconnect structure 280 exhibits less warpage and also exhibits less damage under warpage conditions, thereby improving reliability of electrical interconnections.

A portion of back surface 258 of encapsulant 256 is removed by grinder 282 in an optional backgrinding operation to planarize the encapsulant and expose modular interconnect units 250 and back surface 128 of semiconductor die 124. In one embodiment, the backgrinding operation removes a portion of the semiconductor die 124 to leave a new back surface. The optional backgrinding operation reduces the package profile. A chemical etch or CMP process can also be used to planarize encapsulant 256 and to remove mechanical damage resulting from the grinding operation. The removal of a portion of encapsulant 256 leaves a back surface of encapsulant 256 coplanar with modular interconnect units 250 and back surface 128 of semiconductor die 124.

In FIG. 12i, an electrically conductive bump material is deposited over conductive layer 240 of modular interconnect units 250 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 240 using a suitable attachment or bonding process. In one embodiment, the bump material is reflowed by heating the material above its melting point to form spherical balls or bumps 286. In some applications, bumps 286 are reflowed a second time to improve electrical contact to conductive layer 240. The bumps can also be compression bonded to conductive layer 240. Bumps 286 represent one type of interconnect structure that is formed over conductive layer 240. The interconnect structure can also use bond wires, stud bump, micro bump, or other electrical interconnect. Bumps 286 or other interconnect structures are optional, and in one embodiment, are formed after singulation of reconstituted panel 254.

Reconstituted panel 254 is singulated with saw blade or laser cutting device 288 through modular interconnect units 250 and interconnect structure 280 into individual semiconductor devices 290 and 292.

FIG. 13 shows a semiconductor package 290 with semiconductor die 124 electrically connected to conductive layers 264 and 268, UBM layer 274, and bumps 276 and to conductive vias 238, conductive layer 240, and bumps 286 of modular interconnect units 250 for external interconnect to other semiconductor devices. Build-up interconnect structure 280 extends electrical interconnection outside a footprint of semiconductor die 124 and over encapsulant 256 to modular interconnect units 250. Semiconductor package 290 can be further assembled or packaged, for example, semiconductor package 290 is mounted to a substrate, interposer, PCB, wafer, or other semiconductor device. The advanced dielectric characteristics of semiconductor package 290 improve the thermal performance of semiconductor package 290 during subsequent packaging and assembly processes. For example, insulating layers 260, 266, and 270 are configured to reduce warpage of semiconductor package 290, particularly during high temperature processes. Insulating layers 260, 266, and 270 are further configured to improve the strength and adhesion of adjacent layers within build-up interconnect structure 280, thereby reducing delamination and joint failure. Therefore, build-up interconnect structure 280 improves the reliability of electrical connections within semiconductor package 290 as well as the reliability of electrical connections to other semiconductor devices.

FIG. 14 shows an alternative semiconductor package 292, similar to semiconductor package 290, without a UBM layer. Semiconductor package 292 includes semiconductor die 124 electrically connected to conductive layers 264 and 268 and bumps 276 and to conductive vias 238, conductive layer 240, and bumps 286 of modular interconnect units 250 for external interconnect to other semiconductor devices. The advanced dielectric characteristics of build-up interconnect structure 280 of semiconductor package 292 improve the thermal performance of semiconductor package 292 during packaging and assembly processes, particularly during high temperature processes, thereby improving the reliability of the package and final semiconductor device.

FIGS. 15a-15e illustrate, in relation to FIGS. 1, 2a-2c, 3a-3b, and 11a-11b, a method of forming a semiconductor device with an advanced build-up interconnect structure. Continuing from FIG. 12f, FIG. 15a shows reconstituted panel 254 including semiconductor die 124 and modular interconnect units 250 encapsulated with encapsulant 256. Insulating layer 260 is formed over insulating layer 134 and conductive layer 132 of semiconductor die 124, over encapsulant 256, and over modular interconnect units 250. Conductive layer 264 is formed over insulating layer 260 and electrically connected to conductive layer 132. Insulating layer 266 is formed over insulating layer 260 and conductive layer 264. Conductive layer 268 is formed over insulating layer 264 and electrically connected to conductive layer 132.

In FIG. 15b, an insulating or dielectric layer 300 is formed over insulating layer 266 and conductive layer 268 using PVD, CVD, lamination, screen printing, slit coating, spin coating, or spray coating. Insulating layer 300 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 300 is removed by an etching process, an exposure or development process, for example UV exposure followed by wet chemical developing, or by LDA or laser via drilling to form openings over conductive layer 268 and to expose conductive layer 268 with respect to insulating layer 300.

Insulating layer 300 is patterned and cured for optimal adhesion to insulating layer 266 and conductive layer 268. In one embodiment, the curing process for insulating layer 300 involves a multi-step dwell profile. Insulating layers 266 and 300 may be cured sequentially or simultaneously. In one embodiment, insulating layer 266 is deposited and cured prior to forming insulating layer 300.

In one embodiment, insulating layer 300 is the same material as insulating layer 266 or has similar material characteristics as insulating layer 266 and has different material characteristics from insulating layer 260. For example, insulating layer 300 is selected having an approximate tensile strength of 100 MPa, maximum elongation of 50% at 25° C. and 18% at −40° C., and elastic modulus of 2.0-2.2 GPa. A CTE for insulating layer 300 is approximately 58 ppm/° C. at α1 and 620 ppm/° C. at α2 (Tg=207° C.). Insulating layer 300 is selected to have a lower CTE and less shrinkage during curing than insulating layer 260, while insulating layer 260 has greater adhesion force, tensile strength, density, elongation, elastic modulus, and chemical resistance than insulating layer 300.

An electrically conductive layer or RDL 302 is formed over insulating layer 300 and conductive layer 268 using a patterning and metal deposition process such as sputtering, electrolytic plating, and electroless plating. Conductive layer 302 can be one or more layers of Al, Cu, Sn, Ni, Au, Ag, Ti, W, TiW, TiW/Cu, Ti/Cu, or other suitable electrically conductive material. One portion of conductive layer 302 is electrically connected to conductive layer 268 and to conductive layer 132 of semiconductor die 124. Other portions of conductive layer 302 can be electrically common or electrically isolated depending on the design and function of semiconductor die 124.

In FIG. 15c, an insulating or dielectric layer 304 is formed over insulating layer 300 and conductive layer 302 using PVD, CVD, lamination, screen printing, slit coating, spin coating, or spray coating. Insulating layer 304 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 304 is removed by an etching process, an exposure or development process, for example UV exposure followed by wet chemical developing, or by LDA or laser via drilling to form openings 306 over conductive layer 302 and to expose conductive layer 302 with respect to insulating layer 304.

Insulating layer 304 is patterned and cured for optimal adhesion to insulating layer 300 and conductive layer 302. In one embodiment, the curing process for insulating layer 304 involves a multi-step dwell profile. Insulating layers 300 and 304 may be cured sequentially or simultaneously. In one embodiment, insulating layer 300 is deposited and cured prior to forming insulating layer 304.

In one embodiment, insulating layer 304 is the same material as insulating layer 260 or has similar material characteristics as insulating layer 260 and has different material characteristics from insulating layers 266 and 300. For example, insulating layer 304 is selected having an approximate tensile strength of 130 MPa, maximum elongation of 50% at 25° C. and 40% at −55° C., and elastic modulus of 3.3 GPa. A CTE for insulating layer 304 is approximately 65 ppm/° C. at α1 and 0.80% or 8,000 ppm/° C. at α2 (Tg=205° C.). Insulating layers 260 and 304 are selected to have greater adhesion force, higher tensile strength and elastic modulus, greater elongation in a temperature range of −65° C. to 150° C., and a higher chemical resistance than insulating layers 266 and 300, while insulating layers 266 and 300 have a lower CTE and less shrinkage during curing than insulating layers 260 and 304. For example, insulating layers 266 and 300 exhibit approximately 12% shrinkage during curing, and insulating layers 260 and 304 exhibit approximately 31% shrinkage during curing. The force of adhesion between insulating layers 260 and 134 is greater than 400 N. The materials and structure of insulating layers 260, 266, 300, and 304 maximize the mechanical strength and chemical strength during handling and minimize warpage of the semiconductor package during subsequent packaging and assembly processes, particularly during high temperature processes.

In FIG. 15d, an electrically conductive layer 308 is optionally formed over the exposed portion of conductive layer 302 within openings 306 and over insulating layer 304 after final repassivation using PVD, CVD, evaporation, electrolytic plating, electroless plating, or other suitable metal deposition process. Conductive layer 308 can be Al, Ti, TiW, Cu, Sn, Ni, Au, Ag, W, or other suitable electrically conductive material. Conductive layer 308 operates as a UBM layer electrically connected to conductive layer 302. UBM layer 308 can be a multi-metal stack with adhesion layer, barrier layer, and seed or wetting layer. The adhesion layer is formed over conductive layer 302 and can be TiN, Ti, TiW, Al, or Cr. The barrier layer is formed over the adhesion layer and can be TaN, NiV, Pt, Pd, Ni, TiW, Ti, or CrCu. The barrier layer inhibits the diffusion of Cu into the active area of semiconductor die 124. The seed layer is formed over the barrier layer and can be Cu, Ni, NiV, Au, or Al. UBM layer 308 provides a low resistive interconnect to conductive layer 302, as well as a barrier to solder diffusion and seed layer for solder wettability.

An electrically conductive bump material is deposited over optional UBM layer 308 or directly over conductive layer 302 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM layer 308 or conductive layer 302 using a suitable attachment or bonding process. In one embodiment, the bump material is reflowed by heating the material above its melting point to form balls or bumps 310. In some applications, bumps 310 are reflowed a second time to improve electrical contact to UBM layer 308 or conductive layer 302. Bumps 310 can also be compression bonded to UBM layer 308 or conductive layer 302. Bumps 310 represent one type of interconnect structure that can be formed over UBM layer 308 or conductive layer 302. The interconnect structure can also use stud bump, micro bump, pillar, or other electrical interconnect.

The insulating layers 260, 266, 300, and 304, conductive layers 264, 268, and 302, optional UBM layer 308, and bumps 310 constitute a build-up interconnect structure 312 formed over reconstituted panel 254, in particular, over active surface 130 of semiconductor die 124, over encapsulant 256, and over modular interconnect units 250. Thus, build-up interconnect structure 312 is formed over reconstituted panel 254. Build-up interconnect structure 312 exhibits advanced dielectric characteristics that improve manufacturing yield and package reliability. For example, insulating layers 260, 266, 300, and 304 are configured for improved mechanical strength and chemical strength during and after the formation of build-up interconnect structure 312 for improved handling of reconstituted panel 143. Insulating layers 260, 266, 300, and 304 form an insulating layer stack that exhibits high adhesion and strength as well as low CTE and shrinkage. For example, insulating layers 260 and 304 operate as outer layers of the insulating layer stack and have characteristics of higher strength, adhesion, and elongation relative to insulating layers 266 and 300. Insulating layers 266 and 300 operate as inner layers of the insulating layer stack in build-up interconnect structure 312 and have characteristics of lower CTE and shrinkage relative to insulating layers 260 and 304. Thus, build-up interconnect structure 312 exhibits less warpage and also exhibits less damage under warpage conditions, thereby improving reliability of electrical interconnections.

A portion of back surface 258 of encapsulant 256 is removed by grinder 314 in an optional backgrinding operation to planarize the encapsulant and expose modular interconnect units 250 and semiconductor die 124. In one embodiment, the backgrinding operation removes a portion of the semiconductor die 124 to leave a new back surface 315. The optional backgrinding operation reduces the package profile. A chemical etch or CMP process can also be used to planarize encapsulant 256 and to remove mechanical damage resulting from the grinding operation. The removal of a portion of encapsulant 256 leaves a back surface of encapsulant 256 coplanar with modular interconnect units 250 and back surface 128 of semiconductor die 124.

In FIG. 15e, an electrically conductive bump material is deposited over modular interconnect units 250 and electrically connected to conductive layer 240 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 240 using a suitable attachment or bonding process. In one embodiment, the bump material is reflowed by heating the material above its melting point to form spherical balls or bumps 316. In some applications, bumps 316 are reflowed a second time to improve electrical contact to conductive layer 240. The bumps can also be compression bonded to conductive layer 240. Bumps 316 represent one type of interconnect structure that is formed over conductive layer 240. The interconnect structure can also use bond wires, stud bump, micro bump, or other electrical interconnect. Bumps 316 or other interconnect structures are optional, and in one embodiment, are formed after singulation of reconstituted panel 254.

Reconstituted panel 254 is singulated with saw blade or laser cutting device 318 through modular interconnect units 250 and interconnect structure 312 into individual semiconductor devices 320 and 322.

Figure 16:
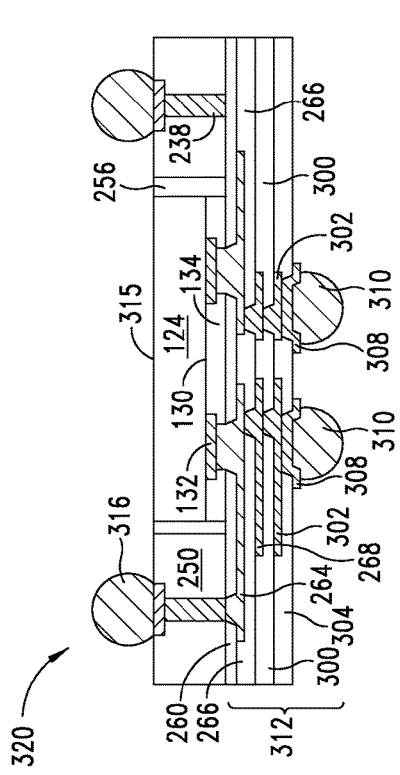
FIG. 16 illustrates a semiconductor device including modular interconnect units and a build-up interconnect structure.

FIG. 16 shows a semiconductor package 320 with semiconductor die 124 electrically connected to conductive layers 264, 268, and 302, UBM layer 308, and bumps 310 and to conductive vias 238, conductive layer 240, and bumps 316 of modular interconnect units 250 for external interconnect to other semiconductor devices. Build-up interconnect structure 312 extends electrical interconnection outside a footprint of semiconductor die 124 and over encapsulant 256 to modular interconnect units 250. Semiconductor package 320 can be further assembled or packaged, for example, semiconductor package 320 is mounted to a substrate, interposer, PCB, wafer, or other semiconductor device. The advanced dielectric characteristics of semiconductor package 320 improve the thermal performance of semiconductor package 320 during subsequent packaging and assembly processes. For example, insulating layers 260, 266, 300, and 304 are configured to reduce warpage of semiconductor package 320, particularly during high temperature processes. Insulating layers 260, 266, 300, and 304 are further configured to improve the strength and adhesion of adjacent layers within build-up interconnect structure 312, thereby reducing delamination and joint failure. Therefore, build-up interconnect structure 312 improves the reliability of electrical connections within semiconductor package 320 as well as the reliability of electrical connections to other semiconductor devices.

Figure 17:
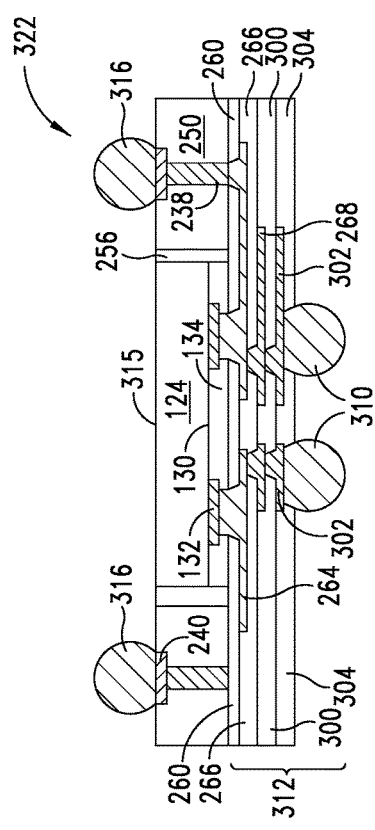
FIG. 17 illustrates an alternative semiconductor device including a build-up interconnect structure.

FIG. 17 shows an alternative semiconductor package 322, similar to semiconductor package 320, without a UBM layer. Semiconductor package 322 includes semiconductor die 124 electrically connected to conductive layers 264, 268, and 302, and bumps 310 and to conductive vias 238, conductive layer 240, and bumps 316 of modular interconnect units 250 for external interconnect to other semiconductor devices. The advanced dielectric characteristics of build-up interconnect structure 312 of semiconductor package 322 improve the thermal performance of semiconductor package 322 during packaging and assembly processes, particularly during high temperature processes, thereby improving the reliability of the package and final semiconductor device.

FIGS. 18a-18e illustrate, in relation to FIGS. 1 and 2a-2b, a method of forming a semiconductor device with an advanced build-up interconnect structure. FIG. 18a shows semiconductor wafer 120 from FIGS. 2a-2b including a plurality of semiconductor die or components 124 is formed on wafer 120 separated by a non-active, inter-die wafer area or saw street 126. In one embodiment, semiconductor die 124 has a back or non-active surface 128 and active surface 130 with active surface 130 containing analog or digital circuits implemented as active devices, passive devices, conductive layers, and dielectric layers formed within the die and electrically interconnected according to the electrical design and function of the die. In another embodiment, semiconductor wafer 120 includes a base substrate material 122 without active semiconductor die or components 124. Conductive layer 132 is formed over active surface 130 of semiconductor die 124. Insulating layer 134 is formed over active surface 130 and conductive layer 132. A portion of insulating layer 134 is removed to expose conductive layer 132 with respect to insulating layer 134.

In FIG. 18b, an insulating or dielectric layer 330 is formed over semiconductor wafer 120 using PVD, CVD, lamination, screen printing, slit coating, spin coating, or spray coating. Insulating layer 330 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. Insulating layer 330 is formed over active surface 130 of semiconductor die 124 and contacts insulating layer 134 and conductive layer 132. A portion of insulating layer 330 is removed by an etching process, an exposure or development process, for example UV exposure followed by wet chemical developing, or by LDA or laser via drilling to form openings over conductive layer 132 and to expose conductive layer 132 with respect to insulating layer 330.

Insulating layer 330 is patterned and cured for optimal adhesion to insulating layer 134 and conductive layer 132 on semiconductor wafer 120. In one embodiment, the curing process for insulating layer 330 involves a multi-step dwell profile. In one embodiment, insulating layer 330 is selected having an approximate tensile strength of 130 MPa, maximum elongation of 50% at 25° C. and 40% at −55° C., and elastic modulus of 3.3 GPa. A CTE for insulating layer 330 is approximately 65 ppm/° C. at α1 and 0.80% or 8,000 ppm/° C. at α2 (Tg=205° C.).

An electrically conductive layer or RDL 332 is formed over insulating layer 330 and conductive layer 132 using a patterning and metal deposition process such as sputtering, electrolytic plating, and electroless plating. Conductive layer 332 can be one or more layers of Al, Cu, Sn, Ni, Au, Ag, Ti, W, TiW, TiW/Cu, Ti/Cu, or other suitable electrically conductive material. One portion of conductive layer 332 is electrically connected to conductive layer 132. Other portions of conductive layer 332 can be electrically common or electrically isolated depending on the design and function of semiconductor die 124.

In FIG. 18c, an insulating or dielectric layer 334 is formed over insulating layer 330 and conductive layer 332 using PVD, CVD, lamination, screen printing, slit coating, spin coating, or spray coating. Insulating layer 334 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 334 is removed by an etching process, an exposure or development process, for example UV exposure followed by wet chemical developing, or by LDA or laser via drilling to form openings over conductive layer 332 and to expose conductive layer 332 with respect to insulating layer 334.

Insulating layer 334 is patterned and cured for optimal adhesion to insulating layer 330 and conductive layer 332. In one embodiment, the curing process for insulating layer 334 involves a multi-step dwell profile. Insulating layers 330 and 334 may be cured sequentially or simultaneously. In one embodiment, insulating layer 330 is deposited and cured prior to forming insulating layer 334. In one embodiment, insulating layer 334 has different material properties from insulating layer 330. For example, insulating layer 334 is selected having an approximate tensile strength of 100 MPa, maximum elongation of 50% at 25° C. and 18% at −40° C., and elastic modulus of 2.0-2.2 GPa. A CTE for insulating layer 334 is approximately 58 ppm/° C. at α1 and 620 ppm/° C. at α2 (Tg=207° C.). Insulating layer 334 is selected to have a lower CTE and less shrinkage during curing than insulating layer 330, while insulating layer 330 has greater adhesion force, tensile strength, density, elongation, elastic modulus, and chemical resistance than insulating layer 334.

An electrically conductive layer or RDL 336 is formed over insulating layer 334 and conductive layer 332 using a patterning and metal deposition process such as sputtering, electrolytic plating, and electroless plating. Conductive layer 336 can be one or more layers of Al, Cu, Sn, Ni, Au, Ag, Ti, W, TiW, TiW/Cu, Ti/Cu, or other suitable electrically conductive material. One portion of conductive layer 336 is electrically connected to conductive layer 332 and to conductive layer 132 of semiconductor die 124. Other portions of conductive layer 336 can be electrically common or electrically isolated depending on the design and function of semiconductor die 124.

In FIG. 18d, an insulating or dielectric layer 338 is formed over insulating layer 334 and conductive layer 336 using PVD, CVD, lamination, screen printing, slit coating, spin coating, or spray coating. Insulating layer 338 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 338 is removed by an etching process, an exposure or development process, for example UV exposure followed by wet chemical developing, or by LDA or laser via drilling to form openings 340 over conductive layer 336 and to expose conductive layer 336 with respect to insulating layer 338.

Insulating layer 338 is patterned and cured for optimal adhesion to insulating layer 334 and conductive layer 336. In one embodiment, the curing process for insulating layer 338 involves a multi-step dwell profile. Insulating layers 334 and 338 may be cured sequentially or simultaneously. In one embodiment, insulating layer 334 is deposited and cured prior to forming insulating layer 338.

In one embodiment, insulating layer 338 is the same material as insulating layer 330 or has similar material characteristics as insulating layer 330 and has different material characteristics from insulating layer 334. For example, insulating layer 338 is selected having an approximate tensile strength of 130 MPa, maximum elongation of 50% at 25° C. and 40% at −55° C., and elastic modulus of 3.3 GPa. A CTE for insulating layer 338 is approximately 65 ppm/° C. at α1 and 0.80% or 8,000 ppm/° C. at α2 (Tg=205° C.). Insulating layers 330 and 338 are selected to have greater adhesion force, higher tensile strength and elastic modulus, greater elongation in a temperature range of −65° C. to 150° C., and a higher chemical resistance than insulating layer 334, while insulating layer 334 has a lower CTE and less shrinkage during curing than insulating layers 330 and 338. For example, insulating layer 334 exhibits approximately 12% shrinkage during curing, and insulating layers 330 and 338 exhibit approximately 31% shrinkage during curing. The force of adhesion between insulating layers 330 and 134 is greater than 400 N. The materials and structure of insulating layers 330, 334, and 338 maximize the mechanical strength and chemical strength during handling and minimize warpage of the semiconductor package during subsequent packaging and assembly processes, particularly during high temperature processes.

In FIG. 18e, an electrically conductive layer 342 is optionally formed over the exposed portion of conductive layer 336 and over insulating layer 338 after final repassivation using PVD, CVD, evaporation, electrolytic plating, electroless plating, or other suitable metal deposition process. Conductive layer 342 can be Al, Ti, TiW, Cu, Sn, Ni, Au, Ag, W, or other suitable electrically conductive material. Conductive layer 342 operates as a UBM layer electrically connected to conductive layer 336. UBM layer 342 can be a multi-metal stack with adhesion layer, barrier layer, and seed or wetting layer. The adhesion layer is formed over conductive layer 336 and can be TiN, Ti, TiW, Al, or Cr. The barrier layer is formed over the adhesion layer and can be TaN, NiV, Pt, Pd, Ni, TiW, Ti, or CrCu. The barrier layer inhibits the diffusion of Cu into the active area of semiconductor die 124. The seed layer is formed over the barrier layer and can be Cu, Ni, NiV, Au, or Al. UBM layer 342 provides a low resistive interconnect to conductive layer 336, as well as a barrier to solder diffusion and seed layer for solder wettability.

An electrically conductive bump material is deposited over optional UBM layer 342 or directly over conductive layer 336 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM layer 342 or conductive layer 336 using a suitable attachment or bonding process. In one embodiment, the bump material is reflowed by heating the material above its melting point to form balls or bumps 344. In some applications, bumps 344 are reflowed a second time to improve electrical contact to UBM layer 342 or conductive layer 336. Bumps 344 can also be compression bonded to UBM layer 342 or conductive layer 336. Bumps 344 represent one type of interconnect structure that can be formed over UBM layer 342 or conductive layer 336. The interconnect structure can also use stud bump, micro bump, pillar, or other electrical interconnect.

The insulating layers 330, 334, and 338, conductive layers 332 and 336, optional UBM layer 342, and bumps 344 constitute a build-up interconnect structure 350 formed over active surface 130 of semiconductor die 124 while at the wafer level. Build-up interconnect structure 350 is formed over semiconductor wafer 120. Build-up interconnect structure 350 exhibits advanced dielectric characteristics that improve manufacturing yield and package reliability. Insulating layers 330, 334, and 338 are configured for improved mechanical strength and chemical strength during and after the formation of build-up interconnect structure 350 for improved handling of semiconductor wafer 120. Insulating layers 330, 334, and 338 form an insulating layer stack that exhibits high adhesion and strength as well as low CTE and shrinkage. For example, insulating layers 330 and 338 operate as outer layers of the insulating layer stack and have characteristics of higher strength, adhesion, and elongation relative to insulating layer 334. Insulating layer 334 operates as the inner layer of the insulating layer stack in build-up interconnect structure 350 and has characteristics of lower CTE and shrinkage relative to insulating layers 330 and 338. Thus, build-up interconnect structure 350 exhibits less warpage and also exhibits less damage under warpage conditions, thereby improving reliability of electrical interconnections.

Semiconductor wafer 120 is singulated with saw blade or laser cutting device 352 through saw streets 126 and build-up interconnect structure 350 into individual semiconductor die 124.

FIG. 19 shows semiconductor die 124 electrically connected to conductive layers 332, 336, and bumps 344 for external interconnect to other semiconductor devices. Semiconductor die 124 optionally includes a UBM layer 342 formed under bumps 344. Semiconductor die 124 can be further assembled or packaged, for example, semiconductor die 124 is mounted to a substrate, interposer, PCB, wafer, or other semiconductor device. The advanced dielectric characteristics of build-up interconnect structure 350 improve the thermal performance of semiconductor die 124 during subsequent packaging and assembly processes. For example, insulating layers 330, 334, and 338 are configured to reduce warpage of the device, particularly during high temperature processes. Insulating layers 330, 334, and 338 are further configured to improve the strength and adhesion of adjacent layers within build-up interconnect structure 350, thereby reducing delamination and joint failure. Therefore, build-up interconnect structure 350 improves the reliability of electrical connections within semiconductor die 124 as well as the reliability of electrical connections to other semiconductor devices.

Figure 20A:
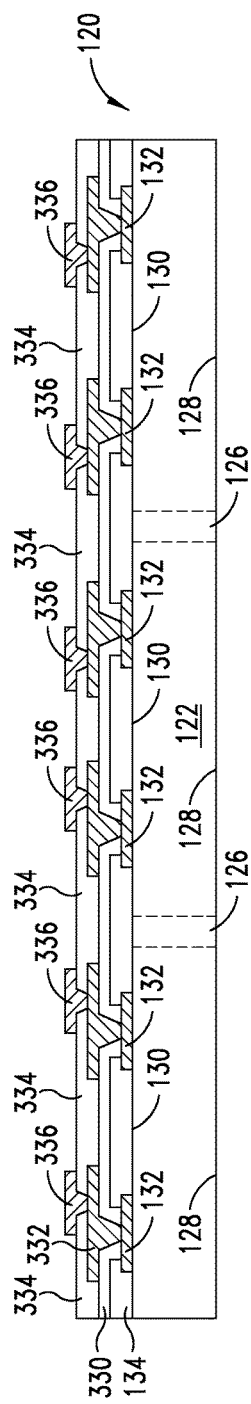
FIGS. 20a-20d illustrate another method of forming a semiconductor wafer with a build-up interconnect structure.

FIGS. 20a-20d illustrates, in relation to FIGS. 1 and 2a-2b, a method of forming a semiconductor device with an advanced build-up interconnect structure. Continuing from FIG. 18c, FIG. 20a shows semiconductor wafer 120 including semiconductor die 124 separated by saw street 126. Insulating layer 330 is formed over insulating layer 134 and conductive layer 132 of semiconductor die 124. Conductive layer 332 is formed over insulating layer 334 and electrically connected to conductive layer 132. Insulating layer 334 is formed over insulating layer 330 and conductive layer 332. Conductive layer 336 is formed over insulating layer 334 and electrically connected to conductive layer 332.

Figure 20B:
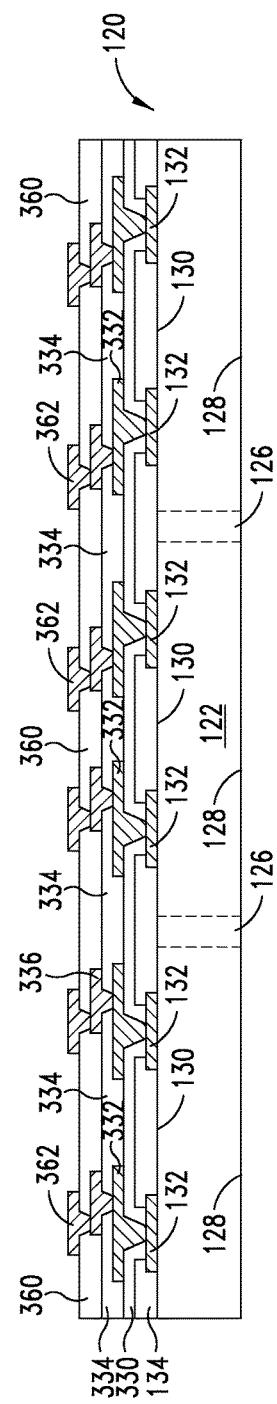

In FIG. 20b, an insulating or dielectric layer 360 is formed over insulating layer 334 and conductive layer 336 using PVD, CVD, lamination, screen printing, slit coating, spin coating, or spray coating. Insulating layer 360 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 360 is removed by an etching process, an exposure or development process, for example UV exposure followed by wet chemical developing, or by LDA or laser via drilling to form openings over conductive layer 336 and to expose conductive layer 336 with respect to insulating layer 360.

Insulating layer 360 is patterned and cured for optimal adhesion to insulating layer 334 and conductive layer 336. In one embodiment, the curing process for insulating layer 360 involves a multi-step dwell profile. Insulating layers 334 and 360 may be cured sequentially or simultaneously. In one embodiment, insulating layer 334 is deposited and cured prior to forming insulating layer 360. In one embodiment, insulating layer 360 is the same material as insulating layer 334 or has similar material characteristics as insulating layer 334 and different material characteristics from insulating layer 330. For example, insulating layer 360 is selected having an approximate tensile strength of 100 MPa, maximum elongation of 50% at 25° C. and 18% at −40° C., and elastic modulus of 2.0-2.2 GPa. A CTE for insulating layer 360 is approximately 58 ppm/° C. at $\alpha 1$ and 620 ppm/° C. at $\alpha 2$ (Tg=207° C.). Insulating layer 360 is selected to have a lower CTE and less shrinkage during curing than insulating layer 330, while insulating layer 330 has greater adhesion force, tensile strength, density, elongation, elastic modulus, and chemical resistance than insulating layer 360.

An electrically conductive layer or RDL 362 is formed over insulating layer 360 and conductive layer 336 using a patterning and metal deposition process such as sputtering, electrolytic plating, and electroless plating. Conductive layer 362 can be one or more layers of Al, Cu, Sn, Ni, Au, Ag, Ti, W, TiW, TiW/Cu, Ti/Cu, or other suitable electrically conductive material. One portion of conductive layer 362 is electrically connected to conductive layer 336 and to conductive layer 132 of semiconductor die 124. Other portions of conductive layer 362 can be electrically common or electrically isolated depending on the design and function of semiconductor die 124.

Figure 20C:
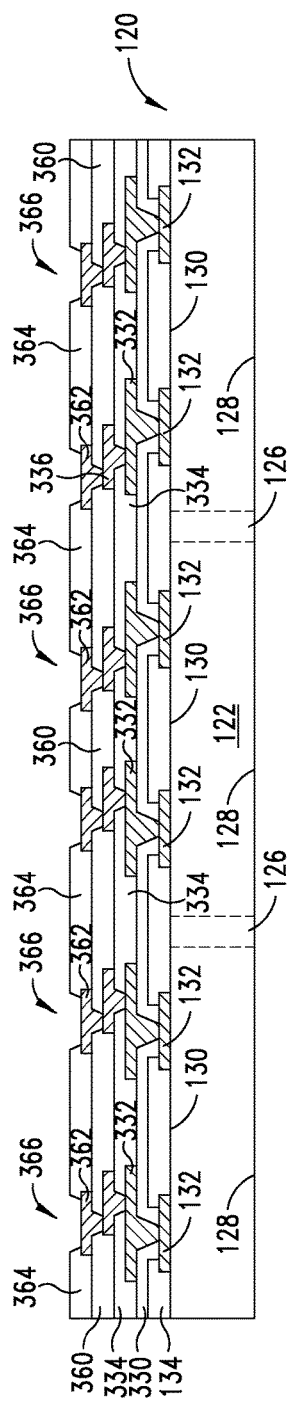

In FIG. 20c, an insulating or dielectric layer 364 is formed over insulating layer 360 and conductive layer 362 using PVD, CVD, lamination, screen printing, slit coating, spin coating, or spray coating. Insulating layer 364 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 364 is removed by an etching process, an exposure or development process, for example UV exposure followed by wet chemical developing, or by LDA or laser via drilling to form openings 366 over conductive layer 362 and to expose conductive layer 362 with respect to insulating layer 364.

Insulating layer 364 is patterned and cured for optimal adhesion to insulating layer 360 and conductive layer 362. In one embodiment, the curing process for insulating layer 364 involves a multi-step dwell profile. Insulating layers 360 and 364 may be cured sequentially or simultaneously. In one embodiment, insulating layer 360 is deposited and cured prior to forming insulating layer 364.

In one embodiment, insulating layer 364 is the same material as insulating layer 330 or has similar material characteristics as insulating layer 330 and has different material characteristics from insulating layers 334 and 360. For example, insulating layer 364 is selected having an approximate tensile strength of 130 MPa, maximum elongation of 50% at 25° C. and 40% at −55° C., and elastic modulus of 3.3 GPa. A CTE for insulating layer 364 is approximately 65 ppm/° C. at $\alpha 1$ and 0.80% or 8,000 ppm/° C. at $\alpha 2$ (Tg=205° C.). Insulating layers 330 and 364 are selected to have greater adhesion force, higher tensile strength and elastic modulus, greater elongation in a temperature range of −65° C. to 150° C., and a higher chemical resistance than insulating layers 334 and 360, while insulating layers 334 and 360 have a lower CTE and less shrinkage during curing than insulating layers 330 and 364. For example, insulating layers 334 and 360 exhibit approximately 12% shrinkage during curing, and insulating layers 330 and 364 exhibit approximately 31% shrinkage during curing. The force of adhesion between insulating layers 330 and 134 is greater than 400 N. The materials and structure of insulating layers 330, 334, 360, and 364 maximize the mechanical strength and chemical strength during handling and minimize warpage of the semiconductor package during subsequent packaging and assembly processes, particularly during high temperature processes.

Figure 20D:
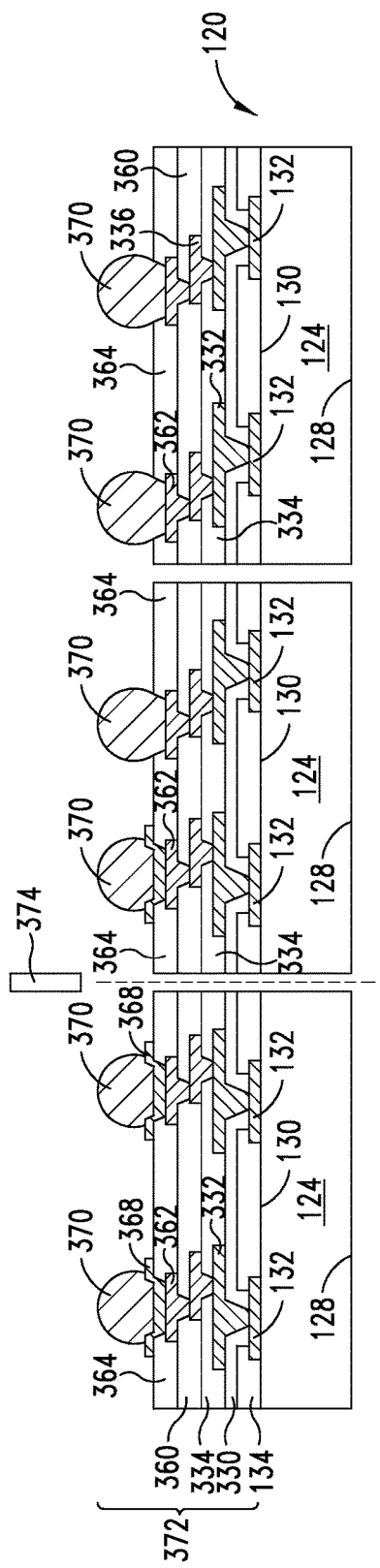

In FIG. 20d, an electrically conductive layer 368 is optionally formed over the exposed portion of conductive layer 362 within openings 366 and over insulating layer 364 after final repassivation using PVD, CVD, evaporation, electrolytic plating, electroless plating, or other suitable metal deposition process. Conductive layer 368 can be Al, Ti, TiW, Cu, Sn, Ni, Au, Ag, W, or other suitable electrically conductive material. Conductive layer 368 operates as a UBM layer electrically connected to conductive layer 362. UBM layer 368 can be a multi-metal stack with adhesion layer, barrier layer, and seed or wetting layer. The adhesion layer is formed over conductive layer 362 and can be TiN, Ti, TiW, Al, or Cr. The barrier layer is formed over the adhesion layer and can be TaN, NiV, Pt, Pd, Ni, TiW, Ti, or CrCu. The barrier layer inhibits the diffusion of Cu into the active area of semiconductor die 124. The seed layer is formed over the barrier layer and can be Cu, Ni, NiV, Au, or Al. UBM layer 368 provides a low resistive interconnect to conductive layer 362, as well as a barrier to solder diffusion and seed layer for solder wettability.

An electrically conductive bump material is deposited over optional UBM layer 368 or directly over conductive layer 362 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM layer 368 or conductive layer 362 using a suitable attachment or bonding process. In one embodiment, the bump material is reflowed by heating the material above its melting point to form balls or bumps 370. In some applications, bumps 370 are reflowed a second time to improve electrical contact to UBM layer 368 or conductive layer 362. Bumps 370 can also be compression bonded to UBM layer 368 or conductive layer 362. Bumps 370 represent one type of interconnect structure that can be formed over UBM layer 368 or conductive layer 362. The interconnect structure can also use stud bump, micro bump, pillar, or other electrical interconnect.

The insulating layers 330, 334, 360 and 364, conductive layers 332, 336, and 362, optional UBM layer 368, and bumps 370 constitute a build-up interconnect structure 372 formed over active surface 130 of semiconductor die 124 and over insulating layer 134 and conductive layers 132 of semiconductor die 124. Build-up interconnect structure 372 is formed over semiconductor wafer 120. Build-up interconnect structure 372 exhibits advanced dielectric characteristics that improve manufacturing yield and package reliability. Insulating layers 330, 334, 360, and 364 are configured for improved mechanical strength and chemical strength during and after the formation of build-up interconnect structure 372 for improved handling of semiconductor wafer 120. Insulating layers 330, 334, 360, and 364 form an insulating layer stack that exhibits high adhesion and strength as well as low CTE and shrinkage. For example, insulating layers 330 and 364 operate as outer layers of the insulating layer stack and have characteristics of higher strength, adhesion, and elongation relative to insulating layers 334 and 360. Insulating layers 334 and 360 operate as inner layers of the insulating layer stack in build-up interconnect structure 372 and have characteristics of lower CTE and shrinkage relative to insulating layers 330 and 364. Thus, build-up interconnect structure 372 exhibits less warpage and also exhibits less damage under warpage conditions, thereby improving reliability of electrical interconnections.

Semiconductor wafer 120 is singulated with saw blade or laser cutting device 374 through saw streets 126 and interconnect structure 372 into individual semiconductor die 124.

Figure 21:
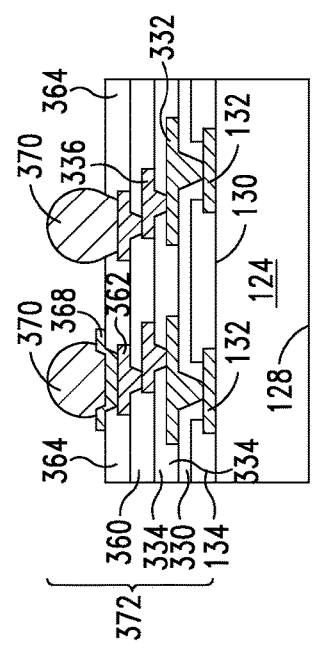
FIG. 21 illustrates an alternative semiconductor device with a wafer-level build-up interconnect structure.

FIG. 21 shows semiconductor die 124 electrically connected to conductive layers 332, 336, and 362, optional UBM layer 368, and bumps 370 for external interconnect to other semiconductor devices. Semiconductor die 124 can be further assembled or packaged, for example, semiconductor die 124 is mounted to a substrate, interposer, PCB, wafer, or other semiconductor device. The advanced dielectric characteristics of build-up interconnect structure 372 improve the thermal performance of semiconductor die 124 during subsequent packaging and assembly processes. For example, insulating layers 330, 334, 360, and 364 are configured to reduce warpage of the device, particularly during high temperature processes. Insulating layers 330, 334, 360, and 364 are further configured to improve the strength and adhesion of adjacent layers within build-up interconnect structure 372, thereby reducing delamination and joint failure. Therefore, build-up interconnect structure 372 improves the reliability of electrical connections within semiconductor die 124 as well as the reliability of electrical connections to other semiconductor devices.

Figure 22A:
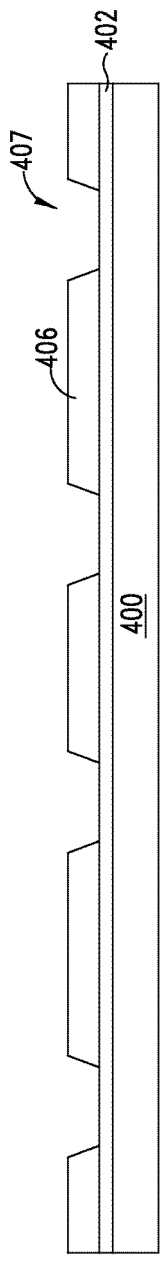

FIGS. 22a-22g illustrate, in relation to FIGS. 1 and 2a-2c, a method of forming a semiconductor device with an advanced build-up interconnect structure. FIG. 22a shows a cross-sectional view of a portion of a carrier or temporary substrate 400 containing sacrificial or reusable base material such as silicon, polymer, beryllium oxide, glass, or other suitable low-cost, rigid material for structural support. An interface layer or double-sided tape 402 is optionally formed over carrier 400 as a temporary adhesive bonding film, etch-stop layer, or thermal release layer. In one embodiment, interface layer 402 includes Al or SiO2 and operates as an etch-stop layer. In another embodiment, interface layer 402 includes a debonding layer comprising an insulating material, such as a polymer with or without fillers or fibers, or other material having similar insulating and structural properties.

An insulating or dielectric layer 406 is formed over interface layer 402 and carrier 400 using PVD, CVD, lamination, screen printing, slit coating, spin coating, or spray coating. Insulating layer 406 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 406 is removed by an etching process, an exposure or development process, for example UV exposure followed by wet chemical developing, or by LDA or laser via drilling to form openings 407 in insulating layer 406. In one embodiment, the curing process for insulating layer 406 involves a multi-step dwell profile. In one embodiment, insulating layer 406 is selected having an approximate tensile strength of 130 MPa, maximum elongation of 50% at 25° C. and 40% at −55° C., and elastic modulus of 3.3 GPa. A CTE for insulating layer 406 is approximately 65 ppm/° C. at α1 and 0.80% or 8,000 ppm/° C. at α2 (Tg=205° C.)

Figure 22B:
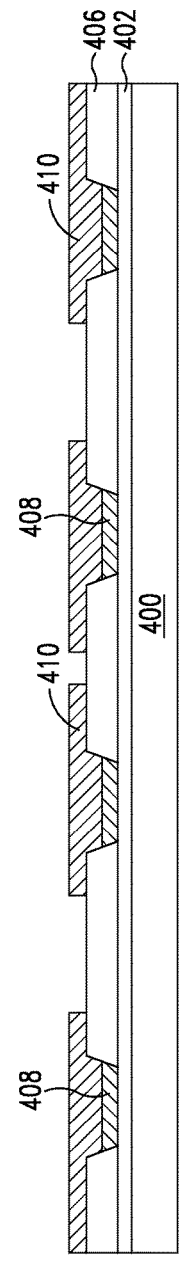

In FIG. 22b, an electrically conductive layer 408 is formed within openings 407 over carrier 400 using a patterning and metal deposition process such as sputtering, electrolytic plating, and electroless plating. Conductive layer 408 can be one or more layers of Al, Cu, Sn, Ni, Au, Ag, Ti, W, TiW, TiW/Cu, Ti/Cu, or other suitable electrically conductive material. In one embodiment, conductive layer 408 operates as a UBM layer for subsequently formed bumps or interconnect structures. UBM layer 408 can be a multi-metal stack with an adhesion layer, barrier layer, and seed or wetting layer. In one embodiment, the wetting layer is formed over carrier 400 and the barrier and adhesion layers are formed over the wetting layer.

An electrically conductive layer or RDL 410 is formed over insulating layer 406 and conductive layer 408 using a patterning and metal deposition process such as sputtering, electrolytic plating, and electroless plating. Conductive layer 410 can be one or more layers of Al, Cu, Sn, Ni, Au, Ag, Ti, W, TiW, TiW/Cu, Ti/Cu, or other suitable electrically conductive material. One portion of conductive layer 410 is electrically connected to conductive layer 408. Other portions of conductive layer 410 can be electrically common or electrically isolated.

Figure 22C:
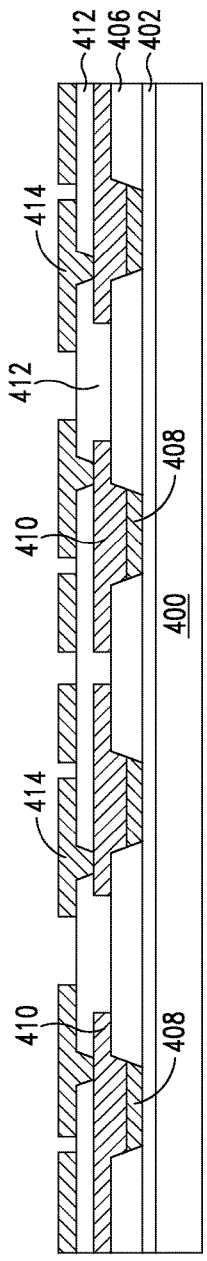

In FIG. 22c, an insulating or dielectric layer 412 is formed over insulating layer 406 and conductive layer 410 using PVD, CVD, lamination, screen printing, slit coating, spin coating, or spray coating. Insulating layer 412 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 412 is removed by an etching process, an exposure or development process, for example UV exposure followed by wet chemical developing, or by LDA or laser via drilling to form openings over conductive layer 410 and to expose conductive layer 410 with respect to insulating layer 412.

Insulating layer 412 is patterned and cured for optimal adhesion to insulating layer 406 and conductive layer 410. In one embodiment, the curing process for insulating layer 412 involves a multi-step dwell profile. Insulating layers 406 and 412 may be cured sequentially or simultaneously. In one embodiment, insulating layer 406 is deposited and cured prior to forming insulating layer 412. In one embodiment, insulating layer 412 has different material properties from insulating layer 406. For example, insulating layer 412 is selected having an approximate tensile strength of 100 MPa, maximum elongation of 50% at 25° C. and 18% at −40° C., and elastic modulus of 2.0-2.2 GPa. A CTE for insulating layer 412 is approximately 58 ppm/° C. at α1 and 620 ppm/° C. at α2 (Tg=207° C.). Insulating layer 412 is selected to have a lower CTE and less shrinkage during curing than insulating layer 406, while insulating layer 406 has greater adhesion force, tensile strength, density, elongation, elastic modulus, and chemical resistance than insulating layer 412.

An electrically conductive layer or RDL 414 is formed over insulating layer 412 and conductive layer 410 using a patterning and metal deposition process such as sputtering, electrolytic plating, and electroless plating. Conductive layer 336 can be one or more layers of Al, Cu, Sn, Ni, Au, Ag, Ti, W, TiW, TiW/Cu, Ti/Cu, or other suitable electrically conductive material. One portion of conductive layer 414 is electrically connected to conductive layer 410. Other portions of conductive layer 414 can be electrically common or electrically isolated.

Figure 22D:
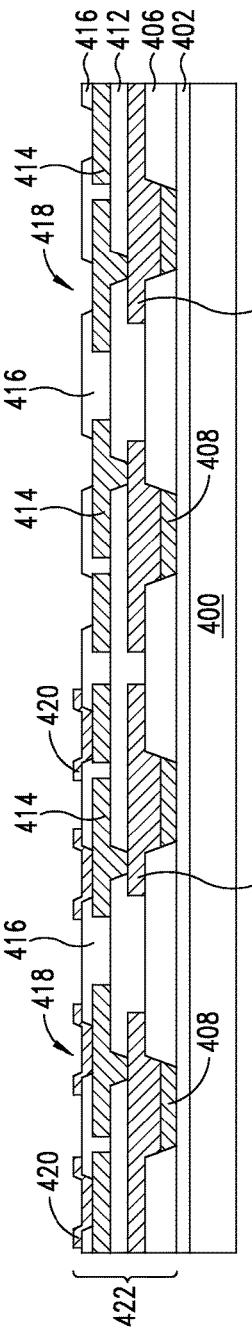

In FIG. 22d, an insulating or dielectric layer 416 is formed over insulating layer 412 and conductive layer 414 using PVD, CVD, lamination, screen printing, slit coating, spin coating, or spray coating. Insulating layer 416 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 416 is removed by an etching process, an exposure or development process, for example UV exposure followed by wet chemical developing, or by LDA or laser via drilling to form openings 418 over conductive layer 414 and to expose conductive layer 414 with respect to insulating layer 416.

Insulating layer 416 is patterned and cured for optimal adhesion to insulating layer 412 and conductive layer 414. In one embodiment, the curing process for insulating layer 416 involves a multi-step dwell profile. Insulating layers 412 and 416 may be cured sequentially or simultaneously. In one embodiment, insulating layer 412 is deposited and cured prior to forming insulating layer 416.

In one embodiment, insulating layer 416 is the same material as insulating layer 406 or has similar material characteristics as insulating layer 406 and has different material characteristics from insulating layer 412. For example, insulating layer 416 is selected having an approximate tensile strength of 130 MPa, maximum elongation of 50% at 25° C. and 40% at −55° C., and elastic modulus of 3.3 GPa. A CTE for insulating layer 416 is approximately 65 ppm/° C. at α1 and 0.80% or 8,000 ppm/° C. at α2 (Tg=205° C.). Insulating layers 406 and 416 are selected to have greater adhesion force, higher tensile strength and elastic modulus, greater elongation in a temperature range of −65° C. to 150° C., and a higher chemical resistance than insulating layer 412, while insulating layer 412 has a lower CTE and less shrinkage during curing than insulating layers 406 and 416. For example, insulating layer 412 exhibits approximately 12% shrinkage during curing, and insulating layers 406 and 416 exhibit approximately 31% shrinkage during curing. The materials and structure of insulating layers 406, 412, and 416 maximize the mechanical strength and chemical strength during handling and minimize warpage of the semiconductor package during subsequent packaging and assembly processes, particularly during high temperature processes.

An electrically conductive layer 420 is optionally formed over the exposed portion of conductive layer 414 within openings 418 and over insulating layer 416 after final repassivation using PVD, CVD, evaporation, electrolytic plating, electroless plating, or other suitable metal deposition process. Conductive layer 420 can be Al, Ti, TiW, Cu, Sn, Ni, Au, Ag, W, or other suitable electrically conductive material. Conductive layer 420 operates as a UBM layer electrically connected to conductive layer 414. UBM layer 420 can be a multi-metal stack with adhesion layer, barrier layer, and seed or wetting layer. The adhesion layer is formed over conductive layer 414 and can be TiN, Ti, TiW, Al, or Cr. The barrier layer is formed over the adhesion layer and can be TaN, NiV, Pt, Pd, Ni, TiW, Ti, or CrCu. The barrier layer inhibits the diffusion of Cu into underlying conductive layers. The seed layer is formed over the barrier layer and can be Cu, Ni, NiV, Au, or Al. UBM layer 420 provides a low resistive interconnect to conductive layer 414, as well as a barrier to solder diffusion and seed layer for solder wettability.

The insulating layers 406, 412, and 416, conductive layers 408, 410 and 414, and optional UBM layer 420 constitute a build-up interconnect structure 422 formed over carrier 400. Build-up interconnect structure 422 exhibits advanced dielectric characteristics that improve manufacturing yield and package reliability. Insulating layers 406, 412, and 416 are configured for improved mechanical strength and chemical strength during and after the formation of build-up interconnect structure 422. Insulating layers 406, 412, and 416 form an insulating layer stack that exhibits high adhesion and strength as well as low CTE and shrinkage. For example, insulating layers 406 and 416 operate as outer layers of the insulating layer stack and have characteristics of higher strength, adhesion, and elongation relative to insulating layer 412. Insulating layer 412 operates as the inner layer of the insulating layer stack in build-up interconnect structure 422 and has characteristics of lower CTE and shrinkage relative to insulating layers 406 and 416. Thus, build-up interconnect structure 422 exhibits less warpage and also exhibits less damage under warpage conditions, thereby improving reliability of electrical interconnections.

In FIG. 22e, a plurality of components 424 or semiconductor die 124 from FIG. 2c is mounted to build-up interconnect structure 422 using, for example, surface mount technology (SMT) or a pick and place operation to form reconstituted panel or reconstituted wafer 426. Semiconductor die 124 are KGD having been tested prior to mounting to semiconductor die 124 to build-up interconnect structure 422. Components 424 may include a passive device, discrete device, semiconductor die, or other component. In one embodiment, bumps 428 are formed by SMT with paste printing deposited into openings 418 in insulating layer 416 at the panel-level or wafer-level. Bumps 428 are reflowed to electrically connect components 424 and semiconductor die 124 to build-up interconnect structure 422. Semiconductor die 124 and components 424 are metallurgically and electrically coupled through bumps 428 to conductive layer 414 or UBM layer 420.

In FIG. 22f, an encapsulant or molding compound 430 is deposited over semiconductor die 124, components 424, build-up interconnect structure 422, and carrier 400 using a paste printing, compressive molding, transfer molding, liquid encapsulant molding, vacuum lamination, spin coating, or other suitable applicator. Encapsulant 430 includes polymer composite material, such as epoxy resin with filler, epoxy acrylate with filler, or polymer with proper filler. Encapsulant 430 is non-conductive and environmentally protects the semiconductor device from external elements and contaminants.

Temporary carrier 400 and optional interface layer 402 are removed by chemical etching, mechanical peel-off, CMP, mechanical grinding, thermal bake, laser scanning, or wet stripping. The removal of temporary carrier 400 and interface layer 402 exposes surface 432 of build-up interconnect structure 422. In particular, a surface of insulating layer 406 and conductive layer 408 is exposed.

Figure 22G:
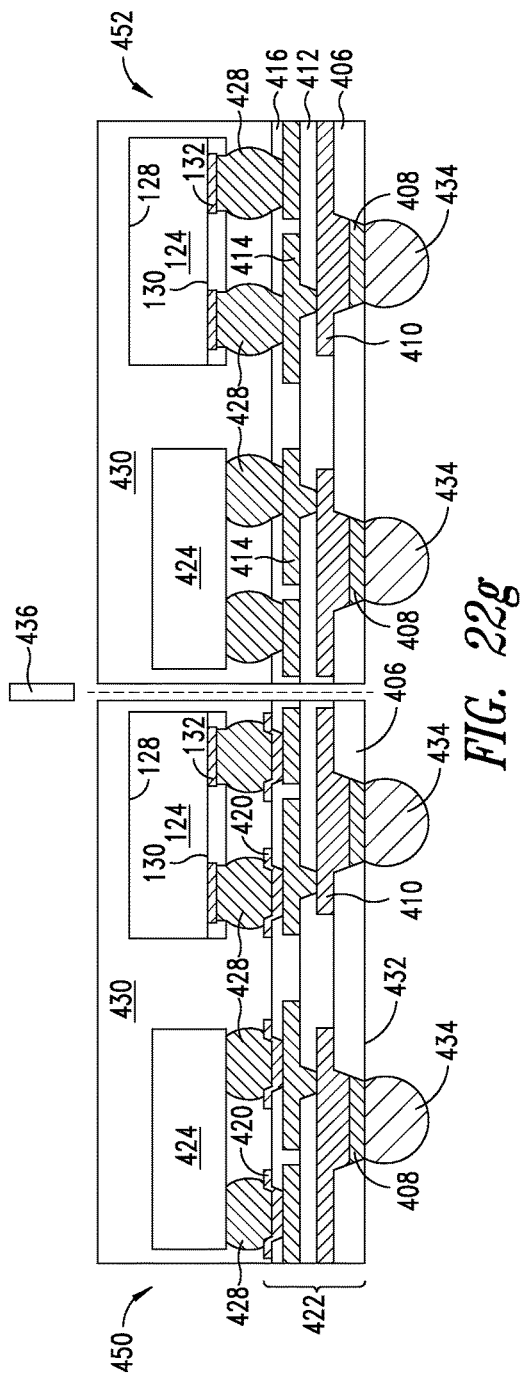

In FIG. 22g, an electrically conductive bump material is deposited over a surface of UBM layer 408 opposite to semiconductor die 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM layer 408 using a suitable attachment or bonding process. In one embodiment, the bump material is reflowed by heating the material above its melting point to form balls or bumps 434. In some applications, bumps 434 are reflowed a second time to improve electrical contact to UBM layer 408. Bumps 434 can also be compression bonded to UBM layer 408. Bumps 434 represent one type of interconnect structure that can be formed over UBM layer 408. The interconnect structure can also use stud bump, micro bump, pillar, or other electrical interconnect.

Reconstituted panel 426 is singulated with saw blade or laser cutting device 436 through build-up interconnect structure 422 and encapsulant 430 into individual semiconductor packages 450 and 452. Semiconductor package 450 includes semiconductor die 124 and components 424 electrically connected to bumps 428, UBM layer 420, conductive layers 414 and 410, UBM layer 408, and bumps 434 for external interconnect to other semiconductor devices. Semiconductor package 452 is similar to semiconductor package 450 but without UBM layer 420. Semiconductor packages 450 and 452 can be further assembled or packaged, for example, mounted to a substrate, interposer, PCB, wafer, or other semiconductor device. The advanced dielectric characteristics of semiconductor packages 450 and 452 improve the thermal performance of the packages during subsequent packaging and assembly processes. For example, insulating layers 406, 412, and 416 are configured to reduce warpage of semiconductor packages 450 and 452, particularly during high temperature processes. Insulating layers 406, 412, and 416 are further configured to improve the strength and adhesion of adjacent layers within build-up interconnect structure 422, thereby reducing delamination and joint failure. Therefore, build-up interconnect structure 422 improves the reliability of electrical connections within semiconductor packages 450 and 452 as well as the reliability of electrical connections to other semiconductor devices.

Figure 23:
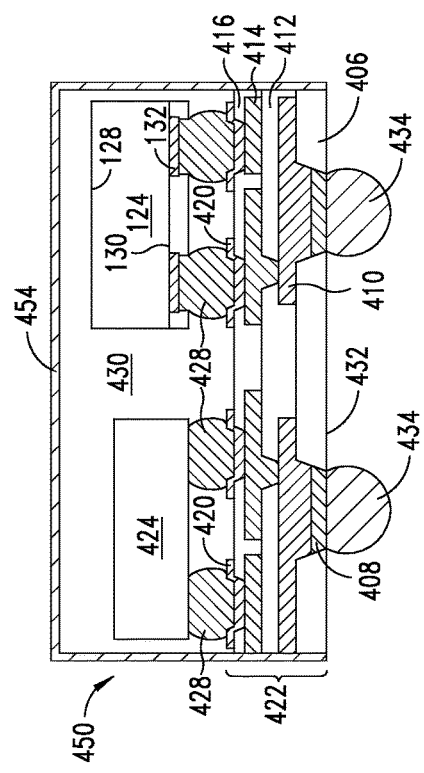
FIG. 23 illustrates a semiconductor device with a semiconductor component mounted to a build-up interconnect structure.

In FIG. 23, an electrically conductive layer 454 is conformally deposited over encapsulant 430 of semiconductor device 450 using a patterning and metal deposition process such as electrolytic plating and electroless plating, sputtering, PVD, CVD, or other suitable metal deposition process.

Conductive layer 454 operates as a shielding layer to reduce the effects of electromagnetic interference (EMI) and radio frequency interference (RFI). Shielding layer 454 can be one or more layers of Al, Cu, Sn, Ni, Au, Ag, Ti, TiW, W, or other suitable electrically conductive material. Shielding layer 454 can also be ferrite or carbonyl iron, stainless steel (SS), nickel silver, low-carbon steel, silicon-iron steel, foil, conductive resin, conductive paste, and other metals and composites capable of blocking or absorbing EMI, RFI, and other inter-device interference. In other embodiments, shielding layer 454 includes a non-metal material such as carbon-black or aluminum flake to reduce the effects of EMI and RFI. For non-metal materials, shielding layer 454 can be applied by lamination, spraying, or painting. Shielding layer 454 is grounded or electrically connected to a ground plane of semiconductor device 450 through at least one of the conductive layers 410 or 414, which is exposed during the singulation of reconstituted panel 426.

Figure 24A:
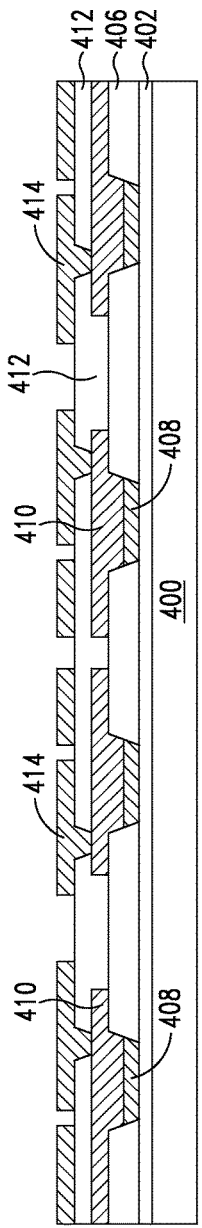

FIGS. 24a-24f, in relation to FIGS. 1 and 2a-2c, a method of forming a semiconductor device with an advanced build-up interconnect structure. Continuing from FIG. 22c, FIG. 24a shows insulating layer 406 and conductive layer 408 formed over interface layer 402 of carrier 400. Conductive layer 410 is formed over insulating layer 406 and electrically connected to conductive layer 408. Insulating layer 412 is formed over insulating layer 406 and conductive layer 410. Conductive layer 414 is formed over insulating layer 412 and electrically connected to conductive layer 410.

Figure 24B:
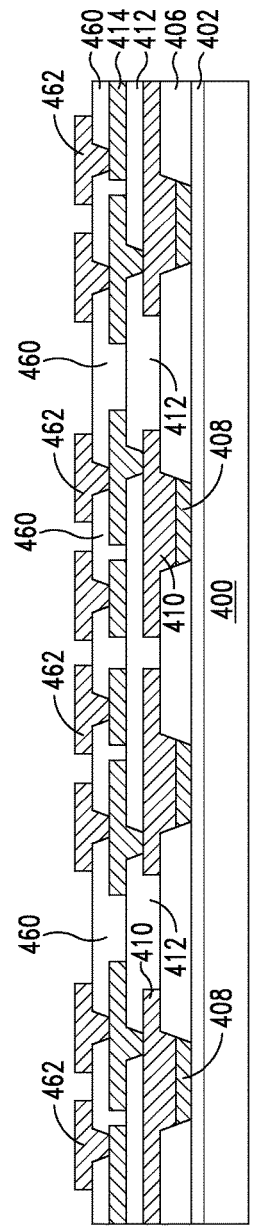

In FIG. 24b, an insulating or dielectric layer 460 is formed over insulating layer 412 and conductive layer 414 using PVD, CVD, lamination, screen printing, slit coating, spin coating, or spray coating. Insulating layer 460 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 460 is removed by an etching process, an exposure or development process, for example UV exposure followed by wet chemical developing, or by LDA or laser via drilling to form openings over conductive layer 414 and to expose conductive layer 414 with respect to insulating layer 460.

Insulating layer 460 is patterned and cured for optimal adhesion to insulating layer 412 and conductive layer 414. In one embodiment, the curing process for insulating layer 460 involves a multi-step dwell profile. Insulating layers 412 and 460 may be cured sequentially or simultaneously. In one embodiment, insulating layer 412 is deposited and cured prior to forming insulating layer 460. In one embodiment, insulating layer 460 is the same material as insulating layer 412 or has similar material characteristics as insulating layer 412 and has different material characteristics from insulating layer 406. For example, insulating layer 460 is selected having an approximate tensile strength of 100 MPa, maximum elongation of 50% at 25° C. and 18% at −40° C., and elastic modulus of 2.0-2.2 GPa. A CTE for insulating layer 460 is approximately 58 ppm/° C. at $\alpha 1$ and 620 ppm/° C. at $\alpha 2$ (Tg=207° C.). Insulating layer 460 is selected to have a lower CTE and less shrinkage during curing than insulating layer 406, while insulating layer 406 has greater adhesion force, tensile strength, density, elongation, elastic modulus, and chemical resistance than insulating layer 460.

An electrically conductive layer or RDL 462 is formed over insulating layer 460 and conductive layer 414 using a patterning and metal deposition process such as sputtering, electrolytic plating, and electroless plating. Conductive layer 462 can be one or more layers of Al, Cu, Sn, Ni, Au, Ag, Ti, W, TiW, TiW/Cu, Ti/Cu, or other suitable electrically conductive material. One portion of conductive layer 462 is electrically connected to conductive layer 414 and conductive layers 410 and 408. Other portions of conductive layer 462 can be electrically common or electrically isolated.

Figure 24C:
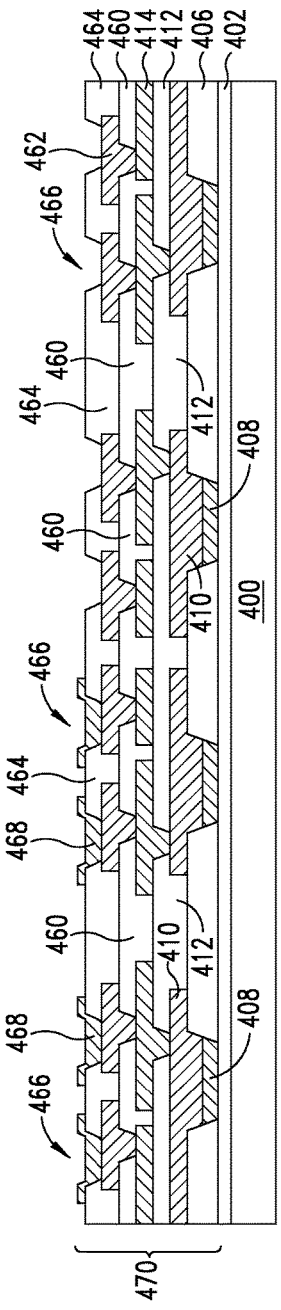

In FIG. 24c, an insulating or dielectric layer 464 is formed over insulating layer 460 and conductive layer 462 using PVD, CVD, lamination, screen printing, slit coating, spin coating, or spray coating. Insulating layer 464 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 464 is removed by an etching process, an exposure or development process, for example UV exposure followed by wet chemical developing, or by LDA or laser via drilling to form openings 466 over conductive layer 468 and to expose conductive layer 462 with respect to insulating layer 464.

Insulating layer 464 is patterned and cured for optimal adhesion to insulating layer 460 and conductive layer 462. In one embodiment, the curing process for insulating layer 460 involves a multi-step dwell profile. Insulating layers 460 and 464 may be cured sequentially or simultaneously. In one embodiment, insulating layer 460 is deposited and cured prior to forming insulating layer 464.

In one embodiment, insulating layer 464 is the same material as insulating layer 406 or has similar material characteristics as insulating layer 406 and has different material characteristics from insulating layers 412 and 460. Insulating layer 464 is selected having an approximate tensile strength of 130 MPa, maximum elongation of 50% at 25° C. and 40% at −55° C., and elastic modulus of 3.3 GPa. A CTE for insulating layer 464 is approximately 65 ppm/° C. at α1 and 0.80% or 8,000 ppm/° C. at α2 (Tg=205° C.). Insulating layers 406 and 464 are selected to have greater adhesion force, higher tensile strength and elastic modulus, greater elongation in a temperature range of −65° C. to 150° C., and a higher chemical resistance than insulating layers 412 and 460, while insulating layers 412 and 460 have a lower CTE and less shrinkage during curing than insulating layers 406 and 464. For example, insulating layers 412 and 460 exhibit approximately 12% shrinkage during curing, and insulating layers 406 and 464 exhibit approximately 31% shrinkage during curing. The materials and structure of insulating layers 406, 412, 460, and 464 maximize the mechanical strength and chemical strength during handling and minimize warpage of the semiconductor package during subsequent packaging and assembly processes, particularly during high temperature processes.

An electrically conductive layer 468 is optionally formed over the exposed portion of conductive layer 462 and over insulating layer 464 after final repassivation using PVD, CVD, evaporation, electrolytic plating, electroless plating, or other suitable metal deposition process. Conductive layer 468 can be Al, Ti, TiW, Cu, Sn, Ni, Au, Ag, W, or other suitable electrically conductive material. Conductive layer 468 operates as a UBM layer electrically connected to conductive layer 462. UBM layer 468 can be a multi-metal stack with adhesion layer, barrier layer, and seed or wetting layer. The adhesion layer is formed over conductive layer 462 and can be TiN, Ti, TiW, Al, or Cr. The barrier layer is formed over the adhesion layer and can be TaN, NiV, Pt, Pd, Ni, TiW, Ti, or CrCu. The barrier layer inhibits the diffusion of Cu underlying conductive layers. The seed layer is formed over the barrier layer and can be Cu, Ni, NiV, Au, or Al. UBM layer 468 provides a low resistive interconnect to conductive layer 462, as well as a barrier to solder diffusion and seed layer for solder wettability.

The insulating layers 406, 412, 460 and 464, conductive layers 408, 410, 414 and 462, and optional UBM layer 468 constitute a build-up interconnect structure 470 formed over carrier 400. Build-up interconnect structure 470 exhibits advanced dielectric characteristics that improve manufacturing yield and package reliability. Insulating layers 406, 412, 460 and 464 are configured for improved mechanical strength and chemical strength during and after the formation of build-up interconnect structure 470. Insulating layers 406, 412, 460 and 464 form an insulating layer stack that exhibits high adhesion and strength as well as low CTE and shrinkage. For example, insulating layers 406 and 464 operate as outer layers of the insulating layer stack and have characteristics of higher strength, adhesion, and elongation relative to insulating layers 412 and 460. Insulating layers 412 and 460 operate as inner layers of the insulating layer stack in build-up interconnect structure 470 and have characteristics of lower CTE and shrinkage relative to insulating layers 406 and 464. Thus, build-up interconnect structure 470 exhibits less warpage and also exhibits less damage under warpage conditions, thereby improving reliability of electrical interconnections.

Figure 24D:
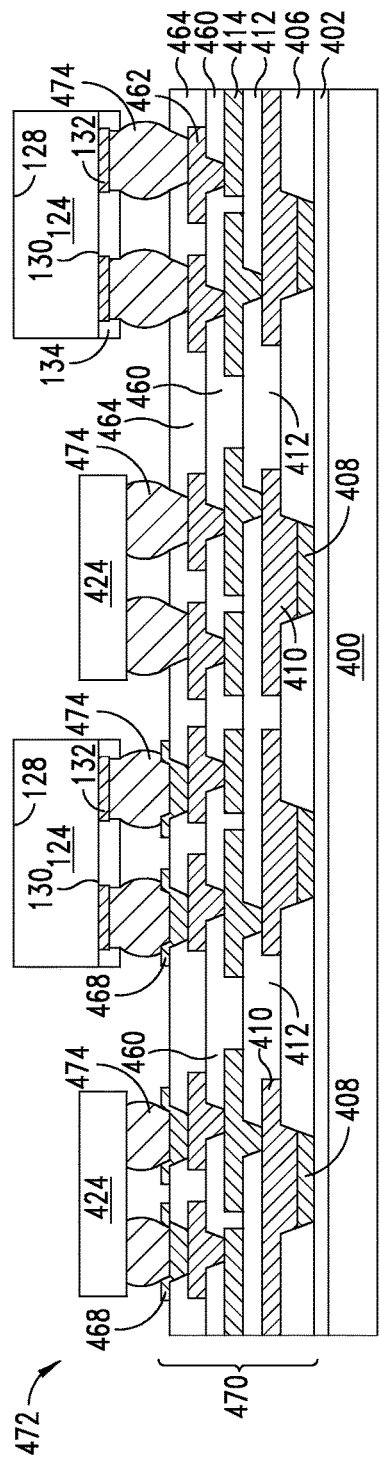

In FIG. 24d, a plurality of components 424 or semiconductor die 124 from FIG. 2c is mounted to build-up interconnect structure 470 using, for example, SMT or a pick and place operation to form reconstituted panel or reconstituted wafer 472. Semiconductor die 124 are KGD having been tested prior to mounting to semiconductor die 124 to build-up interconnect structure 470. Components 424 may include a passive device, discrete device, semiconductor die, or other component. In one embodiment, bumps 474 are formed by SMT with paste printing deposited into openings 466 in insulating layer 464 at the panel-level or wafer-level. Bumps 474 are reflowed to electrically connect components 424 and semiconductor die 124 to build-up interconnect structure 470. Semiconductor die 124 and components 424 are metallurgically and electrically coupled through bumps 474 to conductive layer 462 or UBM layer 468.

Figure 24E:
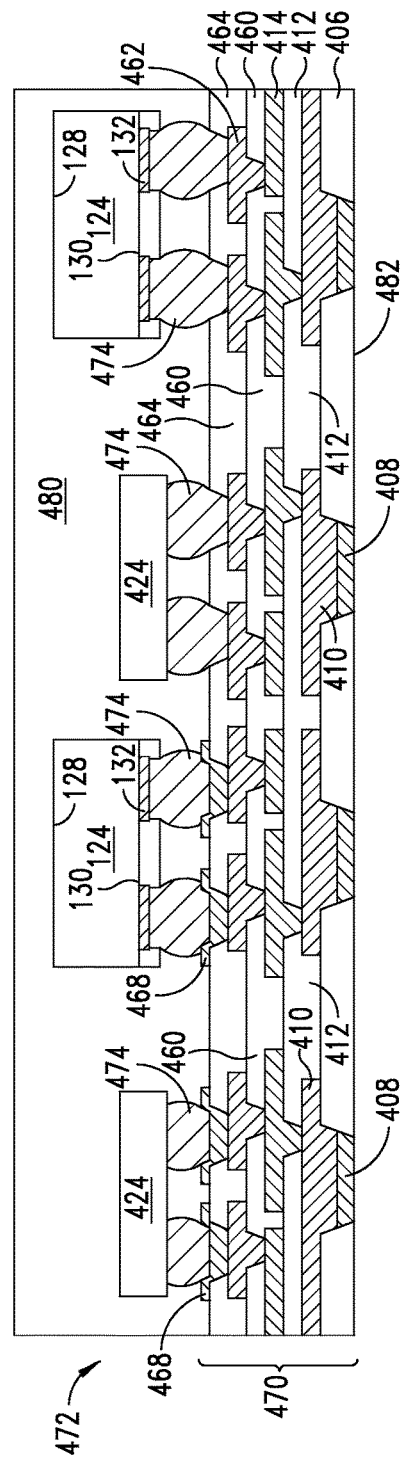

In FIG. 24e, an encapsulant or molding compound 480 is deposited over semiconductor die 124, components 424, build-up interconnect structure 470, and carrier 400 using a paste printing, compressive molding, transfer molding, liquid encapsulant molding, vacuum lamination, spin coating, or other suitable applicator. Encapsulant 480 includes polymer composite material, such as epoxy resin with filler, epoxy acrylate with filler, or polymer with proper filler. Encapsulant 480 is non-conductive and environmentally protects the semiconductor device from external elements and contaminants.

Temporary carrier 400 and optional interface layer 402 are removed by chemical etching, mechanical peel-off, CMP, mechanical grinding, thermal bake, laser scanning, or wet stripping. The removal of temporary carrier 400 and interface layer 402 exposes surface 482 of build-up interconnect structure 470. In particular, a surface of insulating layer 406 and conductive layer 408 is exposed.

In FIG. 24f, an electrically conductive bump material is deposited over the exposed surface of UBM layer 408 opposite to semiconductor die 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM layer 408 using a suitable attachment or bonding process. In one embodiment, the bump material is reflowed by heating the material above its melting point to form balls or bumps 484. In some applications, bumps 484 are reflowed a second time to improve electrical contact to UBM layer 408. Bumps 484 can also be compression bonded to UBM layer 408. Bumps 484 represent one type of interconnect structure that can be formed over UBM layer 408. The interconnect structure can also use stud bump, micro bump, pillar, or other electrical interconnect.

Reconstituted panel 472 is singulated with saw blade or laser cutting device 486 through build-up interconnect structure 470 and encapsulant 480 into individual semiconductor packages 490 and 492. Semiconductor package 490 includes semiconductor die 124 and components 424 electrically connected to bumps 474, UBM layer 468, conductive layers 462, 414, and 410, UBM layer 408, and bumps 484 for external interconnect to other semiconductor devices. Semiconductor package 492 is similar to semiconductor package 490 but without UBM layer 468. Semiconductor packages 490 and 492 can be further assembled or packaged, for example, mounted to a substrate, interposer, PCB, wafer, or other semiconductor device. The advanced dielectric characteristics of semiconductor packages 490 and 492 improve the thermal performance of the packages during subsequent packaging and assembly processes. For example, insulating layers 406, 412, 460, and 464 are configured to reduce warpage of semiconductor packages 490 and 492, particularly during high temperature processes. Insulating layers 406, 412, 460, and 464 are further configured to improve the strength and adhesion of adjacent layers within build-up interconnect structure 470, thereby reducing delamination and joint failure. Therefore, build-up interconnect structure 470 improves the reliability of electrical connections within semiconductor packages 490 and 492 as well as the reliability of electrical connections to other semiconductor devices.

In FIG. 25, an electrically conductive layer 494 is conformally deposited over encapsulant 480 of semiconductor device 490 using a patterning and metal deposition process such as electrolytic plating and electroless plating, sputtering, PVD, CVD, or other suitable metal deposition process. Conductive layer 494 operates as a shielding layer to reduce the effects of EMI and RFI. Shielding layer 494 can be one or more layers of Al, Cu, Sn, Ni, Au, Ag, Ti, TiW, W, or other suitable electrically conductive material. Shielding layer 494 can also be ferrite or carbonyl iron, SS, nickel silver, low-carbon steel, silicon-iron steel, foil, conductive resin, conductive paste, and other metals and composites capable of blocking or absorbing EMI, RFI, and other inter-device interference. In other embodiments, shielding layer 494 includes a non-metal material such as carbon-black or aluminum flake to reduce the effects of EMI and RFI. For non-metal materials, shielding layer 494 can be applied by lamination, spraying, or painting. Shielding layer 494 is grounded or electrically connected to a ground plane of semiconductor device 490 through at least one of the conductive layers 410, 414 or 462, which is exposed during the singulation of reconstituted panel 472.

Figure 26A:
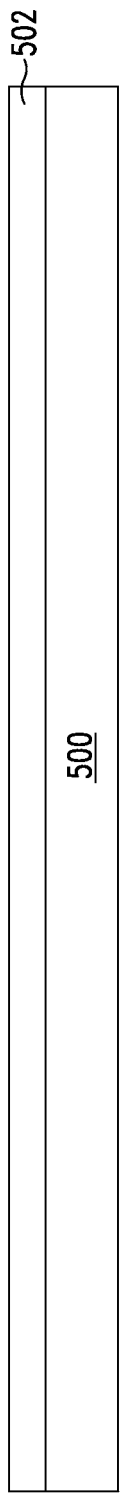

FIGS. 26a-26h illustrate, in relation to FIGS. 1 and 2a-2c, a method of forming a semiconductor device with an advanced build-up interconnect structure. FIG. 26a shows a cross-sectional view of a portion of a carrier or temporary substrate 500 containing sacrificial or reusable base material such as silicon, polymer, beryllium oxide, glass, or other suitable low-cost, rigid material for structural support. An interface layer or insulating layer 502 is optionally formed over carrier 500 as a temporary adhesive bonding film, etch-stop layer, or thermal release layer. In one embodiment, insulating layer 502 includes a debonding layer comprising an insulating material, such as a polymer with or without fillers or fibers, or other material having similar insulating and structural properties. For example, insulating layer 502 includes low temperature curing (<250° C.) polymer matrix composite with filler or fiber and has a CTE of approximately 55 ppm/° C. at α1 and 140 ppm/° C. at α2 (Tg=105° C.). In another embodiment, interface layer 502 includes Al or SiO2 and operates as an etch-stop layer.

Figure 26B:
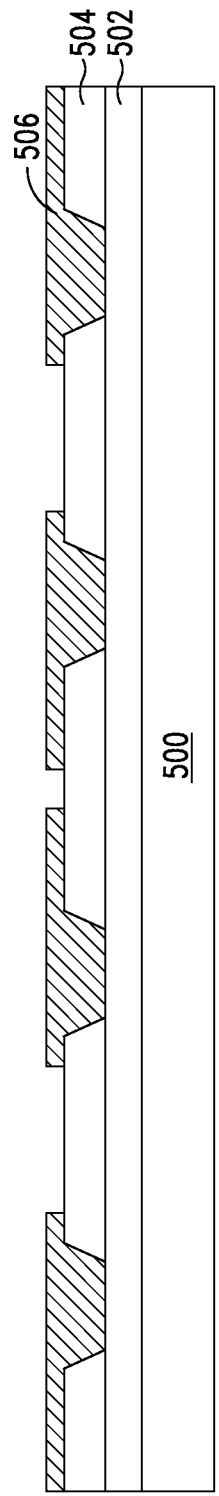

In FIG. 26b, an insulating or dielectric layer 504 is formed over insulating layer 502 and carrier 500 using PVD, CVD, lamination, screen printing, slit coating, spin coating, or spray coating. Insulating layer 504 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 504 is removed by an etching process, an exposure or development process, for example UV exposure followed by wet chemical developing, or by LDA or laser via drilling to form openings in insulating layer 504. In one embodiment, the curing process for insulating layer 504 involves a multi-step dwell profile. In one embodiment, insulating layer 504 is selected having an approximate tensile strength of 130 MPa, maximum elongation of 50% at 25° C. and 40% at −55° C., and elastic modulus of 3.3 GPa. A CTE for insulating layer 504 is approximately 65 ppm/° C. at α1 and 0.80% or 8,000 ppm/° C. at α2 (Tg=205° C.)

An electrically conductive layer 506 is formed over insulating layers 502 and 504 and carrier 500 using a patterning and metal deposition process such as sputtering, electrolytic plating, and electroless plating. Conductive layer 406 can be one or more layers of Al, Cu, Sn, Ni, Au, Ag, Ti, W, TiW, TiW/Cu, Ti/Cu, or other suitable electrically conductive material. In one embodiment, conductive layer 506 operates as a UBM layer for subsequently formed bumps or interconnect structures. In another embodiment, conductive layer 506 operates as an RDL to laterally redistribute electrical signals.

Figure 26C:
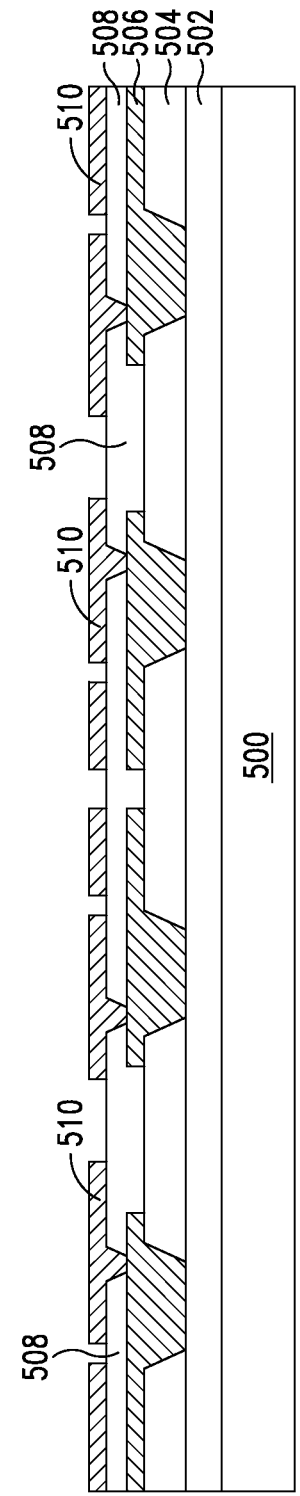

In FIG. 26c, an insulating or dielectric layer 508 is formed over insulating layer 504 and conductive layer 506 using PVD, CVD, lamination, screen printing, slit coating, spin coating, or spray coating. Insulating layer 508 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 508 is removed by an etching process, an exposure or development process, for example UV exposure followed by wet chemical developing, or by LDA or laser via drilling to form openings over conductive layer 506 and to expose conductive layer 506 with respect to insulating layer 508.

Insulating layer 508 is patterned and cured for optimal adhesion to insulating layer 504 and conductive layer 506. In one embodiment, the curing process for insulating layer 508 involves a multi-step dwell profile. Insulating layers 504 and 508 may be cured sequentially or simultaneously. In one embodiment, insulating layer 504 is deposited and cured prior to forming insulating layer 508. In one embodiment, insulating layer 508 has different material properties from insulating layer 504. For example, insulating layer 508 is selected having an approximate tensile strength of 100 MPa, maximum elongation of 50% at 25° C. and 18% at −40° C., and elastic modulus of 2.0-2.2 GPa. A CTE for insulating layer 508 is approximately 58 ppm/° C. at α1 and 620 ppm/° C. at α2 (Tg=207° C.). Insulating layer 508 is selected to have a lower CTE and less shrinkage during curing than insulating layer 504, while insulating layer 504 has greater adhesion force, higher tensile strength, greater density, elongation, and elastic modulus, and a higher chemical resistance than insulating layer 508.

An electrically conductive layer or RDL 510 is formed over insulating layer 508 and conductive layer 506 using a patterning and metal deposition process such as sputtering, electrolytic plating, and electroless plating. Conductive layer 510 can be one or more layers of Al, Cu, Sn, Ni, Au, Ag, Ti, W, TiW, TiW/Cu, Ti/Cu, or other suitable electrically conductive material. One portion of conductive layer 510 is electrically connected to conductive layer 506. Other portions of conductive layer 510 can be electrically common or electrically isolated.

Figure 26D:
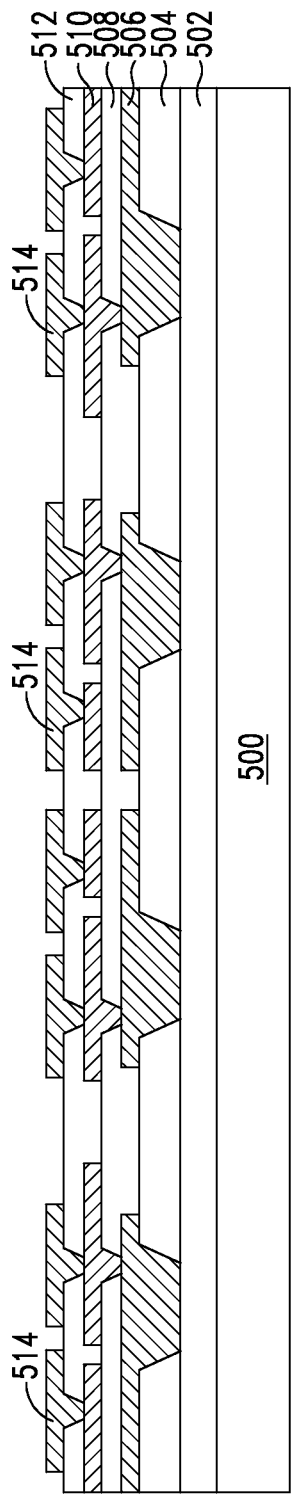

In FIG. 26d, an insulating or dielectric layer 512 is formed over insulating layer 508 and conductive layer 510 using PVD, CVD, lamination, screen printing, slit coating, spin coating, or spray coating. Insulating layer 512 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 512 is removed by an etching process, an exposure or development process, for example UV exposure followed by wet chemical developing, or by LDA or laser via drilling to form openings over conductive layer 510 and to expose conductive layer 510 with respect to insulating layer 512.

Insulating layer 512 is patterned and cured for optimal adhesion to insulating layer 508 and conductive layer 510. In one embodiment, the curing process for insulating layer 512 involves a multi-step dwell profile. Insulating layers 508 and 512 may be cured sequentially or simultaneously. In one embodiment, insulating layer 508 is deposited and cured prior to forming insulating layer 512.

In one embodiment, insulating layer 512 is the same material as insulating layer 508 or has similar material characteristics as insulating layer 508 and has different material characteristics from insulating layer 504. For example, insulating layer 512 is selected having an approximate tensile strength of 100 MPa, maximum elongation of 50% at 25° C. and 18% at −40° C., and elastic modulus of 2.0-2.2 GPa. A CTE for insulating layer 512 is approximately 58 ppm/° C. at α1 and 620 ppm/° C. at α2 (Tg=207° C.). Insulating layer 512 is selected to have a lower CTE and less shrinkage during curing than insulating layer 504, while insulating layer 504 has greater adhesion force, higher tensile strength, greater density, elongation, and elastic modulus, and a higher chemical resistance than insulating layer 512.

An electrically conductive layer or RDL 514 is formed over insulating layer 512 and conductive layer 510 using a patterning and metal deposition process such as sputtering, electrolytic plating, and electroless plating. Conductive layer 514 can be one or more layers of Al, Cu, Sn, Ni, Au, Ag, Ti, W, TiW, TiW/Cu, Ti/Cu, or other suitable electrically conductive material. One portion of conductive layer 514 is electrically connected to conductive layer 510. Other portions of conductive layer 514 can be electrically common or electrically isolated.

Figure 26E:
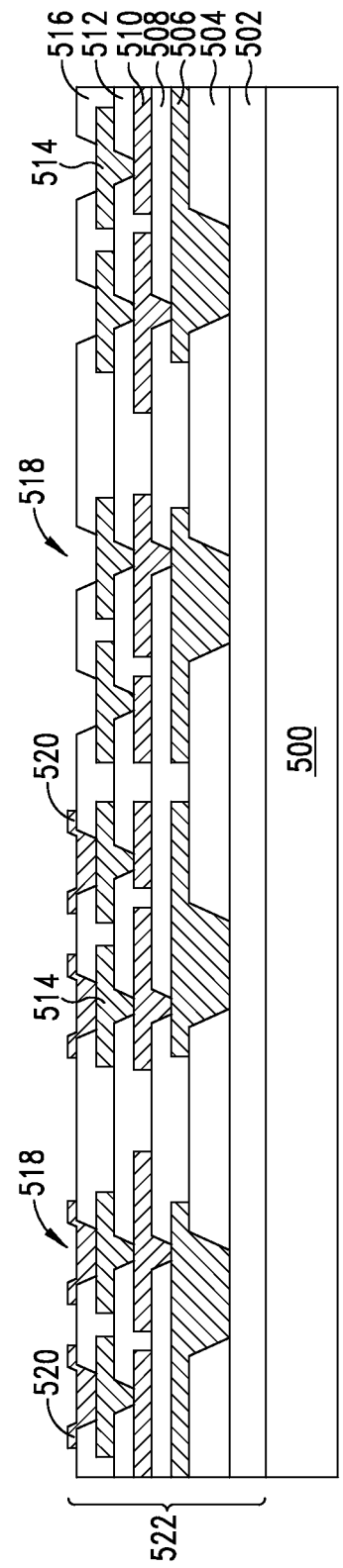

In FIG. 26e, an insulating or dielectric layer 516 is formed over insulating layer 512 and conductive layer 514 using PVD, CVD, lamination, screen printing, slit coating, spin coating, or spray coating. Insulating layer 516 contains one or more layers of low temperature curable polymer dielectric resist (i.e., cures at less than 250° C.), BCB, PBO, negative tone PI, negative tone polyisoprene, positive tone PBO, non-photosensitive polymer dielectric with or without filler, or other material having similar insulating and structural properties. A portion of insulating layer 516 is removed by an etching process, an exposure or development process, for example UV exposure followed by wet chemical developing, or by LDA or laser via drilling to form openings 518 over conductive layer 514 and to expose conductive layer 514 with respect to insulating layer 516.

Insulating layer 516 is patterned and cured for optimal adhesion to insulating layer 512 and conductive layer 514. In one embodiment, the curing process for insulating layer 516 involves a multi-step dwell profile. Insulating layers 512 and 516 may be cured sequentially or simultaneously. In one embodiment, insulating layer 512 is deposited and cured prior to forming insulating layer 516.

In one embodiment, insulating layer 516 is the same material as insulating layer 504 or has similar material characteristics as insulating layer 504 and has different material characteristics from insulating layers 508 and 512. Insulating layer 516 is selected having an approximate tensile strength of 130 MPa, maximum elongation of 50% at 25° C. and 40% at −55° C., and elastic modulus of 3.3 GPa. A CTE for insulating layer 516 is approximately 65 ppm/° C. at α1 and 0.80% or 8,000 ppm/° C. at α2 (Tg=205° C.). Insulating layers 504 and 516 are selected to have greater adhesion force, higher tensile strength and elastic modulus, greater elongation in a temperature range of −65° C. to 150° C., and a higher chemical resistance than insulating layers 508 and 512, while insulating layers 508 and 512 have a lower CTE and less shrinkage during curing than insulating layers 504 and 516. For example, insulating layers 508 and 512 exhibit approximately 12% shrinkage during curing, and insulating layers 504 and 516 exhibit approximately 31% shrinkage during curing. The materials and structure of insulating layers 502, 504, 508, 512, and 516 maximize the mechanical strength and chemical strength during handling and minimize warpage of the semiconductor package during subsequent packaging and assembly processes, particularly during high temperature processes.

An electrically conductive layer 520 is optionally formed over the exposed portion of conductive layer 514 and over insulating layer 516 after final repassivation using PVD, CVD, evaporation, electrolytic plating, electroless plating, or other suitable metal deposition process. Conductive layer 520 can be Al, Ti, TiW, Cu, Sn, Ni, Au, Ag, W, or other suitable electrically conductive material. Conductive layer 520 operates as a UBM layer electrically connected to conductive layer 514. UBM layer 520 can be a multi-metal stack with adhesion layer, barrier layer, and seed or wetting layer. The adhesion layer is formed over conductive layer 514 and can be TiN, Ti, TiW, Al, or Cr. The barrier layer is formed over the adhesion layer and can be TaN, NiV, Pt, Pd, Ni, TiW, Ti, or CrCu. The barrier layer inhibits the diffusion of Cu underlying conductive layers. The seed layer is formed over the barrier layer and can be Cu, Ni, NiV, Au, or Al. UBM layer 520 provides a low resistive interconnect to conductive layer 514, as well as a barrier to solder diffusion and seed layer for solder wettability.

The insulating layers 502, 504, 508, 512, and 516, conductive layers 506, 510, and 514, and optional UBM layer 520 constitute a build-up interconnect structure 522 formed over carrier 500. Build-up interconnect structure 522 exhibits advanced dielectric characteristics that improve manufacturing yield and package reliability. Insulating layers 502, 504, 508, 512, and 516 are configured for improved mechanical strength and chemical strength during and after the formation of build-up interconnect structure 522. Insulating layers 502, 504, 508, 512, and 516 form an insulating layer stack that exhibits high adhesion and strength as well as low CTE and shrinkage. For example, insulating layer 502 operates as a protection and debonding layer with high strength, thermal and crack resistance, low water absorption, and a low curing temperature. Insulating layers 502, 504, and 516 operate as outer layers of the insulating layer stack and have characteristics of higher strength, adhesion, and elongation relative to insulating layers 508 and 512. Insulating layers 508 and 512 operate as inner layers of the insulating layer stack in build-up interconnect structure 522 and have characteristics of lower CTE and shrinkage relative to insulating layers 502, 504, and 516. Thus, build-up interconnect structure 522 exhibits less warpage and also exhibits less damage under warpage conditions, thereby improving reliability of electrical interconnections.

Figure 26F:
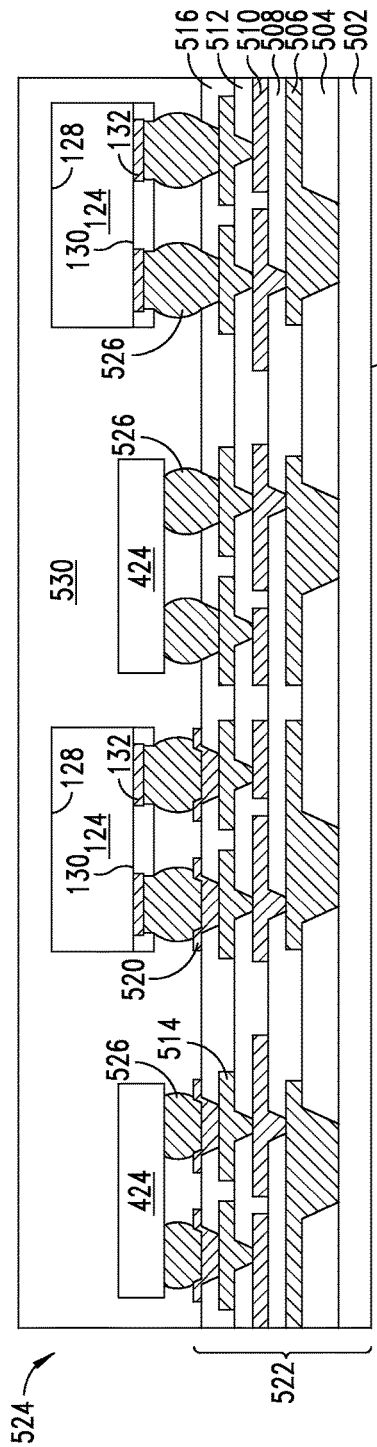

In FIG. 26f, a plurality of components 424 and semiconductor die 124 from FIG. 2c is mounted to build-up interconnect structure 522 using, for example, SMT or a pick and place operation to form reconstituted panel or reconstituted wafer 524. Semiconductor die 124 are KGD having been tested prior to mounting to semiconductor die 124 to build-up interconnect structure 522. Components 424 may include a passive device, discrete device, semiconductor die, or other component. In one embodiment, bumps 526 are formed by SMT with paste printing deposited into openings 518 in insulating layer 516 at the panel-level or wafer-level. Bumps 526 are reflowed to electrically connect components 424 and semiconductor die 124 to build-up interconnect structure 522. Semiconductor die 124 and components 424 are metallurgically and electrically coupled through bumps 526 to conductive layer 514 or UBM layer 520.

An encapsulant or molding compound 530 is deposited over semiconductor die 124, components 424, build-up interconnect structure 522, and carrier 500 using a paste printing, compressive molding, transfer molding, liquid encapsulant molding, vacuum lamination, spin coating, or other suitable applicator. Encapsulant 530 includes polymer composite material, such as epoxy resin with filler, epoxy acrylate with filler, or polymer with proper filler. Encapsulant 530 is non-conductive and environmentally protects the semiconductor device from external elements and contaminants.

Temporary carrier 500 is removed by chemical etching, mechanical peel-off, CMP, mechanical grinding, thermal bake, laser scanning, or wet stripping. The removal of temporary carrier 500 exposes surface 532 of build-up interconnect structure 522. In particular, a surface of insulating layer 502 opposite semiconductor die 124 and components 424 is exposed.

Figure 26G:
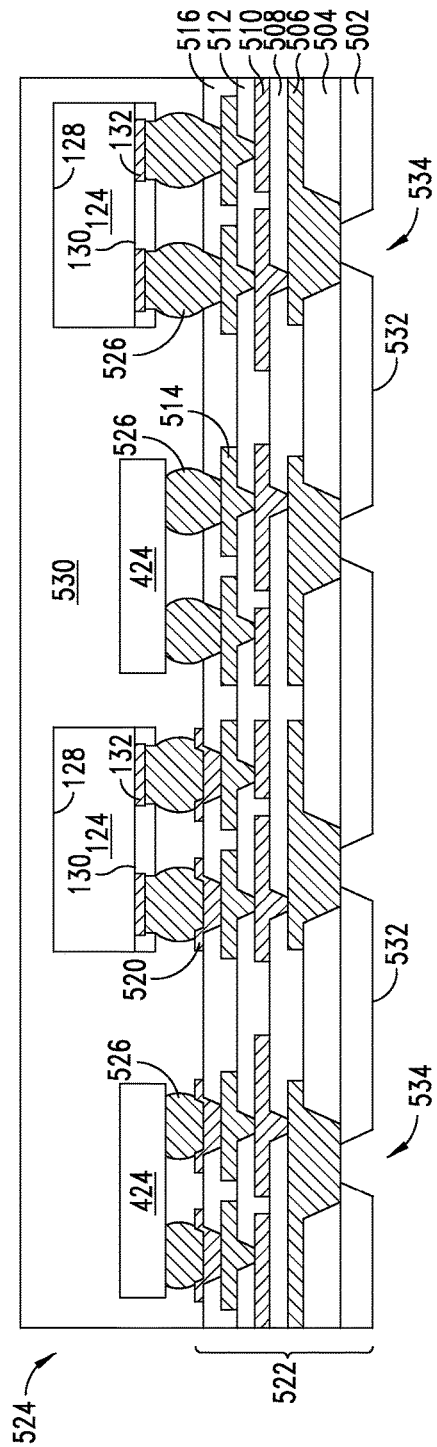

In FIG. 26g, insulating layer 502 remains after carrier 500 is removed. A portion of insulating layer 502 is removed by an etching process, an exposure or development process, for example UV exposure followed by wet chemical developing, or by LDA or laser via drilling to form openings 534 over conductive layer 506 and to expose conductive layer 506 with respect to insulating layer 502. In one embodiment, openings 534 in insulating layer 502 are formed after the insulating and conductive layers of build-up interconnect structure 522 are formed and after carrier 500 is removed. Alternatively, openings 534 in insulating layer 502 are formed while insulating layer 502 is disposed over carrier 500, prior to forming insulating layer 504 over insulating layer 502.

In FIG. 26h, an electrically conductive bump material is deposited over conductive layer 506 within openings 534 in insulating layer 502 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 506 using a suitable attachment or bonding process. In one embodiment, the bump material is reflowed by heating the material above its melting point to form balls or bumps 538. In some applications, bumps 538 are reflowed a second time to improve electrical contact to conductive layer 506. Bumps 538 can also be compression bonded to conductive layer 506. Bumps 538 represent one type of interconnect structure that can be formed over conductive layer 506. The interconnect structure can also use stud bump, micro bump, pillar, or other electrical interconnect. In particular, bumps 538 are formed over a surface of conductive layer 506 opposite to semiconductor die 124 and components 424.

Reconstituted panel 524 is singulated with saw blade or laser cutting device 540 through build-up interconnect structure 522 and encapsulant 530 into individual semiconductor packages 550 and 552. Semiconductor package 550 includes semiconductor die 124 and components 424 electrically connected to bumps 526, UBM layer 520, conductive layers 514, 510, and 506, and bumps 538 for external interconnect to other semiconductor devices. Semiconductor package 552 is similar to semiconductor package 550 but without UBM layer 520. Semiconductor packages 550 and 552 can be further assembled or packaged, for example, mounted to a substrate, interposer, PCB, wafer, or other semiconductor device. The advanced dielectric characteristics of semiconductor packages 550 and 552 improve the thermal performance of the packages during subsequent packaging and assembly processes. For example, insulating layers 502, 504, 508, 512, and 516 are configured to reduce warpage of semiconductor packages 550 and 552, particularly during high temperature processes. Insulating layers 502, 504, 508, 512, and 516 are further configured to improve the strength and adhesion of adjacent layers within build-up interconnect structure 522, thereby reducing delamination and joint failure. Therefore, build-up interconnect structure 522 improves the reliability of electrical connections within semiconductor packages 550 and 552 as well as the reliability of electrical connections to other semiconductor devices.

In FIG. 27, an electrically conductive layer 554 is conformally deposited over encapsulant 530 of semiconductor device 550 using a patterning and metal deposition process such as electrolytic plating and electroless plating, sputtering, PVD, CVD, or other suitable metal deposition process. Conductive layer 554 operates as a shielding layer to reduce the effects of EMI and RFI. Shielding layer 554 can be one or more layers of Al, Cu, Sn, Ni, Au, Ag, Ti, TiW, W, or other suitable electrically conductive material. Shielding layer 554 can also be ferrite or carbonyl iron, SS, nickel silver, low-carbon steel, silicon-iron steel, foil, conductive resin, conductive paste, and other metals and composites capable of blocking or absorbing EMI, RFI, and other inter-device interference. In other embodiments, shielding layer 554 includes a non-metal material such as carbon-black or aluminum flake to reduce the effects of EMI and RFI. For non-metal materials, shielding layer 554 can be applied by lamination, spraying, or painting. Shielding layer 554 is grounded or electrically connected to a ground plane of semiconductor device 550 through at least one of the conductive layers 506, 510, or 514, which is exposed during the singulation of reconstituted panel 524.

FIG. 28 shows an alternative semiconductor package 560 including semiconductor die 124 and component 424 mounted to a build-up interconnect structure 562, which is similar to build-up interconnect structure 522 of semiconductor packages 550 and 552, but without insulating layer 508 and conductive layer 510 and without UBM layer 520. Build-up interconnect structure 562 includes insulating layers 502, 504, 512, and 516, conductive layers 506 and 514, and bumps 538. Semiconductor die 124 and components 424 are mounted and electrically connected to build-up interconnect structure 562 at the panel level prior to encapsulation with encapsulant 530 and prior to singulation into semiconductor package 560. Shielding layer 554 is formed over encapsulant 530 after singulation and may electrically connect to conductive layers 506 or 514.

Build-up interconnect structure 562 exhibits advanced dielectric characteristics that improve manufacturing yield and package reliability. Insulating layers 502, 504, 512, and 516 are configured for improved mechanical strength and chemical strength during and after the formation of build-up interconnect structure 562. Insulating layers 502, 504, 512, and 516 form an insulating layer stack that exhibits high adhesion and strength as well as low CTE and shrinkage. For example, insulating layers 502, 506, and 516 operate as outer layers of the insulating layer stack and have characteristics of higher strength, adhesion, and elongation relative to insulating layer 512. Insulating layer 512 operates as the inner layer of the insulating layer stack in build-up interconnect structure 562 and has characteristics of lower CTE and shrinkage relative to insulating layers 502, 506, and 516. Thus, build-up interconnect structure 562 exhibits less warpage and also exhibits less damage under warpage conditions, thereby improving reliability of electrical interconnections. Semiconductor package 560 can be further assembled or packaged, for example, mounted to a substrate, interposer, PCB, wafer, or other semiconductor device. The advanced dielectric characteristics of semiconductor package 560 improves the thermal performance of the package during subsequent packaging and assembly processes.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   depositing an encapsulant over the semiconductor die;
   forming a first insulating layer including a first material over the semiconductor die and encapsulant;
   forming a first conductive layer over the first insulating layer;
   forming a second insulating layer including a second material over the first insulating layer and first conductive layer; and
   forming a third insulating layer including the first material over the second insulating layer, wherein a coefficient of thermal expansion (CTE) and elongation of the first material is greater than a CTE and elongation of the second material.

2. The method of claim 1, further including:
   disposing a modular interconnect unit adjacent to the semiconductor die; and
   forming the first insulating layer over the modular interconnect unit.

3. The method of claim 1, further including curing the second insulating layer prior to forming the third insulating layer.

4. The method of claim 1, further including:
   forming a second conductive layer over the second insulating layer; and
   forming a fourth insulating layer including the second material over the second conductive layer and second insulating layer.

5. The method of claim 1, wherein the first material of the first insulating layer and third insulating layer is different from the second material of the second insulating layer.

6. The method of claim 1, wherein the first material of the first and third insulating layers includes a greater tensile strength and elongation than the second material of the second insulating layer.

7. A method of making a semiconductor device, comprising:
   providing a first insulating layer including a first material;
   forming a second insulating layer including a second material different from the first material over the first insulating layer;
   forming a third insulating layer including the first material over the second insulating layer, wherein a coefficient of thermal expansion (CTE) and elongation of the first material is greater than a CTE and elongation of the second material; and
   disposing a semiconductor die over the third insulating layer.

8. The method of claim 7, further including:
   forming a fourth insulating layer over the second insulating layer, the fourth insulating layer including the second material or similar material properties to the second material; and
   forming the third insulating layer over the fourth insulating layer.

9. The method of claim 7, further including:
   forming an opening in the first insulating layer; and
   forming a bump within the opening in the first insulating layer.

10. The method of claim 7, further including depositing an encapsulant over the semiconductor die.

11. The method of claim 7, further including singulating through the first, second, and third insulating layers.

12. The method of claim 7, further including curing the second and third insulating layers sequentially.

13. The method of claim 7, wherein a coefficient of thermal expansion (CTE), elongation, and mechanical strength of the first material of the first and third insulating layers is greater than a CTE, elongation, and mechanical strength of the second material of the second insulating layer.

14. A semiconductor device, comprising:
   a semiconductor die;
   a first insulating layer including a first material formed over the semiconductor die;
   a first conductive layer formed over the first insulating layer;
   a second insulating layer including a second material formed over the first insulating layer and first conductive layer; and
   a third insulating layer including the first material formed over the second insulating layer, wherein a coefficient of thermal expansion (CTE) and elongation of the first material is greater than a CTE and elongation of the second material.

15. The semiconductor device of claim 14, further including:
   a second conductive layer formed over the second insulating layer and first conductive layer; and
   a fourth insulating layer including the second material formed over the second insulating layer and second conductive layer.

16. The semiconductor device of claim 14, further including a semiconductor wafer including the semiconductor die, the first insulating layer formed over the semiconductor wafer.

17. The semiconductor device of claim 14, further including:
a modular interconnect unit disposed adjacent to the semiconductor die; and
an encapsulant deposited over the semiconductor die and modular interconnect unit, the first insulating layer formed over the modular interconnect unit.

18. The semiconductor device of claim 14, wherein the first material of the first insulating layer and third insulating layer is different from the second material of the second insulating layer.

19. The semiconductor device of claim 14, wherein the first material includes a greater elastic modulus than the second material.

20. A semiconductor device, comprising:
a first insulating layer including a first material;
a second insulating layer including a second material different from the first material and formed over the first insulating layer;
a third insulating layer including the first material formed over the second insulating layer, wherein the first material includes a greater tensile strength than the second material and a coefficient of thermal expansion (CTE) of the first material is greater than a CTE of the second material; and
a semiconductor die disposed over the third insulating layer.

21. The semiconductor device of claim 20, further including a fourth insulating layer comprising the second material formed over the second insulating layer.

22. The semiconductor device of claim 20, further including:
an encapsulant deposited over the semiconductor die; and
a shielding layer formed over the encapsulant.

23. The semiconductor device of claim 20, wherein the semiconductor die and first, second, and third insulating layers form a reconstituted panel.

24. The semiconductor device of claim 20, wherein an elongation of the first material is greater than an elongation of the second material.

* * * * *